US008703300B2

(12) United States Patent
Suzuri et al.

(10) Patent No.: US 8,703,300 B2
(45) Date of Patent: Apr. 22, 2014

(54) ORGANIC ELECTROLUMINESCENT ELEMENT, DISPLAY AND ILLUMINATOR

(75) Inventors: Yoshiyuki Suzuri, Tokyo (JP); Akira Kawakami, Tokyo (JP); Hiroshi Kita, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 830 days.

(21) Appl. No.: 11/909,552

(22) PCT Filed: Mar. 14, 2006

(86) PCT No.: PCT/JP2006/304947

§ 371 (c)(1),
(2), (4) Date: Sep. 24, 2007

(87) PCT Pub. No.: WO2006/103909

PCT Pub. Date: Oct. 5, 2006

(65) Prior Publication Data

US 2009/0072715 A1 Mar. 19, 2009

(30) Foreign Application Priority Data

Mar. 28, 2005 (JP) ................................ 2005-090824

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 546/24; 546/79; 546/81; 546/101; 548/304.4; 548/418; 548/440

(58) Field of Classification Search
USPC .................. 428/690, 917; 313/504, 505, 506; 257/40, E51.05, E51.026, E51.032; 546/24, 79, 81, 101; 548/304.4, 418, 548/440
See application file for complete search history.

(56) References Cited

U.S. PATENT DOCUMENTS 6,313,261 B1 * 11/2001 Samuel et al. ................ 528/378

FOREIGN PATENT DOCUMENTS

| | | | | | |
|---|---|---|---|---|---|
| JP | 2001-102175 A | | 4/2001 | | |
| JP | 2003-45662 A | | 2/2003 | | |
| JP | 2003-208988 A | | 7/2003 | | |
| JP | 2004-31004 A | | 1/2004 | | |
| JP | 2004-193011 A | | 7/2004 | | |
| JP | 2004193011 A | * | 7/2004 | ............ | H05B 33/22 |
| JP | 2004-281087 A | | 10/2004 | | |
| JP | 2004-281097 | * | 10/2004 | ............ | H05B 33/14 |
| JP | 2004-335137 A | | 11/2004 | | |
| JP | 2005-26221 A | | 1/2005 | | |
| JP | 2005-71735 A | | 3/2005 | | |

OTHER PUBLICATIONS

Dailey et. al., An efficient electron transporting polymer for LED, 1998,J. Phys. Condens. Matter 10 , p. 5171-5178.*
International Search Report for International Application No. PCT/JP2006/304947 mailed May 16, 2006.
Notice of Reasons for Rejection for Patent Application No. 2007-510364, drafted Dec. 12, 2011, with English translation.
Intellectual Property Office Examination Report under Section 18(4), dated Mar. 30, 2010, for Application No. GB0718802.2.
Notice of Reasons for Refusal for Japanese Patent Application No. 2007-510364, mailed Nov. 6, 2012, with English translation.
Takahito Oyamade et al., "Efficient Electron Injection Characteristics of Tetra-2-pidinylpyrazine (TPP) in Organic Light Emitting Diodes", Chemistry Letters, vol. 32, No. 4 (2003).

* cited by examiner

*Primary Examiner* — Gregory Clark
(74) *Attorney, Agent, or Firm* — Cantor Colburn LLP

(57) ABSTRACT

Disclosed is a long-life organic electroluminescent element which can be driven at low voltage. Also disclosed are a display and illuminator using the same. Specifically disclosed is an organic electroluminescent element comprising on a substrate, an anode, a cathode and an organic compound layer arranged between the anode and the cathode and including at least one light emission layer. This organic electroluminescent element is characterized in that the organic compound layer includes an electron transport material-containing layer which contains an electron transport material represented by Formula (a) and at least one substance selected from the group consisting of metals, salts of the metals and electron-donating compounds. Formula (a) Ar1-(Ar2)n [In the formula, Ar1 represents a group derived from an aromatic hydrocarbon ring or a group derived from an aromatic heterocycle; Ar2 represents a group derived from an aromatic heterocycle; and n represents an integer of 2 or more.

11 Claims, 4 Drawing Sheets

ORGANIC ELECTROLUMINESCENT ELEMENT, DISPLAY AND ILLUMINATOR

CROSS REFERENCE TO RELATED APPLICATIONS

This is a U.S. national stage of application No. PCT/JP2006/304947, filed on 14 Mar. 2006. Priority under 35 U.S.C. §119(a) and 35 U.S.C. §365(b) is claimed from Japanese Application No. 2005-090824, filed 28 Mar. 2005, the disclosure of which is also incorporated herein by reference.

FIELD OF THE INVENTION

The present invention relates to an organic electroluminescent element, a display and an illuminator.

BACKGROUND OF THE INVENTION

As an emission type electronic display device, an electroluminescent device (ELD) is known. Elements constituting the ELD include an inorganic electroluminescent element (also referred to as an inorganic EL element) and an organic electroluminescent element (hereinafter referred to also as an organic EL element). Inorganic electroluminescent element has been used for a plane light source, however, a high voltage alternating current has been required to drive the element.

On the other hand, since an organic electroluminescent element (also referred to as merely an organic EL element) is a self light emission element (an element having a structure in which a light emitting layer containing a light emitting compound is sandwiched between a cathode and an anode, and when an electron and a hole are injected into the light emitting layer and recombined to form an exciton, the element emits light (fluorescent light or phosphorescent light) generated by inactivation of the exciton), the element exhibits an excellent visuality, and can emit light by applying a relatively low voltage, namely, several volts to several tens of volts. Accordingly, it is possible to make the element light in weight including the driving circuit and thus the organic EL element is expected as a thin display, illuminator and a backlight.

Among these, an organic EL element emitting phosphorescent light is attracting attention because of its high quantum efficiency of emission. However, this organic EL element has a higher driving voltage compared to the conventional organic EL element emitting fluorescent light and an EL element driven at a lower power consumption while efficiently emitting with higher luminance is desired.

Generally, lowering of the driving voltage can be achieved by making the thickness of the element thinner, however, in that case, defective products may increase due to a trouble in electrical conduction between the electrodes, resulting in a lower production yield.

In order to solve the above problem, several methods to lower the energy barrier for electron injection from the cathode are being studied, for example: a method to provide a metal doping layer at the cathode interface, which is an organic compound layer doped with a metal oxide or a metal salt (for example, refer to Patent Documents 1 and 2); a method to provide a mixed layer containing an inorganic metal salt and an electron transporting organic material between the cathode and the organic compound layer (for example, refer to Patent Document 3); and a method to incorporate at least one metal compound selected from a cesium compound and a rubidium compound in the organic compound layer substantially in contact with the cathode (for example, refer to Patent Document 4).

Although it has become possible to reduce the driving voltage of an element by using the metal oxide, metal salt, or alkali metal disclosed in the above documents, there are still several problems, for example, alkali metals, such as Li or alkaline earth metals, such as, and Mg, are easily oxidized, thereby being unstable; practically sufficient lowering of the driving voltage of the element has not been fully obtained even when the aforementioned metal oxide or metal salt of an alkalimetal or an alkaline earth metal were used; and a fully sufficient long life of the element has not been attained.

Patent document 1 Japanese Patent Application Publication Open to Public Inspection (hereafter referred to as JP-A) No. 10-270172
Patent document 2 JP-A No. 2001-102175
Patent document 3 JP-A No. 2004-193011
Patent document 4 JP-A No. 2004-335137

DISCLOSURE OF THE INVENTION

Problem to be Solved by the Invention

An object of the present invention is to provide an organic electroluminescent element capable of low voltage drive and exhibiting a long life of the element, and to provide a display as well as an illuminator using the element.

Means to Solve the Problem

The above object of the present invention was achieved by the following structures 1 to 10.

(1) An organic electroluminescent element comprising a substrate having thereon at least an anode, a cathode and an organic compound layer comprising at least one light emission layer, the organic compound layer being provided between the anode and the cathode, wherein the organic compound layer comprises an electron transport material containing layer comprising an electron transport material represented by following Formula (a) and at least one selected from the group consisting of a metal, a salt of the metal and an electron-donating compound:

$$Ar1\text{-}(Ar2)n \qquad \text{Formula (a)}$$

wherein Ar1 represents a group derived from an aromatic hydrocarbon ring or a group derived from an aromatic heterocycle; Ar2 represents a group derived from an aromatic heterocycle; and n represents an integer of 2 or more.

(2) The organic electroluminescent element of Item (1), wherein the organic electroluminescent element comprises a diffusion barrier layer as a constituting layer, the diffusion barrier layer preventing or suppressing diffusion of the metal or the salt of the metal.

(3) The organic electroluminescent element of Item (2), wherein the diffusion barrier layer comprises the electron transport material represented by Formula (a).

(4) The organic electroluminescent element of any one of Items (1) to (3), wherein a light emitted from the light emission layer contains a phosphorescent light.

(5) The organic electroluminescent element of any one of Items (1) to (4), wherein a light emitted from the light emission layer contains at least a blue light component.

(6) The organic electroluminescent element of any one of Items (1) to (5), wherein a light emitted from the light emission layer is taken out from a side of the organic electroluminescent element opposite to a substrate side of the element, not from the substrate side of the element.

(7) The organic electroluminescent element of any one of Items (1) to (6), wherein at least one selected from the group consisting of at least one of the substrate, the anode and the organic compound layer, and the cathode is formed by a process comprising a vacuum evaporation method.

(8) The organic electroluminescent element of any one of Items (1) to (7), wherein a light emitted from the organic electroluminescent element is a white light.

(9) A display comprising the organic electroluminescent element of any one of Items (1) to (8).

(10) An illuminator comprising the organic electroluminescent element of any one of Items (1) to (8) or the display of claim 9.

Further, following Items (11) to (24) are also cited as preferable features of the present invention.

(11) The organic electroluminescent element of Item (1), wherein n in Formula (a) is 4 or more.

(12) The organic electroluminescent element of Item (1), wherein n in Formula (a) is 4 or more.

(13) The organic electroluminescent element of any one of Items (1), (11) and (12) wherein Ar1 is a group derived from an aromatic hydrocarbon ring.

(14) The organic electroluminescent element of any one of Items (1) and (11)-(13) wherein Ar1 is a group derived from a benzene ring.

(15) The organic electroluminescent element of any one of Items (1) and (11)-(14) wherein Ar2 is a group derived from a pyridine ring, a pyrimidine ring, a pyridazine ring, a triazine ring, a tetrazine ring, a quinoline ring, an isoquinoline ring, a cinnoline ring, a quinazoline ring, or a naphthyridine ring.

(16) The organic electroluminescent element of any one of Items (1) and (11)-(15) wherein the metal is an alkali metal or an alkaline earth metal.

(17) The organic electroluminescent element of any one of Items (1) and (11)-(15) wherein the metal is lithium, potassium, sodium, cesium, calcium or strontium.

(18) The organic electroluminescent element of any one of Items (1) and (11)-(14) wherein the metal is cesium.

(19) The organic electroluminescent element of any one of Items (1) and (11)-(18) wherein the salt of the metal is a salt of an alkali metal or a salt of an alkaline earth metal.

(20) The organic electroluminescent element of any one of Items (1) and (11)-(19) wherein the salt of the metal is a lithium salt, a potassium salt, a sodium salt, a cesium salt, a calcium salt or a strontium salt.

(21) The organic electroluminescent element of any one of Items (1) and (11)-(19) wherein the salt of the metal is a cesium salt.

(22) The organic electroluminescent element of any one of Items (1) and (11)-(21) wherein A counter anion of the salt of the metal is a fluorine ion.

(23) The organic electroluminescent element of any one of Items (1) and (11)-(19) wherein the salt of the metal is cesium fluoride.

(24) The organic electroluminescent element of any one of Items (1) and (11)-(23) wherein the electron-donating compound is an aromatic amine compound, a thiophene compound or a fulvalene compound.

Effect of the Invention

According to the present invention, an organic electroluminescent element capable of low voltage drive and exhibiting a long life of the element, and a display as well as an illuminator using the element were obtained.

EXPLANATION OF THE SYMBOLS

Figure 1:
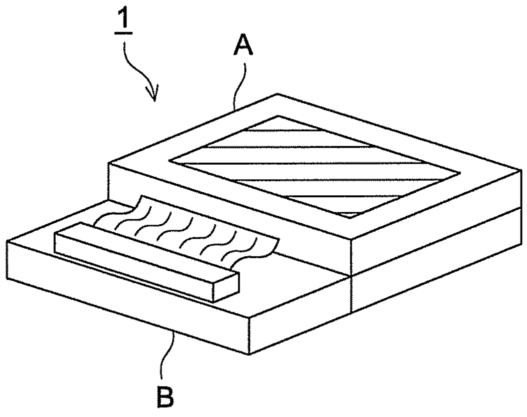
FIG. 1 is a schematic view showing an example of a display having an organic EL element.

1 Display
3 Pixel
5 Scanning Line
6 Data Line
7 Source Line
10 Organic EL Element
11 Switching Transistor
12 Drive Transistor
13 Capacitor
A Display Section
B Control Section
107 Glass Substrate with Transparent Electrode
106 Organic EL Layer
105 Cathode
102 Glass Cover
108 Nitrogen Gas
109 dehydration agent
201 Substrate
202 Anode
204 Cathode
205 Driving element
206 Positive Hole Transport Layer
207 Light Emission Layer
208 Electronic Transport Layer
209 Electron Transport Material Containing Layer

DESCRIPTION OF THE PREFERRED EMBODIMENTS

In the organic electroluminescence element of the present invention, by applying the structure of any one of the above items 1 to 10 or applying the structure of any one of the above items (11) to (24), an organic electroluminescent element capable of low voltage drive and exhibiting a long life of the element, and a display as well as an illuminator using the element could be provided.

Hereafter, details of each structural element concerning the present invention are described one by one.

Details of the constituting layer of the organic EL element of the present invention will be mentioned later. As the organic compound containing layer provided between the anode and the cathode, for example, a positive hole transport layer, an electronic blocking layer, a light emission layer, a positive hole blocking layer, an electron transport layer, an electron injection layer, a positive hole injection layer can be cited. The electron transport material containing layer of the present invention may be provided between some of the layers of the above-mentioned organic compound containing layers, and for example, the electron transport material containing layer may be combined with one of the abovementioned organic compound containing layers, or an electron transport layer, or an electron injection layer may function as an electron transport material containing layer of the present invention.

<<Electron Transport Material Containing Layer>>

The electron transport material containing layer of the present invention is characterized in that it contains an electron transport material represented by Formula (a) and at least one selected from a metal, salt of the metal and an electron-donating compound (Method of Forming an Electron Transport Material Containing Layer)

The method of forming (also referred to as the film forming method) of an electron transport material containing layer may be any of the conventionally known thin film forming methods, for example, a vacuum evaporation method or a sputtering method. When a thin film can be formed by applying a liquid, a spin coat method, a dip coat method, and an inkjet method are applicable. In this case, the electron transport material, and a metal, a salt of the metal or an electron-donating compound, which are to be mixed with, may be dispersed in an inert polymer.

(Thickness of an Electron Transport Material Containing Layer)

The thickness (film thickness) of the electron transport material containing layer is not specifically limited, however, the thickness is preferably 1 nm to 200 nm and specifically preferably 20 nm to 80 nm, in view of forming a uniform film, or of lowering the driving voltage.

<<Metal, Salt of the Metal>>

Examples of a metal preferably incorporated in the electron transport material containing layer include: alkali metals (for example, Li, Na, K, Rb, Cs and Fr) and alkaline earth metals (for example, Be, Mg, Ca, Sr and Ba). More preferable are lithium, potassium, sodium, cesium, barium, calcium and strontium, and most preferable is cesium.

Examples of a metal salt preferably incorporated in the electron transport material containing layer include salts of: alkali metals (for example, Li, Na, K, Rb, Cs and Fr) and alkaline earth metals (for example, Be, Mg, Ca, Sr and Ba). More preferable are salts of lithium, potassium, sodium, cesium, barium, calcium and strontium, and most preferable is a salt of cesium.

Further, the preferable aspect of the salt of the above-mentioned metal will be described. Various counter anions can be used in a metal salt formation, however, in order to effectively obtain the effect described in the present invention (lowering of the driving voltage and elongation of the emission life), a fluorine ion is preferably used to form a metal salt of the present invention. Of these, CsF (cesium fluoride) is preferably used an a metal salt.

Examples of a metal salt including CsF include the following salts such as LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$ and $BaCl_2$.

$CsH_2PO_4$, $Cs_2HPO_4$, CsOH, $CH_3SO_3Cs$, $CsHCO_3$, $CsBr_3$, CsI3, RbH2PO4, or these hydrates have a melting point, a decomposition point, and a boiling point of 300° C. or less, and have a feature that these compounds can be easily vacuum evaporated by resistance heating.

$CsNO_3$, RbOH, $RbNO_3$, CsI, $CsClO_4$, RbBr, RbI, $RbClO_4$, or these hydrates are compounds which have a melting point, a decomposition point, and a boiling point of 600° C. or less, and have a feature that these compounds can be easily vacuum evaporated by resistance heating and moreover that these compounds also exhibit stability.

Hydrates of $CsAlSiO_4$, $CsAl(SiO_3)_2$, $CS_2CrO_4$, $Cs_2Cr_2O_7$, $(CsF)x(AlF_3)_y$, $CsVO_3$, $Cs_3VO_4$, $CsMnO_4$, $CsAlCl_4$, $Cs_2Ti_6O1_3$, $Cs_2WO_4$, $Cs_2NbF_7$, and $Rb_2CrO_4$ are stable, and handling is easy.

Cesium, β-diketone complex and alkoxide of rubidium can be preferably utilized because these compound have a low boiling point or a low decomposition point, and are easy to be vacuum evaporated by resistance heating. Examples of a β-diketone complex include acetylacetonate, ethylacetoacetonate, and fluorine substitution products thereof, however, it is not limited thereto. Examples of an alkoxide include: methoxide, ethoxide, propoxide, isopropoxide, methoxyethoxide.

(Content (Concentration) of Metal and Salt of the Metal)

In the present invention, from a viewpoint of maintaining the concentration of the organic material which bears electron transfer near the cathode to increase electron injection efficiency while reducing an energy barrier of electron injection, the concentration of the metal and the salt of the metal in the electronic material containing layer is preferably 0.1 mass % to 99.0 mass %, and it is still more preferable that the concentration is adjust within the range of 1.0 mass % to 80.0 mass %.

(Mass Ratio of Metal and Salt of the Metal to Electron Transport Material)

The mass ratio of metal and the salt of the metal to the organic electron transport material mentioned later is preferably 0.1:99.9 to 99:1, and more preferably 1:99 to 80:20.

(Metal Oxide)

The inorganic metal salt of the present invention may be used in combination with the metal oxide of the above-mentioned alkali metal or an alkaline earth metal etc., and examples of the above-mentioned metal oxide include: $Li_2O$, $Na_2O$, $K_2O$, $Rb_2O$, $Cs_2O$, MgO, CaO.

<<Electron Transport Material Represented by Formula (a)>>

The electron transport material containing layer of the present invention contains the electron transport material represented by above-mentioned Formula (a).

In Formula (a), examples of an aromatic hydrocarbon ring used to form the group derived from the aromatic hydrocarbon ring represented by Ar1 include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, a para terphenyl ring, an acenaphthene ring, a coronene ring, a fluorene ring, a fuloranthrene ring, a naphthacene ring, a pentacene ring, a perylene ring, a penta Foehn ring, a picene ring, a pyrene ring, the Piran Trenn ring and a anthranthrene ring. Of these, a benzene ring, a naphthalene ring, and a naphthacene ring are preferably used.

Further, the above-mentioned aromatic hydrocarbon ring may have a substituent mentioned later.

In Formula (a), examples of an aromatic heterocycle to form the group derived from the aromatic heterocycle represented by Ar1 include: a furan ring, a thiophene ring, an oxazole ring, a pyrrole ring, a pyridine ring, A pyridazine ring, a pyrimidine ring, a pyrazine ring, a triazine ring, a benzimidazole ring, an oxydiazole ring, a triazole ring, an imidazole ring, a pyrazole ring, A thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring and a diazacarbazole ring (representing a ring in which one of the carbon atoms of the hydrocarbon ring which constitutes a carboline ring is further replaced with a nitrogen atom).

Of these, a pyridine ring, a pyrazine ring, a pyrimidine ring and a pyridazine ring are preferably used. Further, the above-mentioned aromatic heterocycle may have a substituent mentioned later.

In Formula (a), as examples of an aromatic heterocycle to form the group derived from the aromatic heterocycle represented by Ar2, the same groups as listed as examples of an aromatic heterocycle to form the group derived from the aromatic heterocycle represented by Ar1 can be cited. Of these, a pyridine ring, a pyrazine ring, a pyrimidine ring, a pyridazine ring, a triazine ring, a quinazoline ring, a naphthyridine ring and a cinnoline ring are preferably used.

In Formula (a), n is preferably 4 or more and specifically referably 6 or more.

The above aromatic heterocyles may have a substituent which will be described later.

In Formula (a), examples of a substituent which may substitute the above mentioned group derived from an aromatic hydrocarbon ring or an aromatic heterocycle represented by Ar1 or the group derived from an aromatic heterocycle represented by Ar2 include: an alkyl group (for example, a methyl group, an ethyl group, a propyl group, and an isopropyl group, a tert-butyl group, a pentyl group, a hexyl group, an octyl group, a dodecyl group, a tridecyl group, a tetradecyl group and a pentadecyl group), a cycloalkyl groups (For example, a cyclopentyl group and a cyclohexyl group), an alkenyl group (for example, a vinyl group and an allyl group), an alkynyl groups (for example, an ethynyl group and a propargyl group), an aryl group (for example, a phenyl group and a naphthyl group), an aromatic heterocycle group (for example, a furyl group, a thienyl group, a pyridyl group, and a pyridazinyl group, a pyrimidinyl group, a pyrazinyl group, a triazinyl group, an imidazolyl group, a pyrazolyl group, a thiazolyl group, a quinazolinyl group and a phthalazinyl group), a heterocycle group (for example, a pyrrolidyl group, an imidazolysyl group, a morpholyl group and an oxazolyzyl group), an alkoxy group (for example, a methoxy group, an ethoxy group, a propyloxy group, a pentyl oxy group, a hexyloxy group, and an octyloxy group and a dodecyloxy group), a cycloalkoxy group (for example, a cyclopentyloxy group and a cyclohexyloxy group), an aryloxygroup (for example, a phenoxy group and a naphthyloxy group), an alkylthio group (for example, a methylthio group, an ethylthio group, a propyl thio group, a pentyl thio group, a hexyl thio group, an octylthio group and a dodecylthio group), a cycloalkylthio groups (for example, a cyclopentylthio group and a cyclohexylthio group), an arylthio group (for example, a phenylthio group and a naphthyl thio group), an alkoxycarbonyl group (for example, a methyloxycarbonyl group, an ethyloxycarbonyl group, a butyloxycarbonyl group, an octyloxycarbonyl group and a dodecyloxycarbonyl group), an aryloxycarbonyl group (for example, a phenyloxycarbonyl group, a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group,) A pentyl carbonyl group, a cyclohexyl carbonyl group, an octyl carbonyl group, a 2-ethylhexylcarbonyl group, a dodecyl carbonyl group, a phenylcarbonyl group, a naphthylcarbonyl group and a pyridylcarbonyl group), an acyloxy group (for example, an acetyloxy group, an ethylcarbonyloxy group, a butylcarbonyloxy group, an octylcarbonyloxy group, a dodecylcarbonyloxy group and phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group), a carbamoyl group (for example, an aminocarbonyl group, an methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group), an ureido group (for example, a methylureido group, an ethylureido group, a pentylureido group, a cyclohexylureido group, an octylureido group, a dodecylureido group, a phenylureido group, a naphthylureido group and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group and a dodecylsulfonyl group), an arylsulfonyl group, (for example, a phenylsulfonyl group, a naphthylsulfonyl group and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group), a halogen atom (for example, a fluorine atom, a chlorine atom, a bromine atom, etc.), a fluoride hydrocarbon group (for example, a fluoromethyl group, a trifluoromethyl group and a pentafluoroethyl group and a pentafluorophenyl group), a cyano group, a nitro group, a hydroxyl group, mercapto group, and a silyl group (for example, a trimethylsilyl group, a triisopropylsilyl group, a triphenylsilyl group and a phenyldiethylsilyl group).

These substituents may further be substituted with the above substituent. Also, these substituents may be combined to form a ring.

The electron transport material represented by Formula (a) may be singly included in the electron transport material containing layer of the present invention, and may be included also in other constituting layer, which will be mentioned later, of the organic EL element of the present invention, for example, may be contained in an electron transport layer.

Specific example of a compound represented by Formula (a) will be shown below, however, the present invention is not limited thereto.

N-1
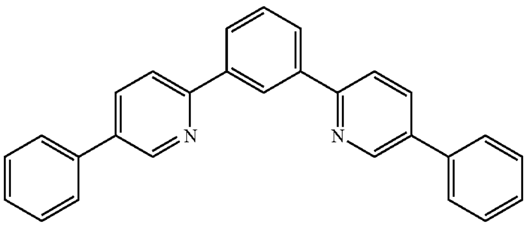
N-2
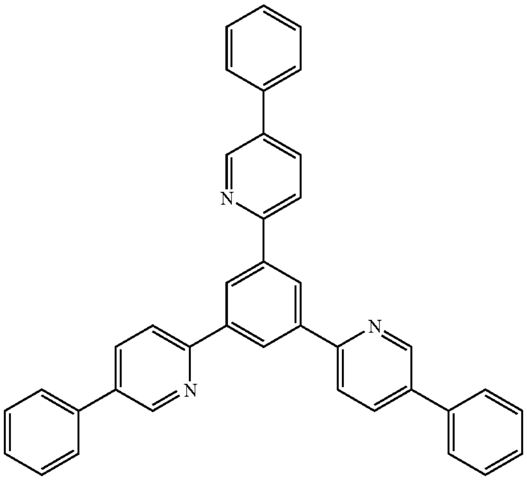
N-3
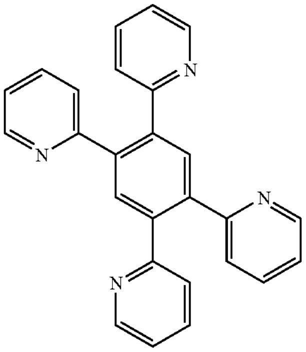
N-4
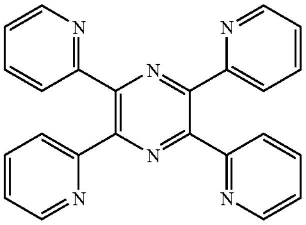
N-5
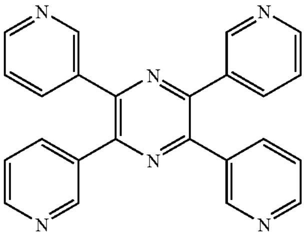
-continued
N-6
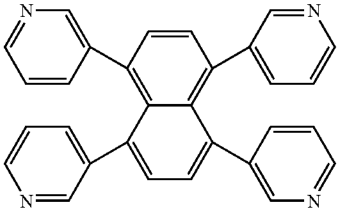
N-7
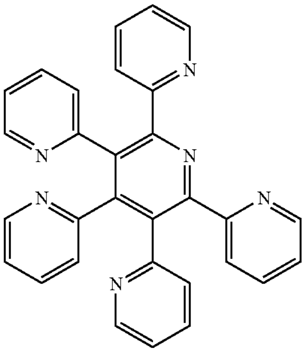
N-8
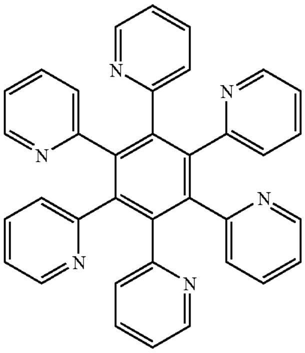
N-9
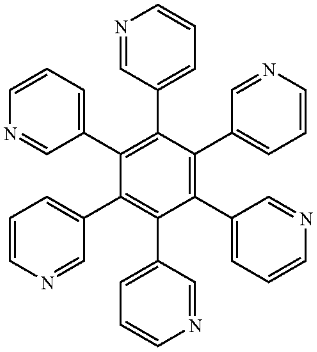
N-10
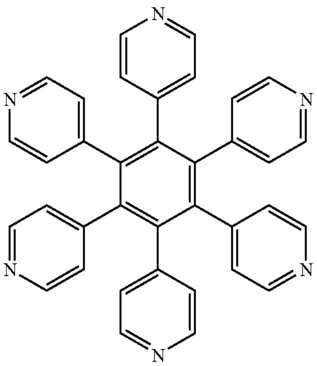

-continued
N-11
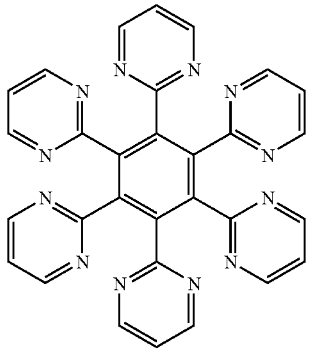
N-12
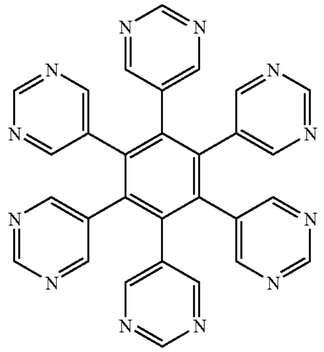
N-13
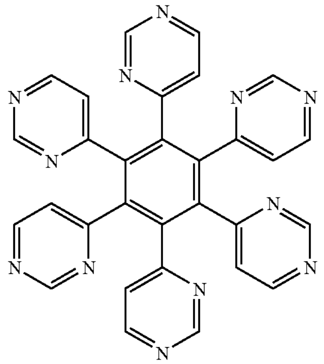
N-14
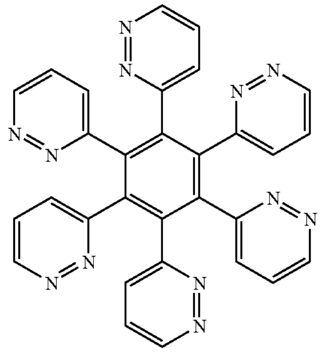
-continued
N-15
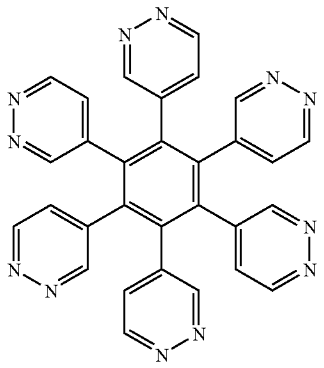
N-16
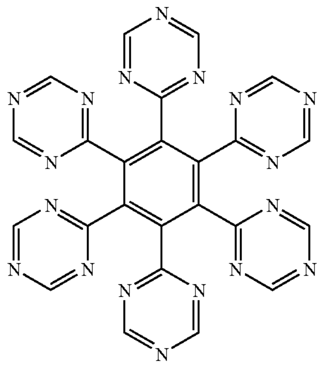
N-17
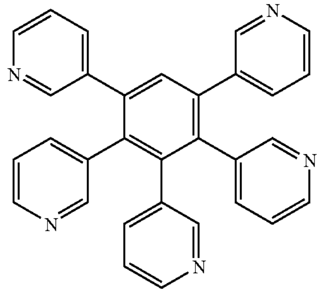
N-18
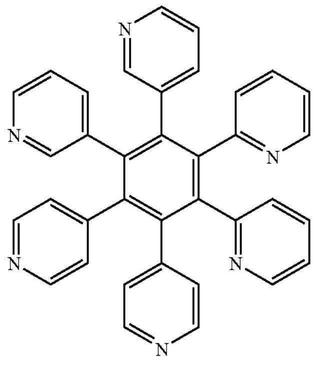

-continued
N-19
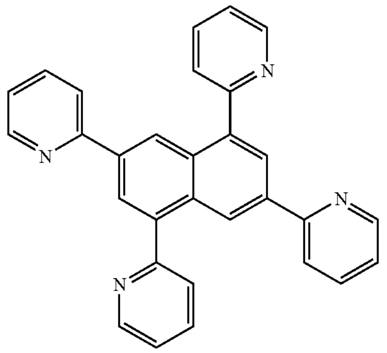
N-20
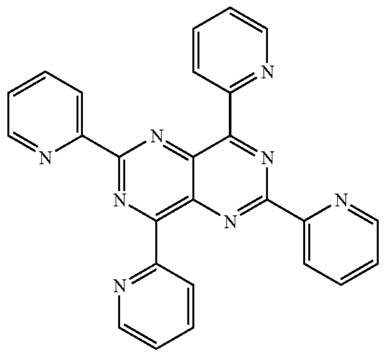
N-21
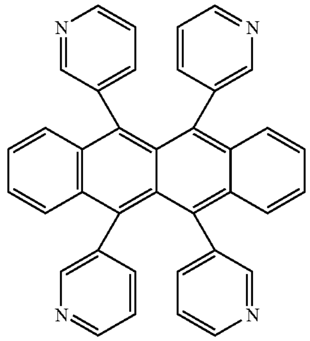
N-22
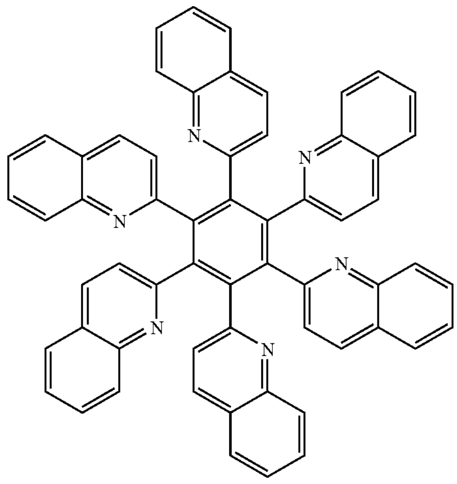
-continued
N-23
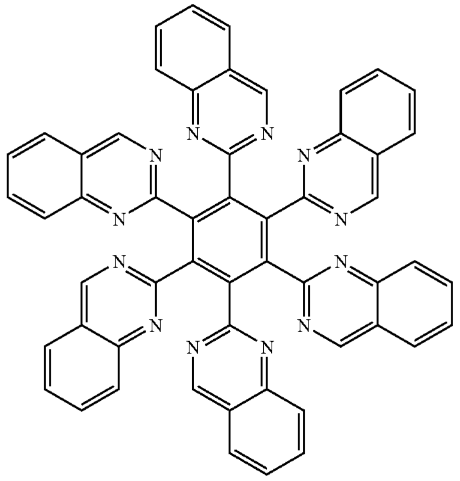
N-24
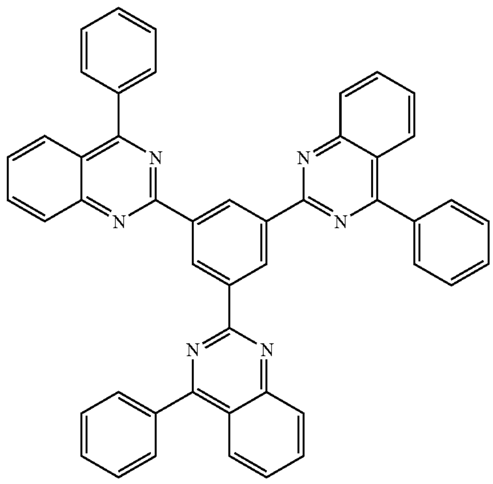
N-25
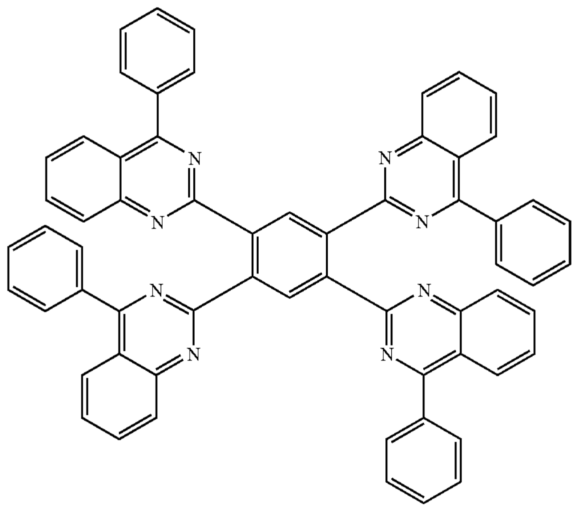

-continued
N-26
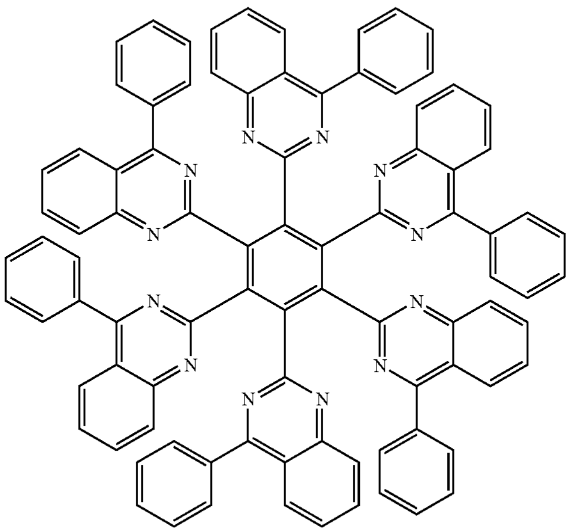
N-27
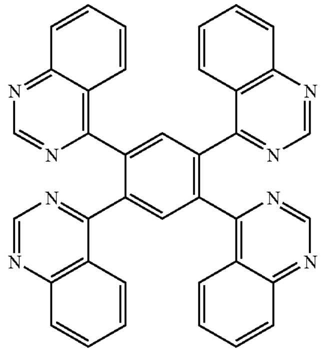
N-28
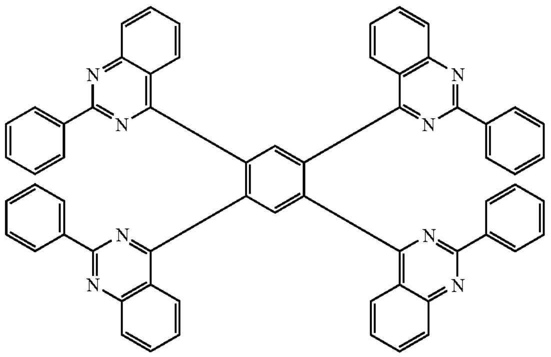
-continued
N-29
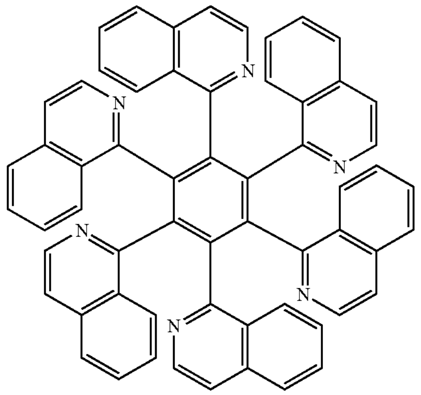
N-30
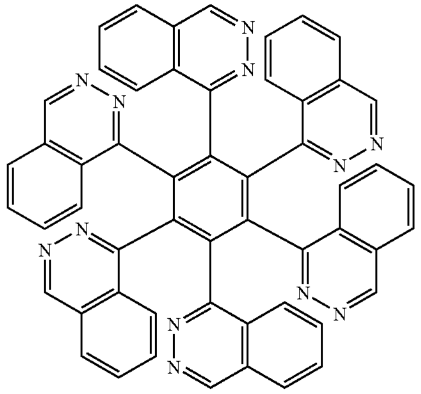
N-31
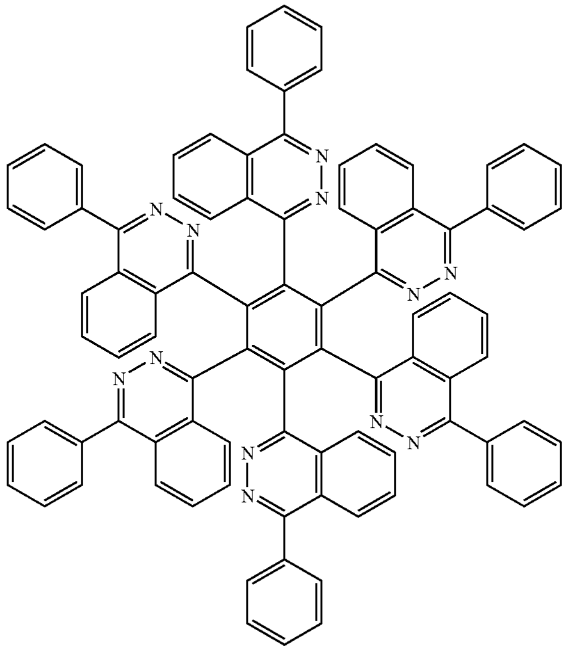

-continued
N-32
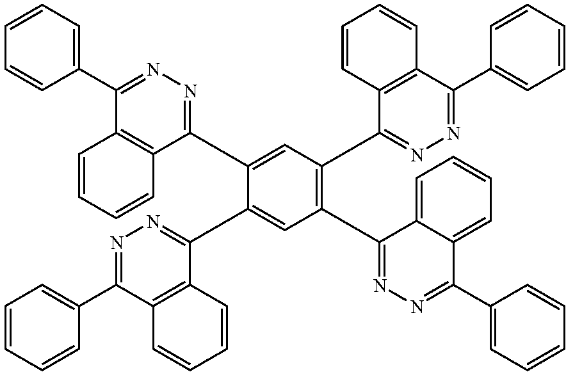
N-33
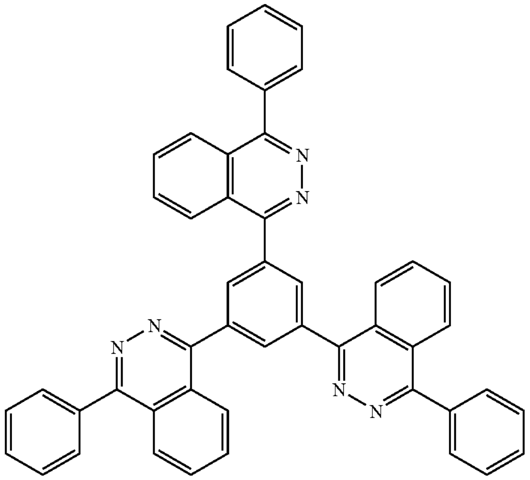
N-34
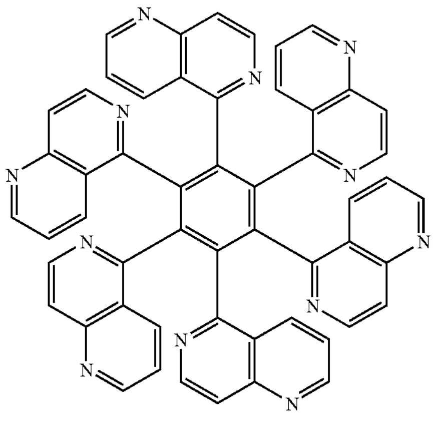
-continued
N-35
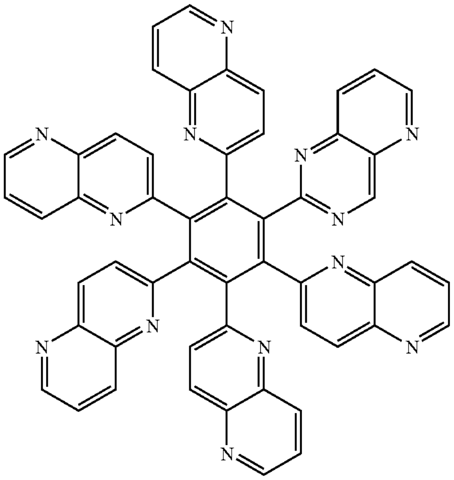
N-36
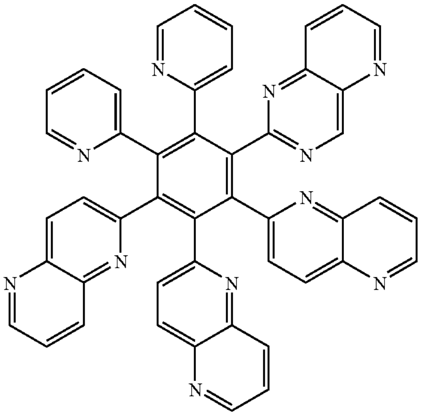
N-37
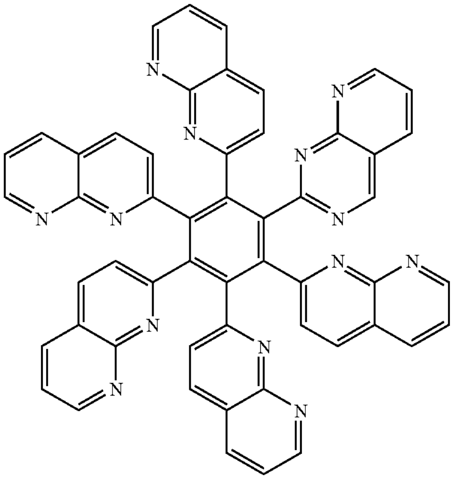

-continued

N-38

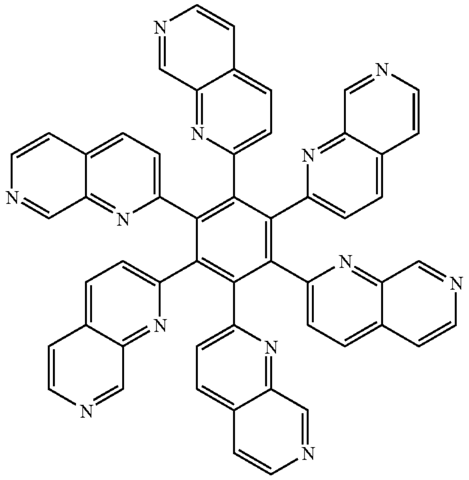

<<Electron-Donative Compound>>

As an electron-donative compound of the present invention, an aromaticamine compound, a thiophene compound, and a fulvalene compound are cited as a preferable compound.

Examples of an aromaticamine compound include amine derivatives disclosed in JP-A No. 9-59614 (for example, dimethylaniline, p-anisidine, p-aminodiphenylamine, p-phenylene diamine, o-phenylene diamine, 2-methyl-p-phenylene diamine, N,N-dimethyl-p-phenylene diamine, N,N'-dimethyl-p-phenylene diamine, tetra-methyl-p-phenylene diamine, durenediamine, 1,5-diaminonaphthalene, 1,8-diaminonaphthalene, 2,3-diaminonaphthalene, 1,6-diaminopyrene and 1,8-diaminopyrene), and triphenylamine compounds disclosed in JP-A No. 2002-203684 (for example, tri(4-methylphenyl)amine and N,N-bis(3,4-dimethylphenyl) biphenyl-4-amine). However, the present invention is not limited thereto.

Examples of a thiophene compound include those disclosed in JP-A No. 2002-100416, for example, oligothiophene compounds shown in Adv. Mater. (1997), Vol. 9, No. 7, page 557, Angew. Chem. (English-language translation), (1995), Vol. 34, No. 3, pp 303-307, American Chemical Society magazine (J. Am. Chem. Soc.), Vol. 120, No. 4, (1998), pp 664-672. However, the present invention is not limited thereto.

Specific examples of a fulvalene compound of the present invention include donating organic compound disclosed in JP-A No. 5-52667, for example, tetrathiafulvalene compounds, such as tetrathiafulvalene, tetra-methyl tetrathiafulvalene, tetramethyl tetraselenafulvalene, bisethylene dithiotetrathiafulvalene and bistrimethylene dithiotetrathiafulvalene. However, the present invention is not limited thereto.

The electron transport material containing layer of the present invention may contain the following materials.

<<Material which May be Used in Combination>>

The electron transport material containing layer of the present invention may contain the following materials in combination, besides the abovementioned electron transport material, metal or metal salt, electron donating compound.

Examples of a compound usable in combination include: a triazole derivative, an oxazole derivative, an oxydiazole derivative, a fluorenone derivative, an anthraquinodimethane derivative, an antron derivative, a diphenylquinone derivative, a thiopyrandioxide derivative, a carbodiimide derivative, a fluorenirydenemethane derivative, a distyrylpyrazine derivative, a heterocyclic tetracarboxylic anhydride such as naphthaleneperylene, a phthalocyanine derivative, a metal complex such as an 8-quinolinol derivative, metalophthalocyanine, a metal complex having benzoxazole or benzothiazole as a ligand, conductive polymers such as an aniline copolymer, a thiophene oligomer, and poly thiophene, a polythiophene derivative, a polyphenylene derivative, a polyphenylenevinylene derivative and a polyfluorene derivative.

In the next, the constitution of a typical organic EL element will be described.

<<Constitution Layers of Organic EL Element>>

Preferable examples of the layer construction of the organic EL element of the present invention will be shown below, however, the present invention is not limited thereto. (i) anode/positive hole injection layer/positive hole transport layer/light emission layer/hole blocking layer/electron transport material containing layer/cathode, (ii) anode/electron blocking layer/light emission layer/hole blocking layer/electron transport layer/electron transport material containing layer/cathode, (iii) anode/positive hole transport layer/electron blocking layer/light emission layer/hole blocking layer/electron transport layer/electron transport material containing layer/cathode, (iv) anode/positive hole transport layer/electron blocking layer/light emission layer/hole blocking layer/electron transport layer/electron transport material containing layer/cathode, (v) anode/positive hole transport layer/electron blocking layer/light emission layer/hole blocking layer/electron transport layer/electron transport material containing layer/cathode buffer layer/cathode, (vi) anode/anode buffer layer/positive hole transport layer/electron blocking layer/light emission layer/hole blocking layer/electron transport layer/electron transport material containing layer/cathode buffer layer/cathode, (vii) anode/anode buffer layer/positive hole transport layer/electron blocking layer/light emission layer/hole blocking layer/electron transport layer/electron transport material containing layer/cathode buffer layer/cathode, (viii) anode/positive hole injection layer/positive hole transport layer/light emission layer/hole blocking layer/diffusion barrier layer/electron transport material containing layer/cathode, (IX) anode/anode buffer layer/positive hole transport layer/electron blocking layer/diffusion barrier layer/light emission layer/hole blocking layer/electron transport layer/electron transport material containing layer/diffusion barrier layer/cathode buffer layer/cathode <<Light Emitting Layer>>

The light emitting layer of the present invention is a layer where electrons and holes, injected from electrodes, an electron transporting layer or a hole transporting layer, are recombined to emit light. The portions where light is emitted may be in the light emitting layer or at the interface between the light emitting layer and the layer adjacent thereto.

The light emitting layer of the present invention may be any of the light emitting layers emitting various maximum emission wavelengths, for example, a blue light emitting layer exhibiting a maximum emission wavelength of 430 nm-480 nm, a green light emitting layer exhibiting a maximum emission wavelength of 510 nm-550 nm, a red light emitting layer exhibiting a maximum emission wavelength of 600 nm-640 nm, and the light emitting layer is not specifically limited.

The light emission layer may be composed of a single layer or of plural layers. When the light emission layer is composed of plural layers, plural layers having the same emission spectrum or the same maximum emission wavelength may be contained. The light emission of the light emission layer of the present invention preferably contains a blue phosphorous light emission based on a phosphorous light emitting material (a phosphorous light emitting compound).

The thickness of each light emission layer is preferably adjusted within the range of 2 nm-100 nm, and more preferably within 2 nm-20 nm. Relationship between any of the light emission layers emitting blue, green and red lights is not specifically limited.

The total thickness of the light emission layer when plural layers are contained in the light emission layer is not specifically limited, however, the total thickness is preferably adjusted within the range of 2 nm-5 μm, in view of homogeneity of the layer, avoidance of unnecessary high voltage while light emission and improvement of stability of emitting color against driving current. The total thickness is more preferably adjusted within the range of 2 nm-200 nm and specifically preferably within 10 nm-20 nm.

The light emission layer may be prepared by forming the light emission dopant or the host compound, which will be described later, into a film using a known thin film forming method, for example, a vacuum evaporation method, a spin coating method, a cast method, an LB method and an inkjet method.

In each light emission layer, a plurality of light emitting material may be mixed, provided that the maximum emission wavelength is maintained within the above described ranges, for example, in a blue light emission layer, a blue light emission material of which emission wavelength is 430 nm-480 nm, and a green light emission material of which maximum emission wavelength is 510 nm-550 nm.

Next, the host compound and the light emission dopant will be described.

(Host Compound)

The host compound contained in the light emission layer of the present invention is defined as a compound of which quantum yield of phosphorescent light emission at room temperature (25° C.) is less than 0.1. The quantum yield of phosphorescent light emission is more preferably less than 0.01. The mass ratio of the host compound in the compound contained in the light emission layer is preferably 20% or more.

As the host compound, a known host compound may be used alone, or a plurality of compounds may be used in combination. By using a plurality of host compounds, charge transfer can be controlled, whereby the efficiency of the organic EL element can be enhanced. Further, by using a plurality of phosphorescent compounds which are used as light emission dopants which will be described later, mixing of different light emission becomes possible, whereby any desired emission color can be obtained. This is possible by adjusting the kind and the doping amount of the phosphorescent compound, and its application to an illuminator or to a backlight also becomes possible.

As a host compound of the present invention, a compound represented by Formula (1) can be cited as an example of a preferably utilized compound. Also, the above compound is also preferably used in a layer adjacent to the light emission layer (for example, a electron hole blocking layer).

An organic EL element manufactured by using a compound represented by Formula (1) in the light emission layer or in a layer adjacent to the light emission layer, and by using a phosphorescent material of the present invention in the light emission layer exhibits a higher emission efficiency, and thus an organic EL element exhibiting a high luminance can be obtained.

<<Compound Represented by Formula (1)>>

Formula (1)

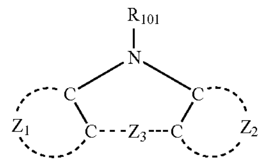

wherein $Z_1$ represents an aromatic heterocylic ring which may have a substituent; $Z_2$ represents an aromatic heterocylic ring which may have a substituent or an aromatic hydrocarbon ring which may have a substituent; $Z_3$ represents a divalent linking group or a single bond; and $R_{101}$ represents a hydrogen atom or a substituent.

In Formula (1), examples of an aromatic heterocyclic ring represented by $Z_1$ or $Z_2$ include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a carbazole ring, a carboline ring and a ring which is formed by replacing one of the carbon atoms of a hydrocarbon ring constituting a carboline ring with a nitrogen atom. The above mentioned aromatic hydrocarbon rings may have a substituent represented by $R_{101}$ which will be described later.

In Formula (1), examples of an aromatic hydrocarbon ring represented by $Z_2$ include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and a anthranthrene ring. Furthermore, the above mentioned aromatic hydrocarbon rings may have a substituent represented by $R_{101}$ which will be described below.

In Formula (1), examples of a substitute represented by $R_{101}$ include: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); cycloalkyl groups (for example, a cyclopentyl group and a cyclohexyl group); alkenyl groups (for example, a vinyl group and an allyl group); alkynyl groups (for example, an ethynyl group and a propargyl group); aryl groups (for example, a phenyl group and a naphthyl group); aromatic heterocyclic groups (for example, a furyl group, a thienyl group, a pyridyl group, a pyridazinyl group, a pyrimidinyl group, a pyrazinyl group, the triazinyl group, an imidazolyl group, a pyrazolyl group, a thiazolyl group, a quinazolinyl group and a phthalazinyl group), heterocyclic groups (for example, a pyrrolidyl group, an imidazolidyl group, a morpholyl group and an oxazolidyl group), alkoxyl groups (for example, a methoxy group, an ethoxy group, a propyloxy group, a pentyloxy group, a hexyloxy group, an octyloxy group and a dodecyloxy group), cyclo alkoxyl groups (for example, a cyclopentyloxy group, a cyclohexyloxy group), aryloxy groups (for example, a phenoxy group and a naphthyloxy group), alkylthio groups (for example, a methylthio group, an ethylthio group, a propylthio group, a pentylthio group, a hexylthio group, an octylthio group and a dodecylthio group), cycloalkylthio groups (for example, a cyclopentylthio group and a cyclohexylthio group), arylthio groups (for example, a phenylthio group and a naphthylthio group), alkoxycarbonyl groups (for example, a methyloxycarbonyl group, an ethyloxycarbonyl group, a butyloxycarbonyl group, an octyloxycarbonyl group and a dodecyloxycarbonyl group), aryloxycarbonyl groups (for example, a phenyloxycarbonyl group and a naphthyloxycarbonyl group), sulfamoyl groups (for example, the aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and 2-pyridylaminosulfonyl group), acyl groups (for example, an acetyl group, an ethylcarbonyl group, a propylcarbonyl group, a pentylcarbonyl group, a cyclohexylcarbonyl group, an octylcarbonyl group, 2-ethylhexylcarbonyl group, a dodecylcarbonyl group, a phenylcarbonyl group, a naphthylcarbonyl group and a pyridyl carbonylgroup), acyloxy groups (for example, an acetyloxy group, an ethylcarbonyloxy group, a butylcarbonyloxy group, an octylcarbonyloxy group, a dodecylcarbonyloxy group and a phenylcarbonyloxy group), amide groups (for example, a methylcarbonylamino group, an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a dodecylcarbonylamino group, a phenylcarbonylamino group, a naphthylcarbonylamino group, etc.), carbamoyl groups (for example, the aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, 2-ethylhexylaminocarbonyl group, a dodecylaminocarbonyl group, a phenylaminocarbonyl group, a naphthylaminocarbonyl group and 2-pyridylaminocarbonyl group), ureido groups (for example, a methylureido group, an ethylureido group, a pentylureido group, a cyclohexylureido group, an octylureido group, a dodecylureido group, a phenylureido group naphthylureido group and 2-pyridylaminoureido group), sulfinyl groups (for example, a methylsulfinyl group, an ethylsulfinyl group, a butylsulfinyl group, a cyclohexylsulfinyl group, 2-ethylhexylsulfinyl group, a dodecylsulfinyl group, a phenylsulfinyl group, a naphthylsulfinyl group and 2-pyridylsulfinyl group), alkylsulfonyl groups (for example, a methylsultonylamino group, an ethylsulfonyl group, a butylsulfonyl group, a cyclohexylsulfonyl group, 2-ethylhexylsulfonyl group and a dodecylsulfonyl group), arylsulfonyl groups (a phenylsulfonyl group, a naphthylsulfonyl group and 2-pyridylsulfonyl group), amino groups (for example, an amino group, an ethylamino group, a dimethylamino group, a butylamino group, a cyclopentylamino group, 2-ethylhexylamino group, a dodecylamino group, an anilino group and a naphthylamino group, 2-pyridylamino group), halogen atoms (for example, a fluorine atom, a chlorine atom and a bromine atom), fluoride hydro fluoro carbon groups (for example, a fluoromethyl group, a trifluoromethyl group, a pentafluoroethyl group and a pentafluorophenyl group), a cyano group, a nitro group, a hydroxy group, a mercapto group, silyl groups (for example, a trimethylsilyl group, a triisopropylsilyl group, a triphenylsilyl group and a phenyldiethylsilyl group).

These substituents may further be substituted by another substituent described above. Moreover, a plurality of substituents may be combined together to form a ring.

The preferable substituents include an alkyl group, a cycloalkyl group, a hydro fluoro carbon group, an aryl group and an aromatic heterocyclic group.

Examples of a divalent linking group may include hydrocarbon groups such as an alkylene group, an alkenylene group, an alkynylene and an arylene group; a group containing a heteroatom; divalent linking groups derived from a compound containing aromatic heterocyclic ring (also referred to as a heteroaromatic compound) such as a thiophene-2,5-diyl group and a pyrazine-2,3-diyl group; chalcogen atoms such as an oxygen atom and a sulfur atom; and linking groups containing a linkage through a heteroatom such as an alkylimino group, a dialkylsilanediyl group and a diarylgermanediyl group.

A single bond represents a bond directly combining two substituents.

In the present invention, $Z_1$ in Formula (1) is preferably a 6-membered ring, whereby high emission efficiency is obtained and, further, a longer life is attained.

In the present invention, $Z_2$ in Formula (1) is preferably a 6-membered ring, whereby high emission efficiency is obtained and, further, a longer life is attained.

Further, both of $Z_1$ and $Z_2$ in Formula (1) are preferably 6-membered rings, whereby a still higher emission efficiency is attained, and a still longer life is attained.

Specific examples of a compound represented by Formula (1) of the present invention will be shown below, however, the present invention is not limited thereto.

| COMPOUND | CENTRAL MOIETY | A |
|---|---|---|
| 1 | 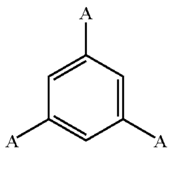 | 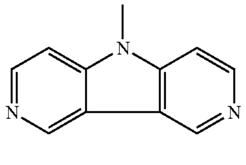 |
| 2 | 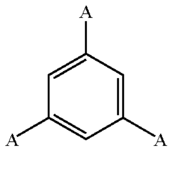 | 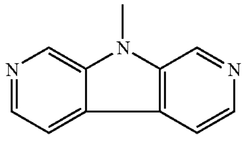 |

-continued
| COMPOUND | CENTRAL MOIETY | A |
|---|---|---|
| 3 | 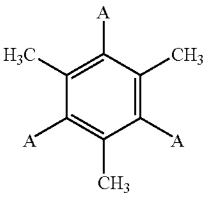 | 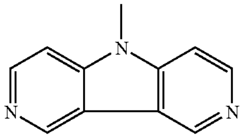 |
| 4 | 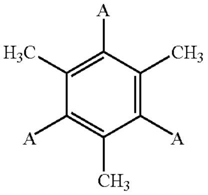 | 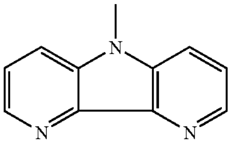 |
| 5 | 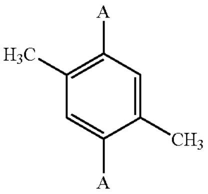 | 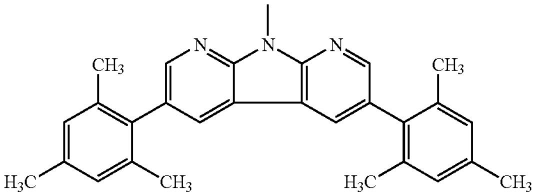 |
| 6 | 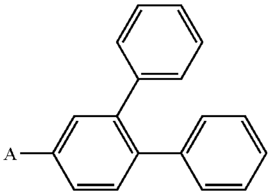 | 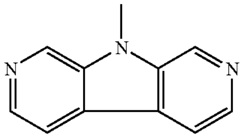 |
| 7 | 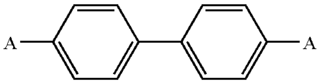 | 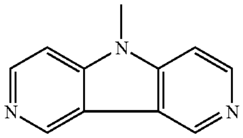 |
| 8 | 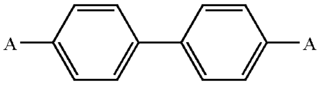 | 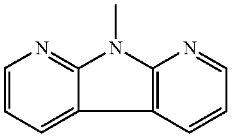 |
| 9 | 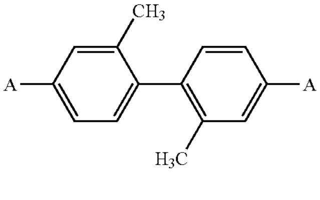 | 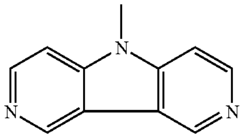 |
| 10 | 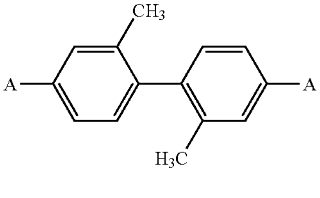 | 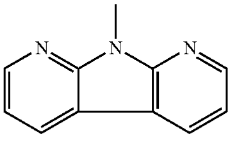 |

-continued
| COMPOUND | CENTRAL MOIETY | A |
|---|---|---|
| 11 | 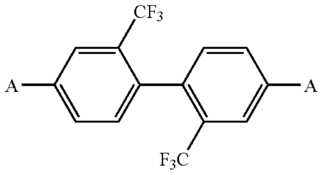 | 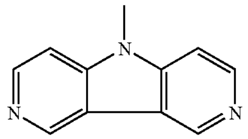 |
| 12 | 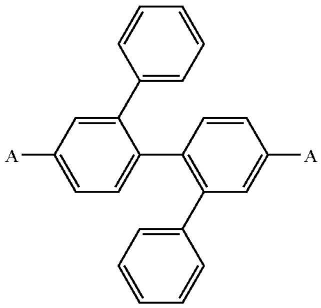 | 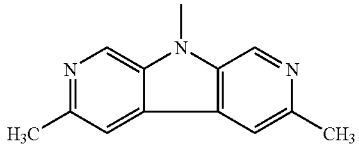 |
| 13 | 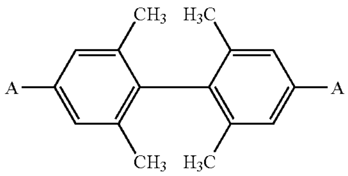 | 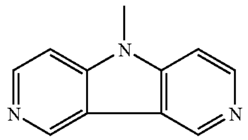 |
| 14 | 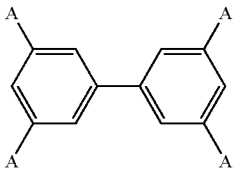 | 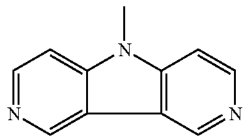 |
| 15 | 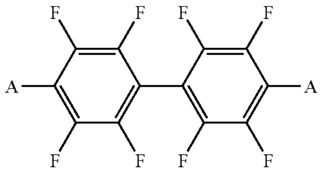 | 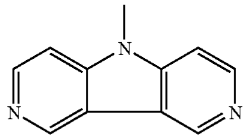 |
| 16 | 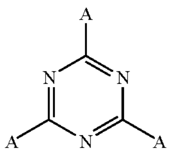 | 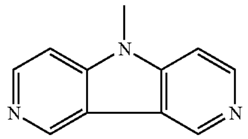 |
| 17 | 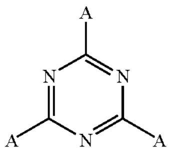 | 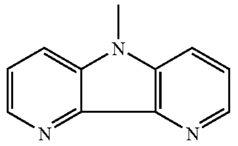 |
| 18 | 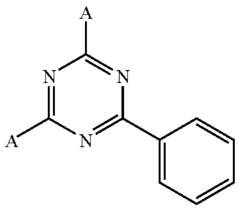 | 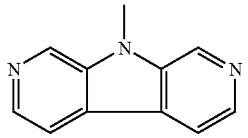 |

-continued
| COMPOUND | CENTRAL MOIETY | A |
|---|---|---|
| 19 | 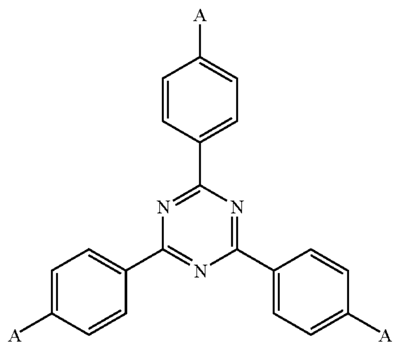 | 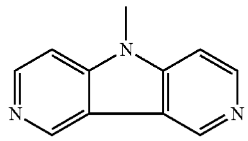 |
| 20 | 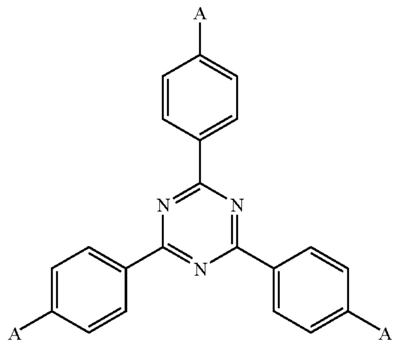 | 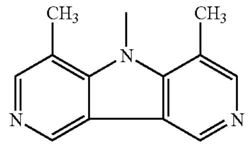 |
| 21 | 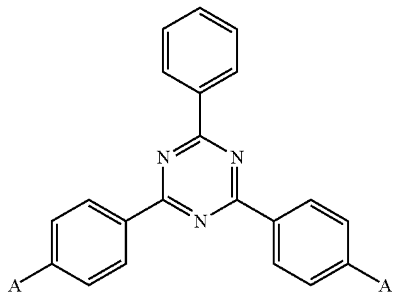 | 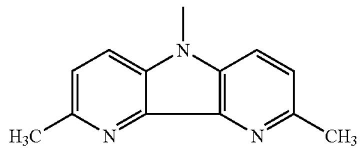 |
| 22 | 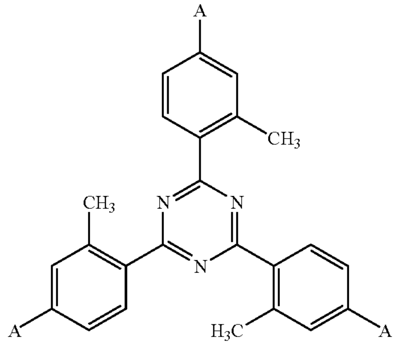 | 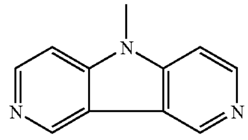 |

-continued
| COMPOUND | CENTRAL MOIETY | A |
|---|---|---|
| 23 | 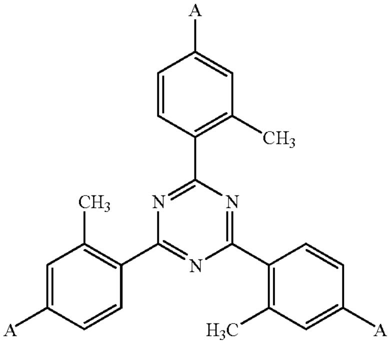 | 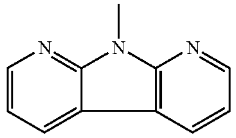 |
| 24 | 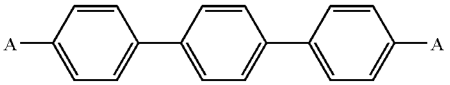 | 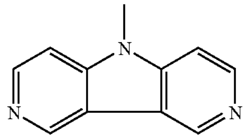 |
| 25 |  | 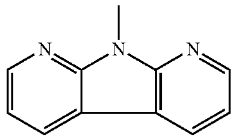 |
| 26 | 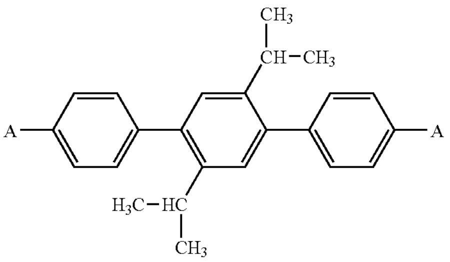 | 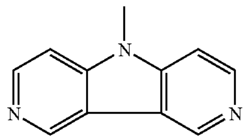 |
| 27 | 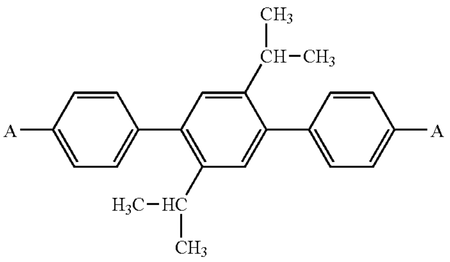 | 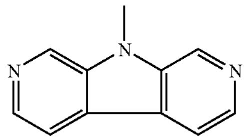 |
| 28 | 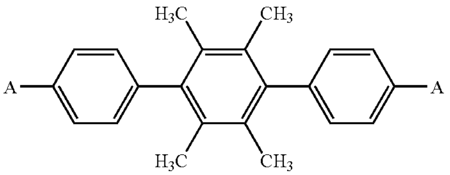 | 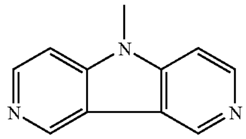 |
| 29 | 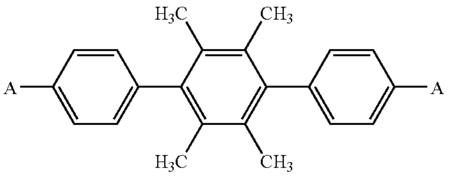 | 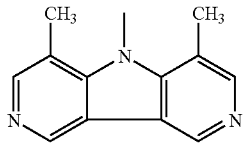 |

-continued
| COMPOUND | CENTRAL MOIETY | A |
|---|---|---|
| 30 | 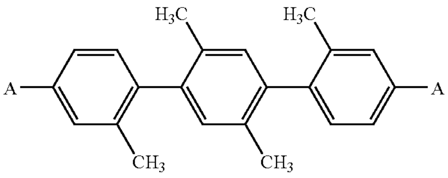 | 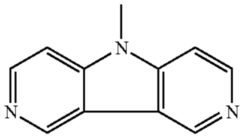 |
| 31 | 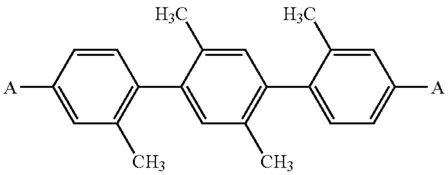 | 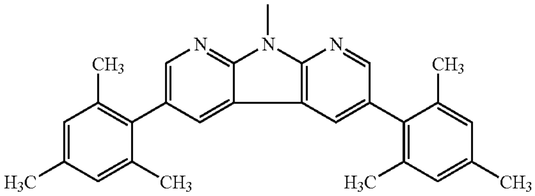 |
| 32 | 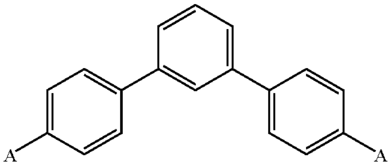 | 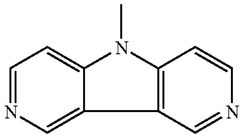 |
| 33 | 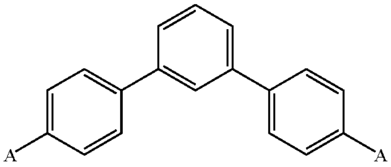 | 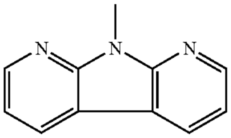 |
| 34 | 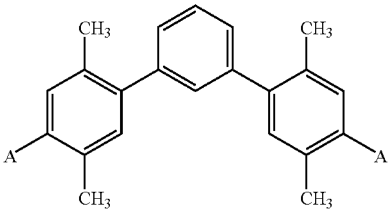 | 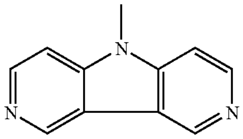 |
| 35 | 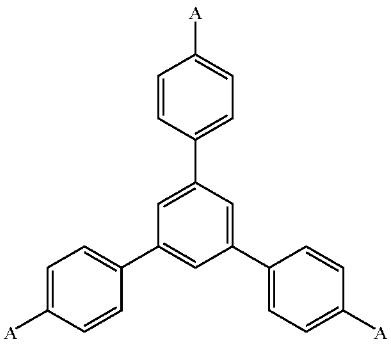 | 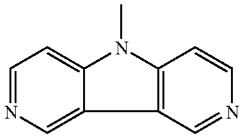 |

-continued
| COMPOUND | CENTRAL MOIETY | A |
|---|---|---|
| 36 | 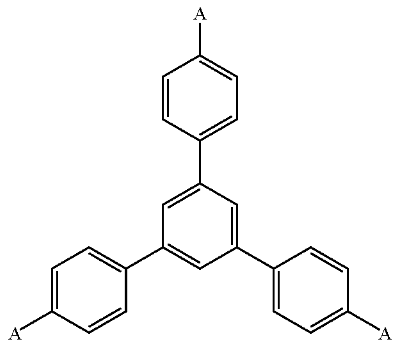 | 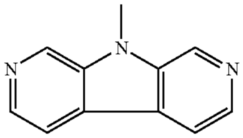 |
| 37 | 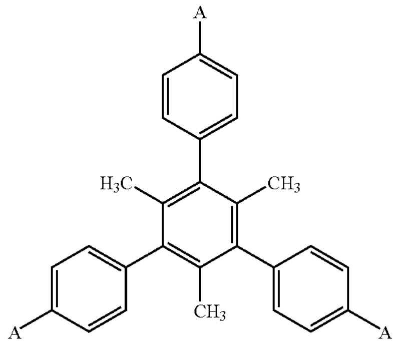 | 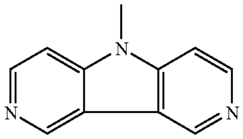 |
| 38 | 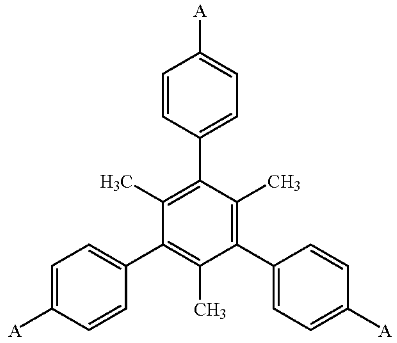 | 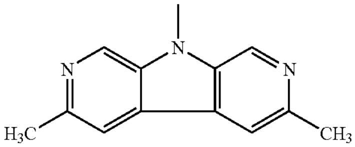 |
| 39 | 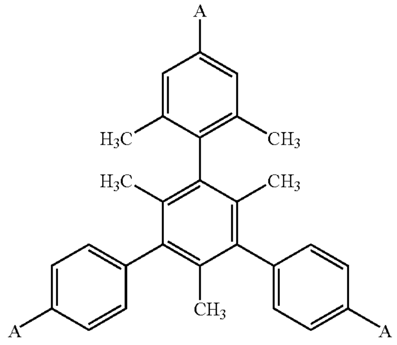 | 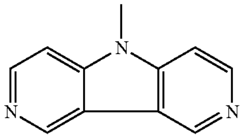 |

-continued
| COMPOUND | CENTRAL MOIETY | A |
|---|---|---|
| 40 | 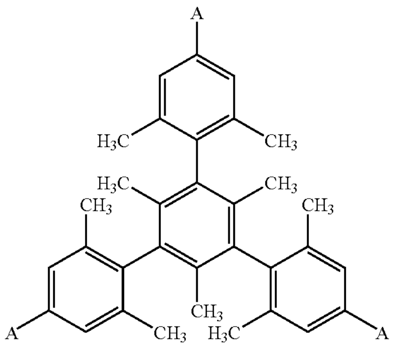 | 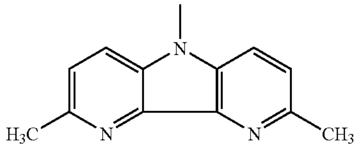 |
| 41 | 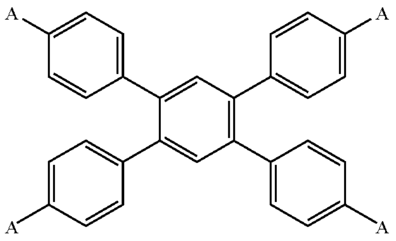 | 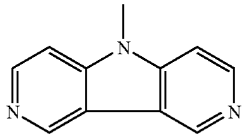 |
| 42 | 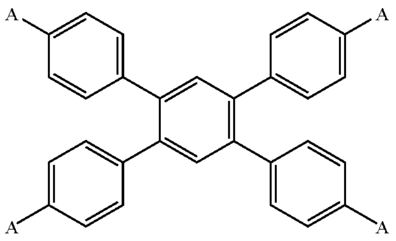 | 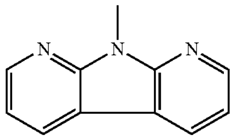 |
| 43 | 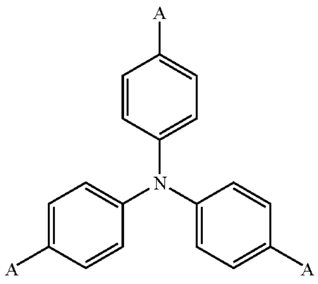 | 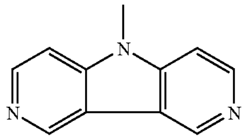 |
| 44 | 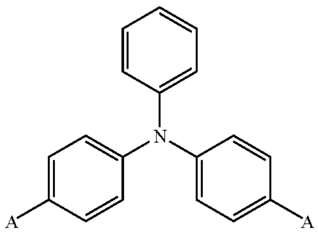 | 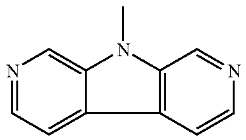 |
| 45 | 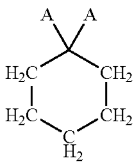 | 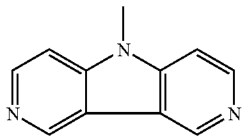 |

-continued
| COMPOUND | CENTRAL MOIETY | A |
|---|---|---|
| 46 | 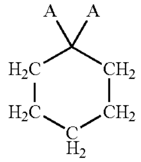 | 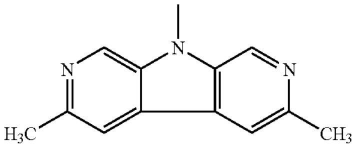 |
| 47 | 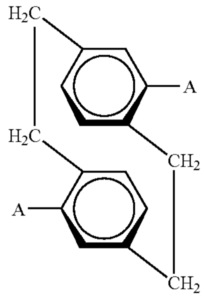 | 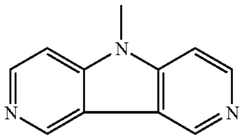 |
| 48 | 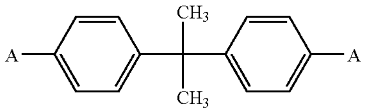 | 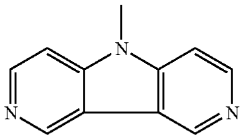 |
| 49 | 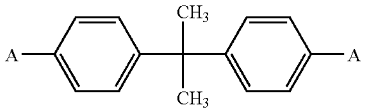 | 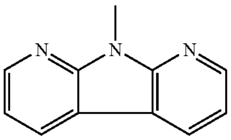 |
| 50 | 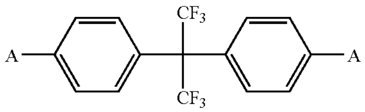 | 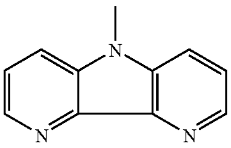 |
| 51 | 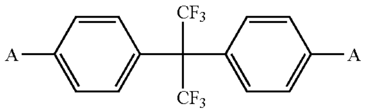 | 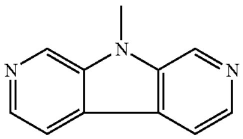 |
| 52 | 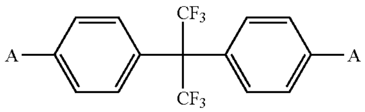 | 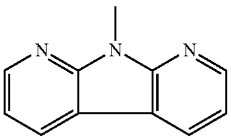 |
| 53 | 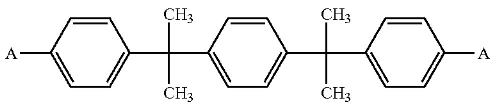 | 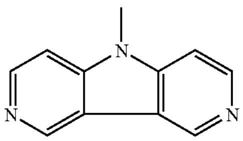 |
| 54 | 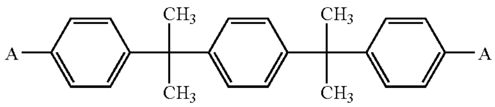 | 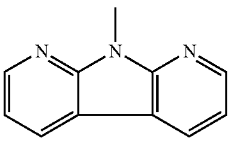 |

-continued
| COMPOUND | CENTRAL MOIETY | A |
|---|---|---|
| 55 | 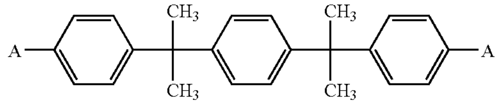 | 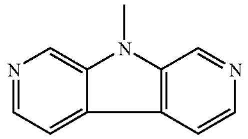 |
| 56 | 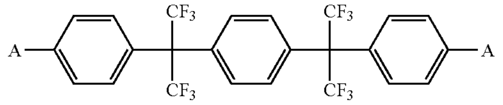 | 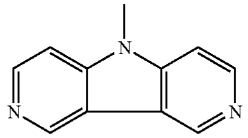 |
| 57 | 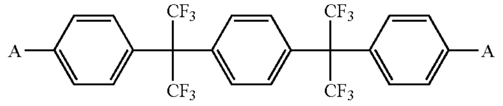 | 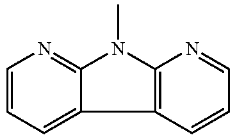 |
| 58 | 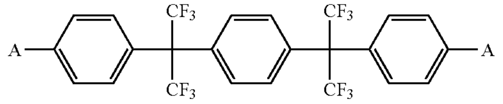 | 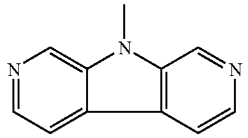 |
| 59 | 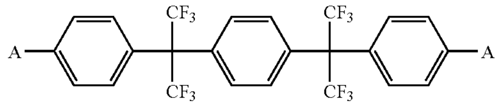 | 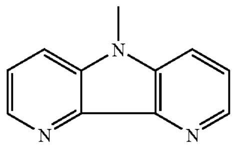 |
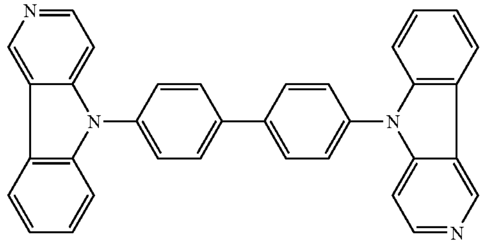
60
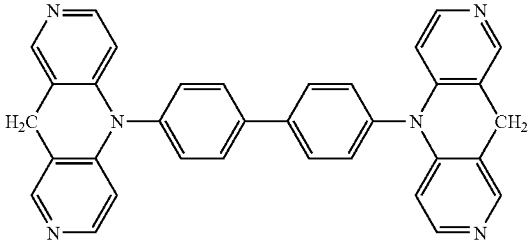
61
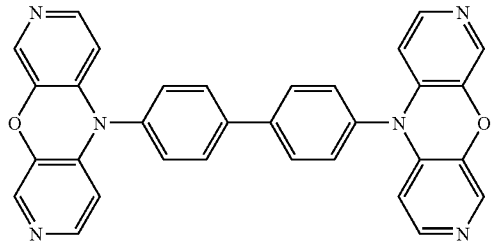
62
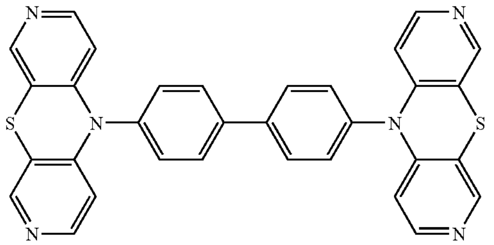
63
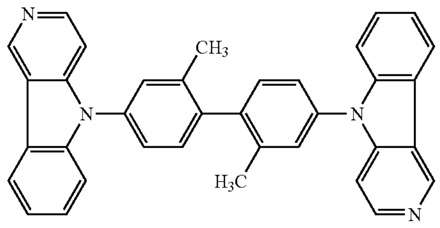
64
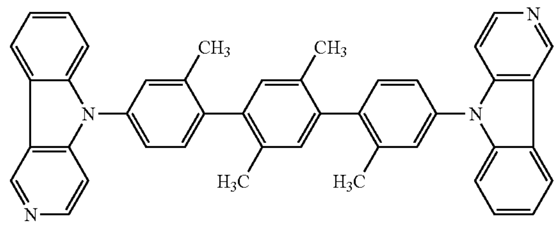
65

-continued
66
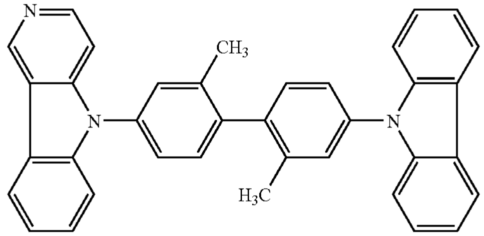
67
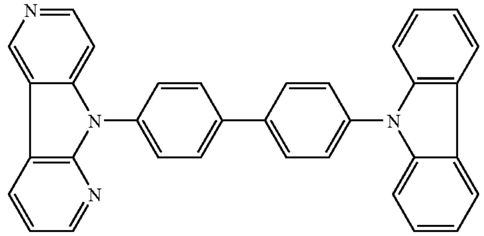
68
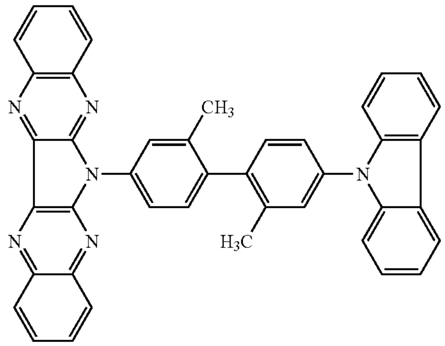
69
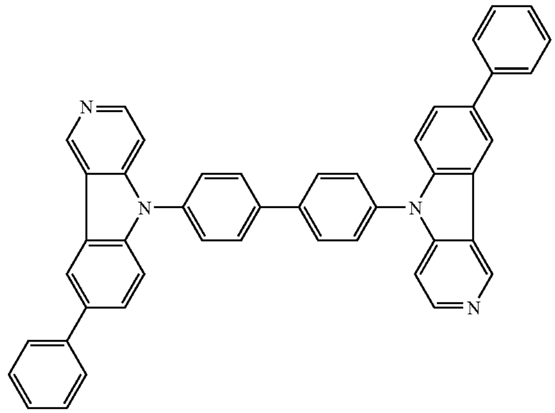
70
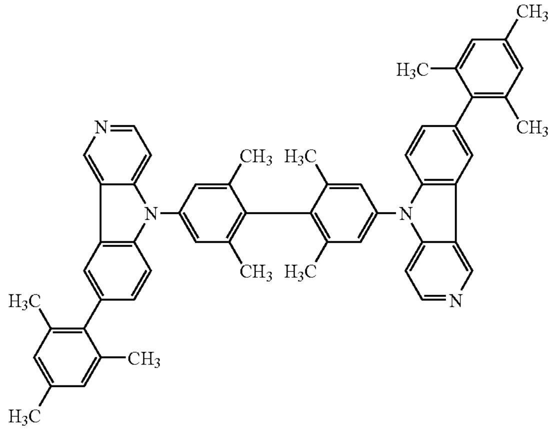
71
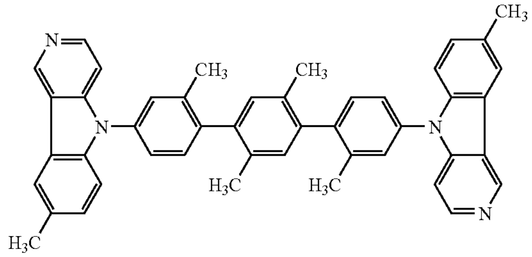
72
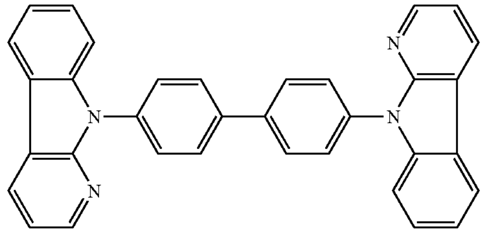
73
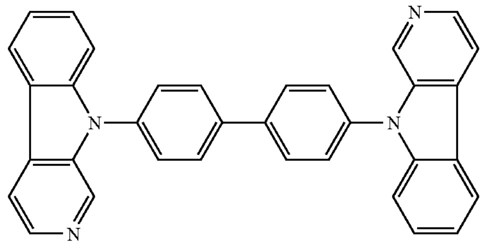

-continued
74
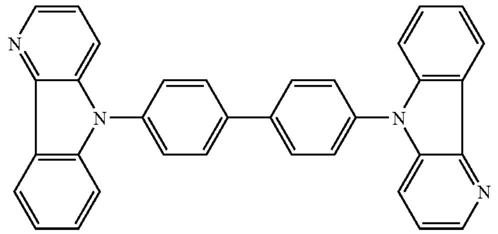
75
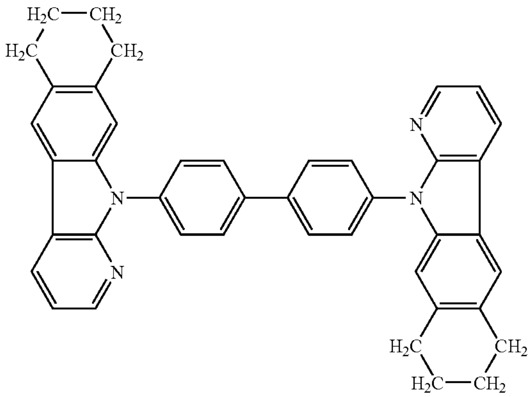
76
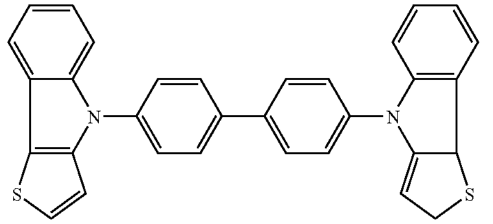
77
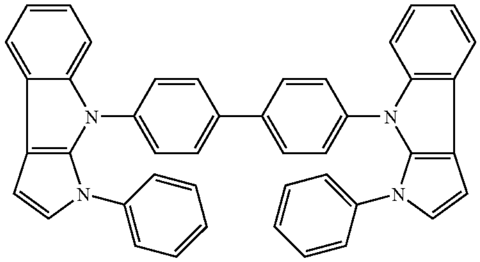
78
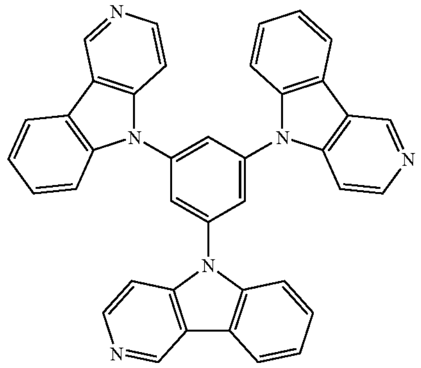
79
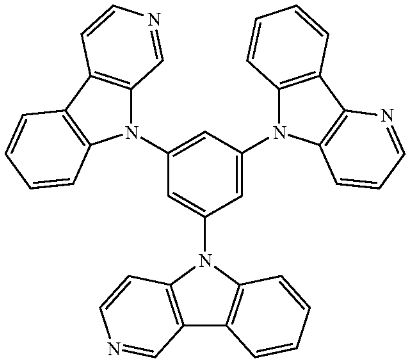
80
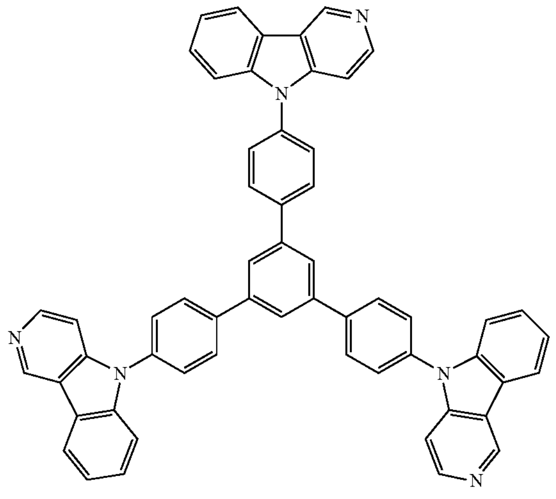
81
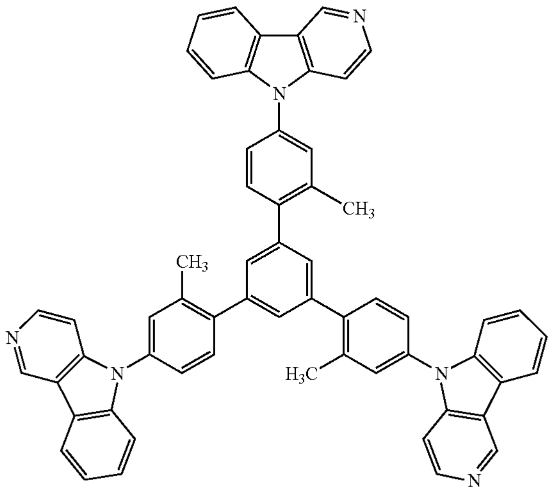

-continued
82
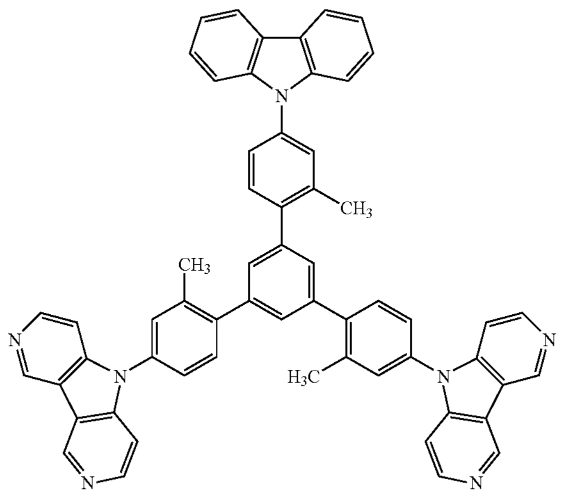
83
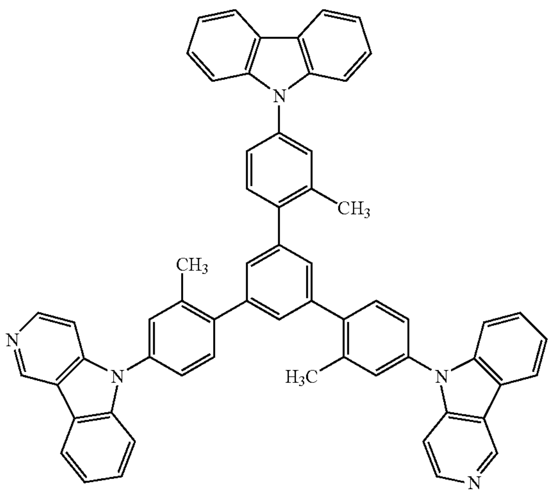
84
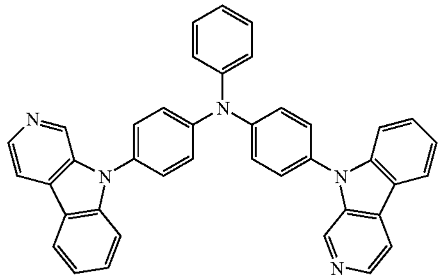
85
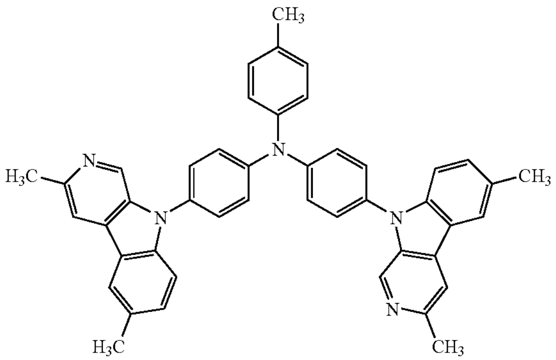
86
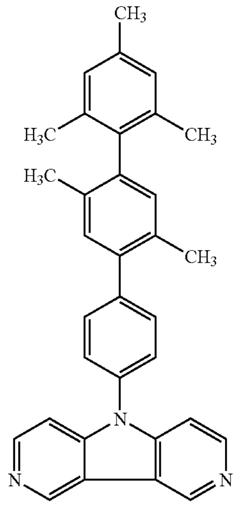
87
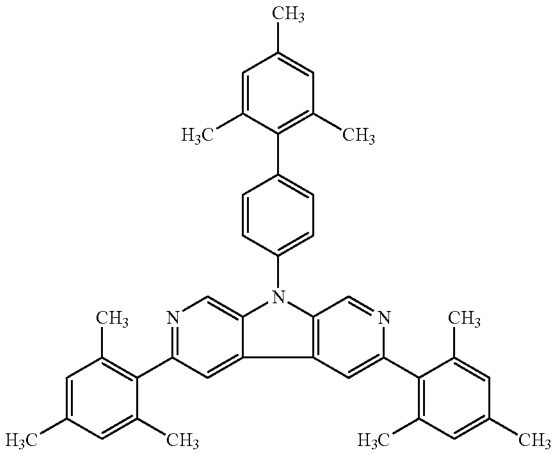

-continued
88
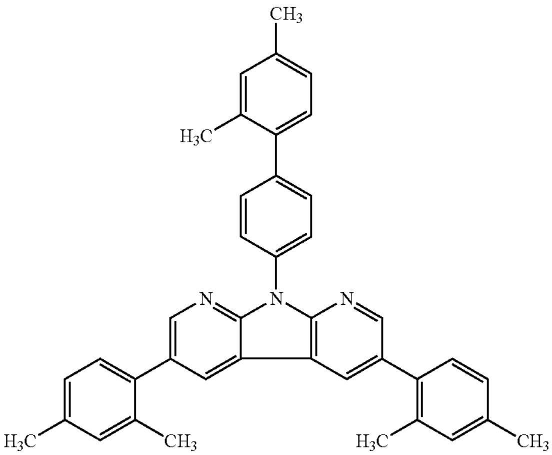
89
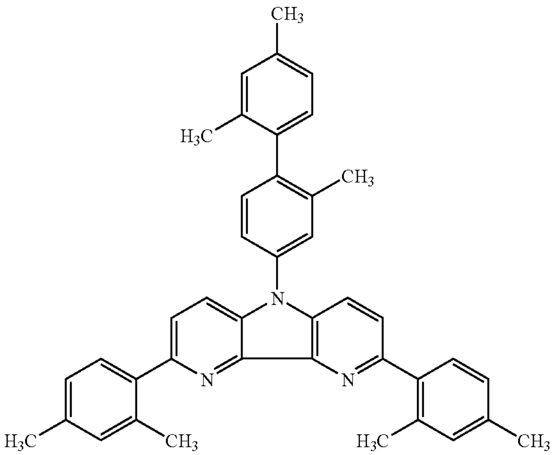
90
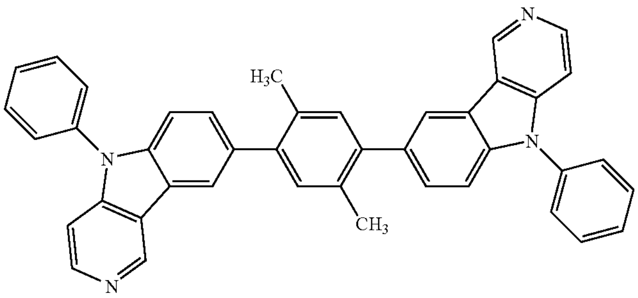
91
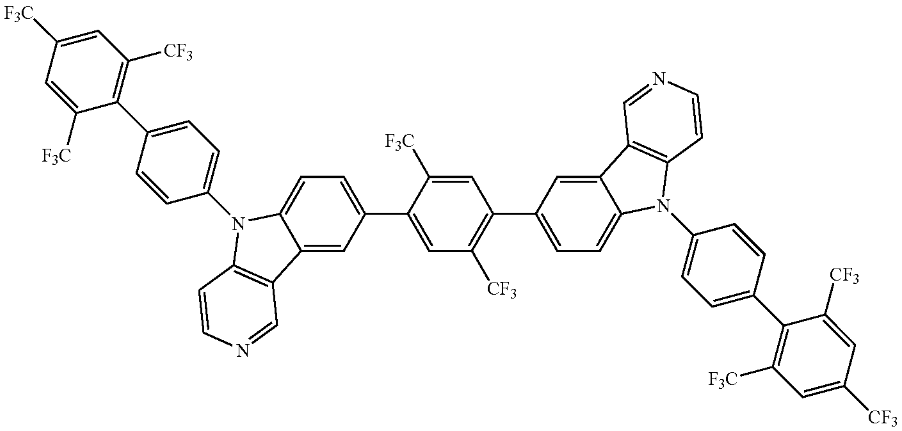
92
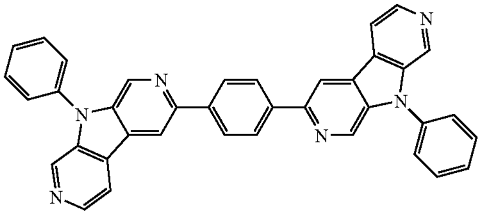
93
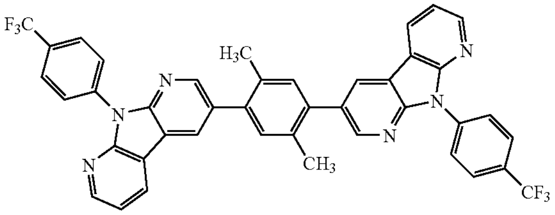

-continued
94
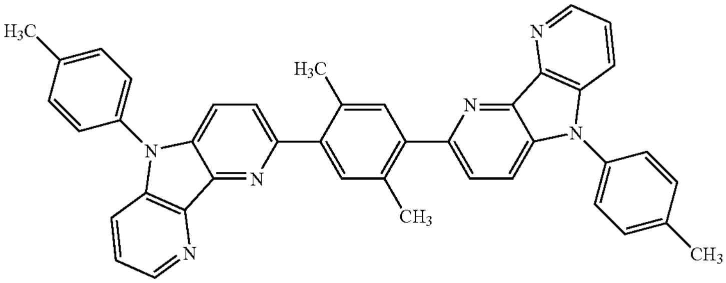
95
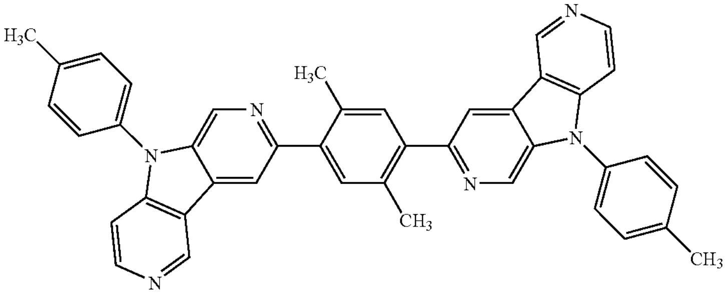
96
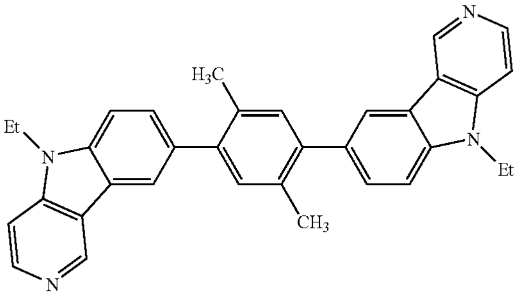
97
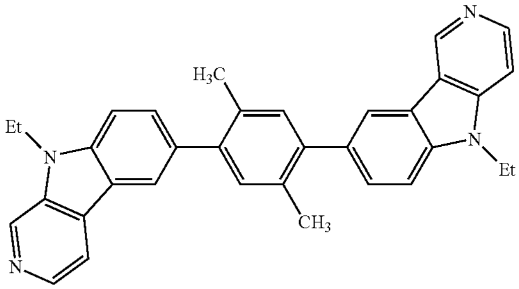
98
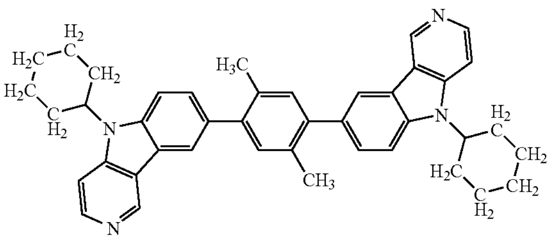
99
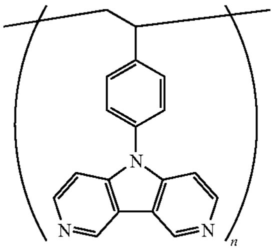
100
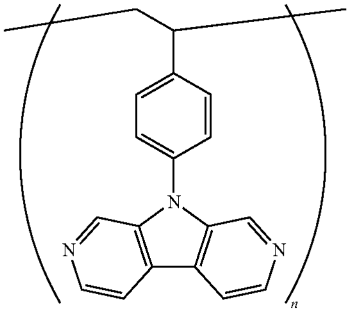
101
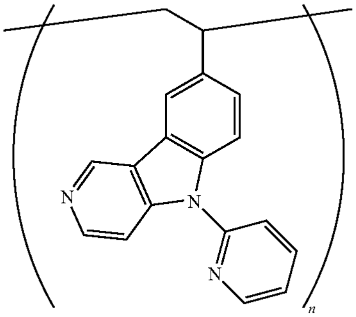

-continued
102
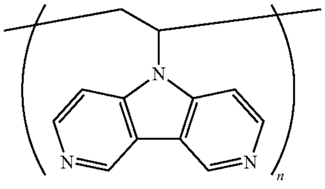
103
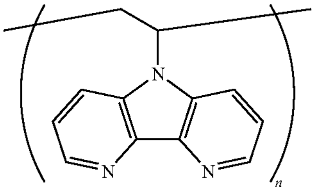
104
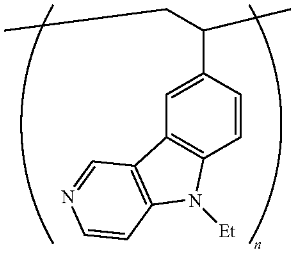
105
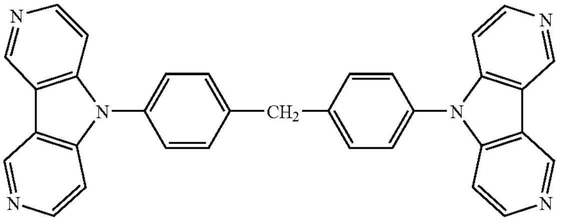
106
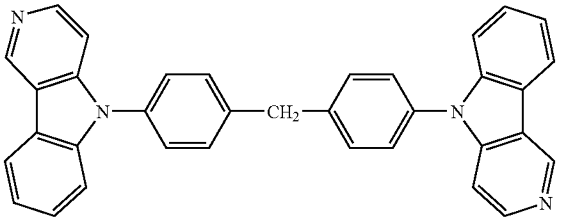
107
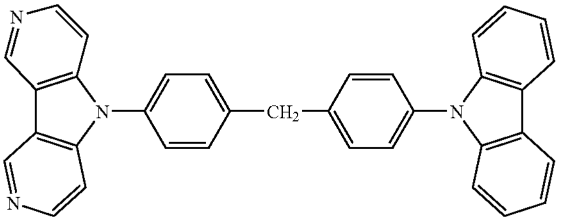
108
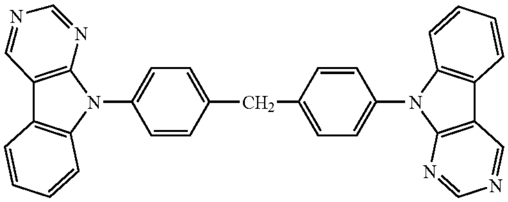
109
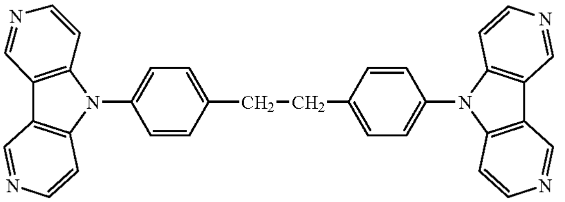
110
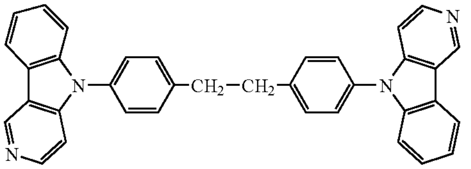
111
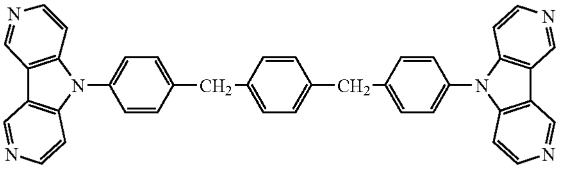
112
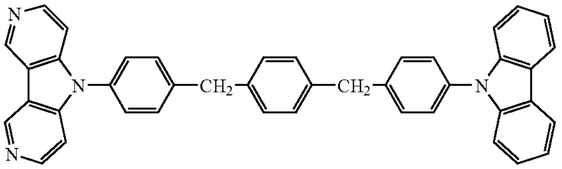
113
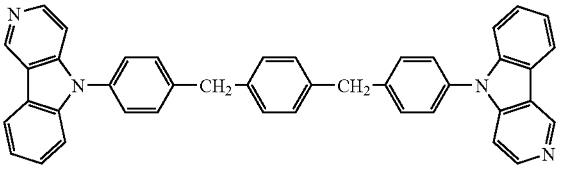
114
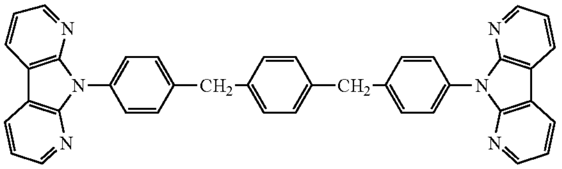
115
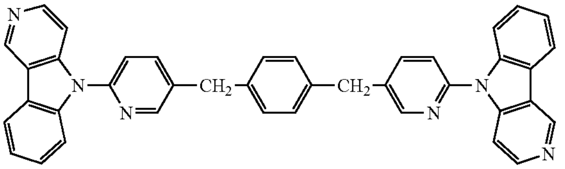

-continued
116
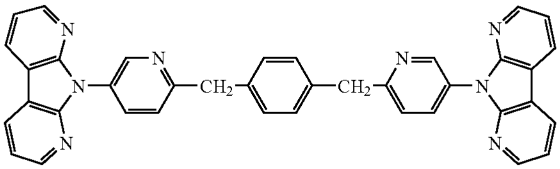
117
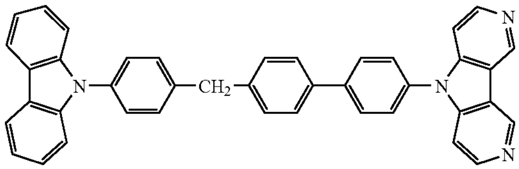
118
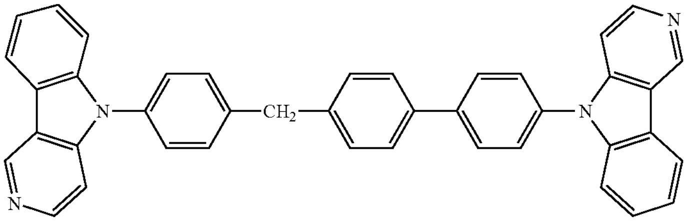
119
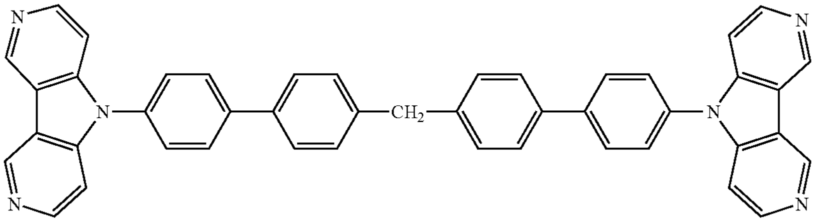
120
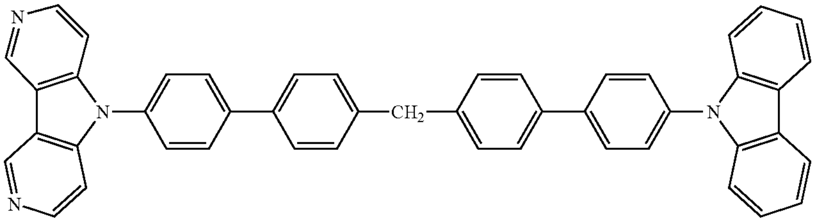
121
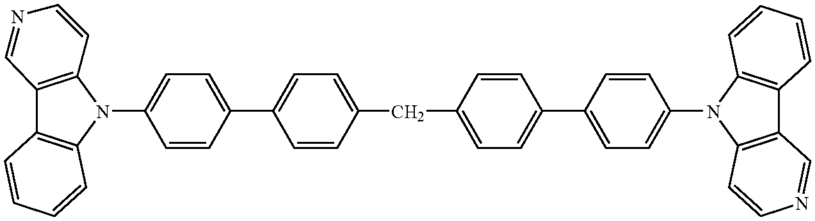
122
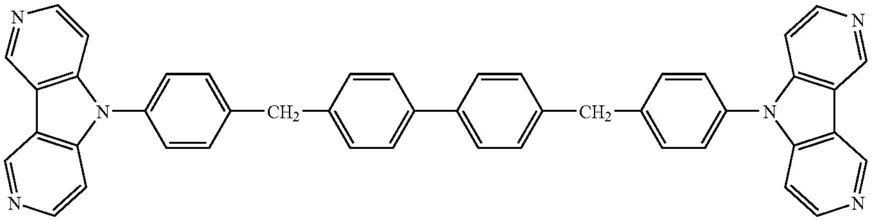
123
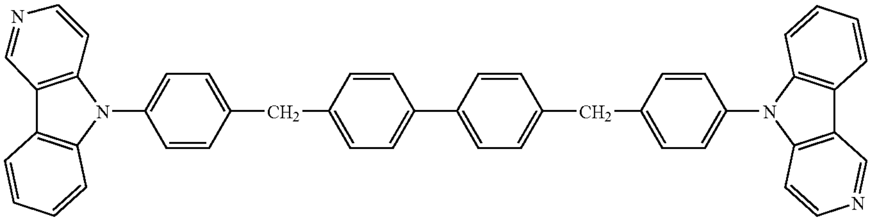

-continued
124
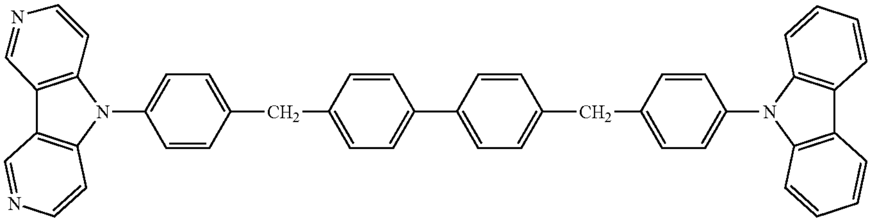
125
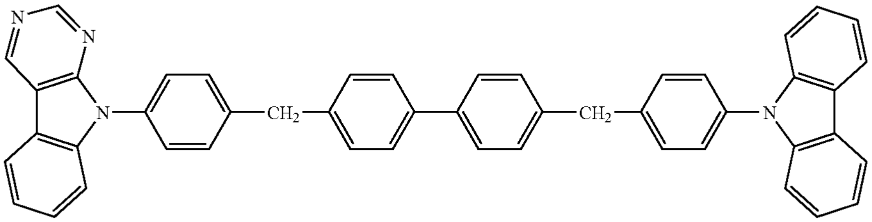
126
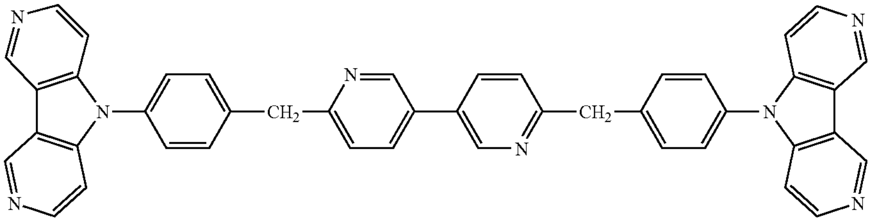
127
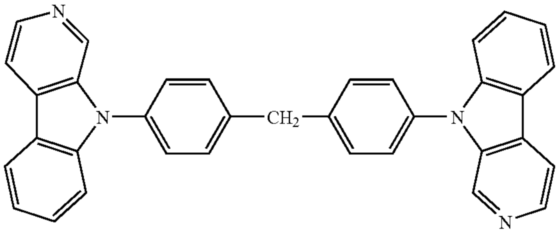
128
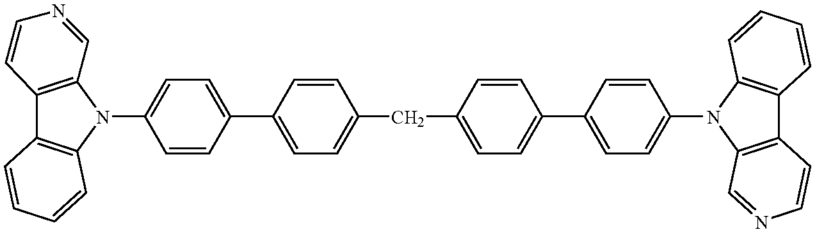
129
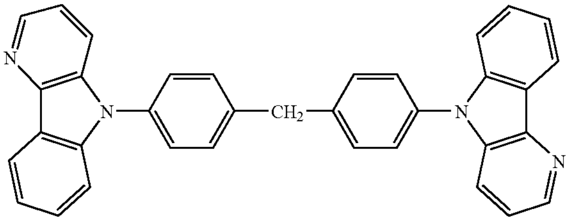
130
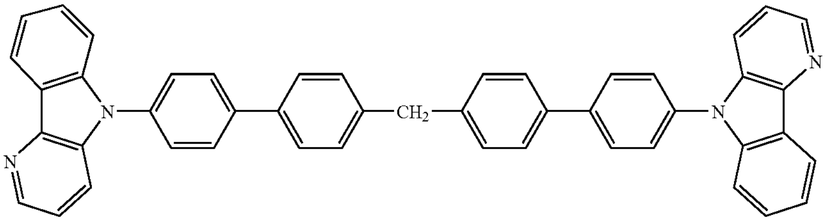

-continued
131
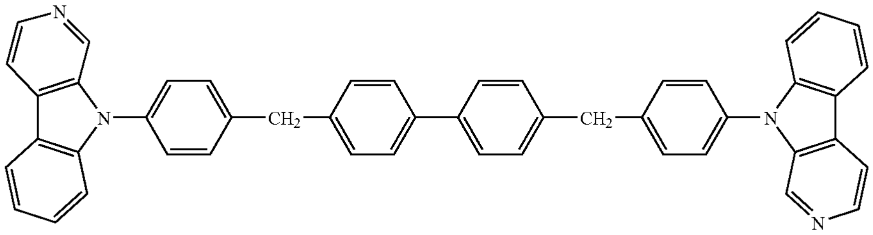
132
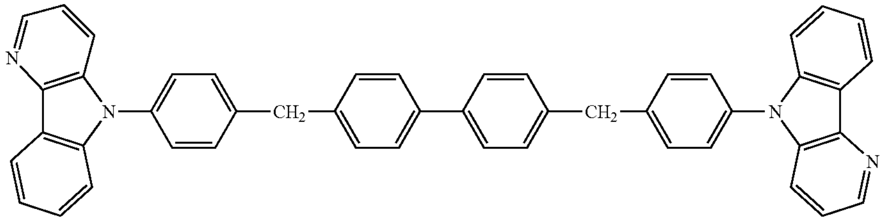
133
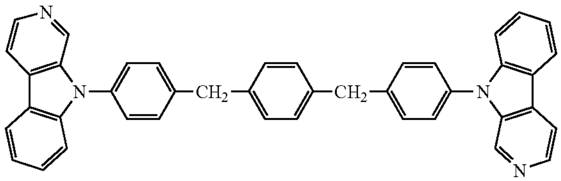
134
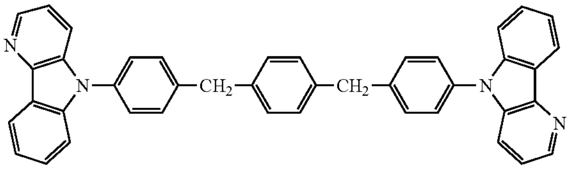
135
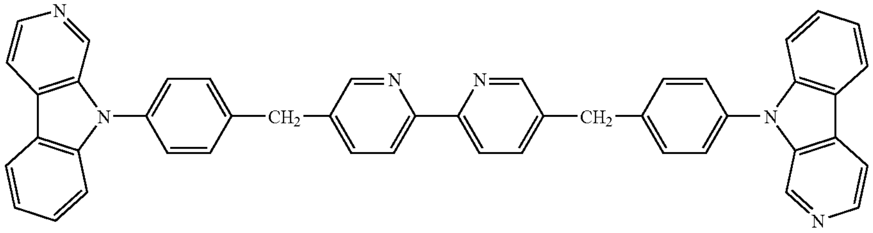
136
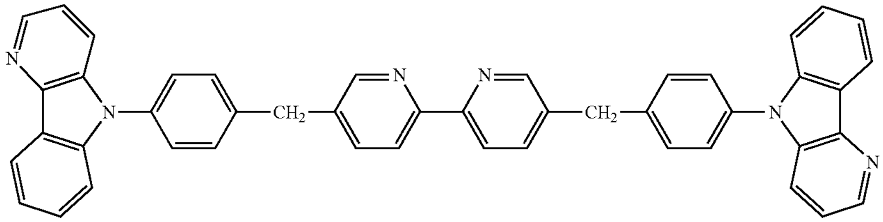

-continued
137
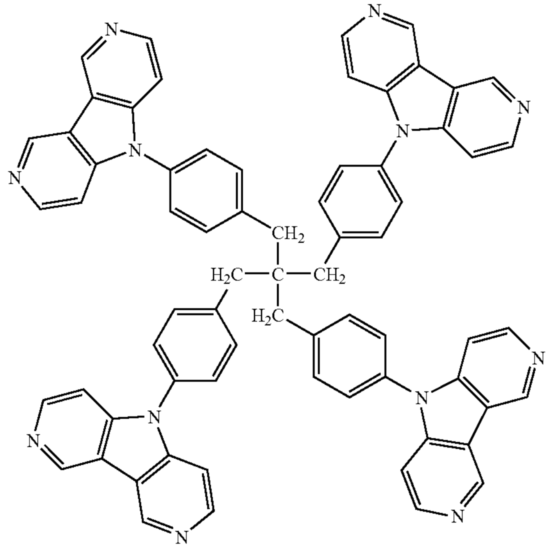
138
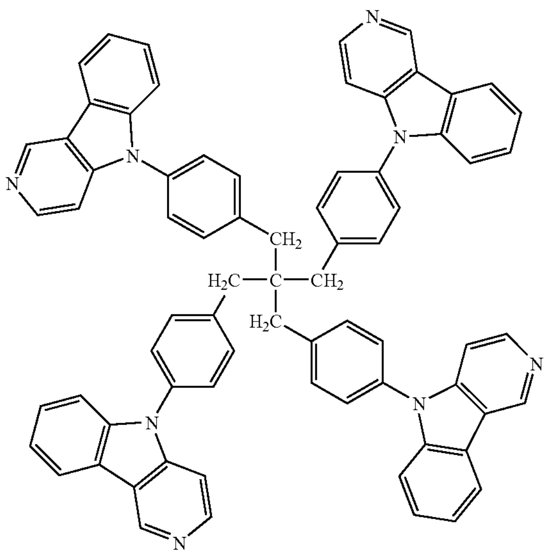
139
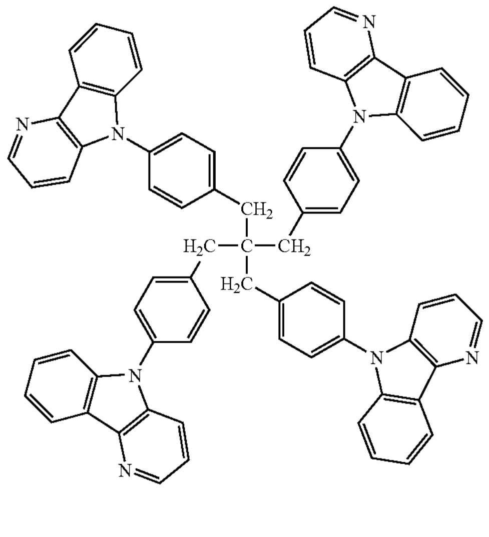
140
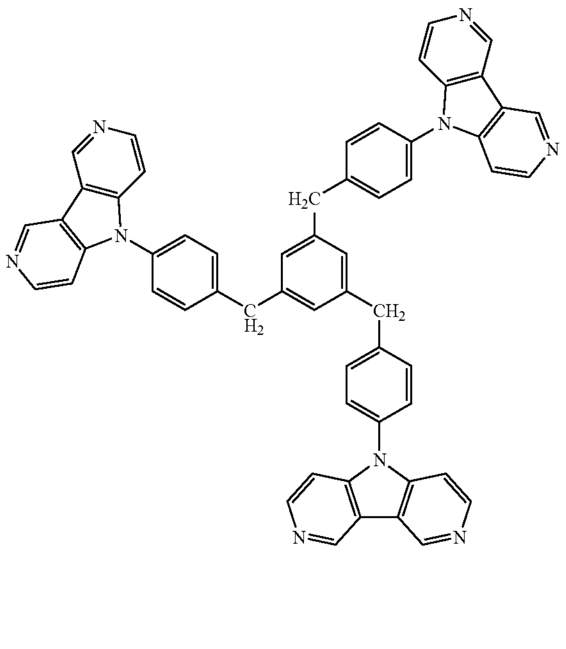

-continued
141
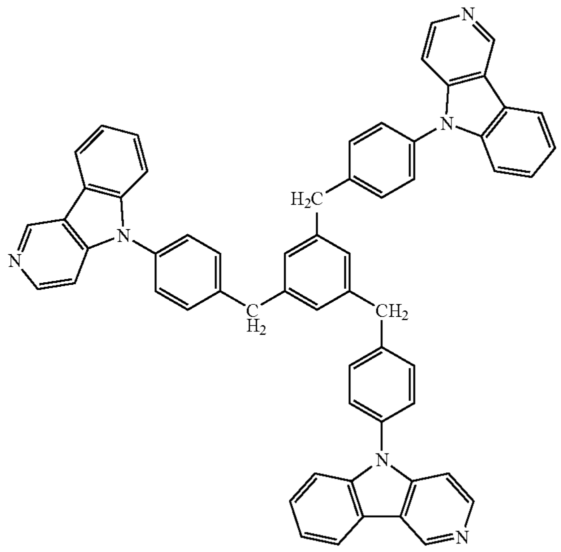
142
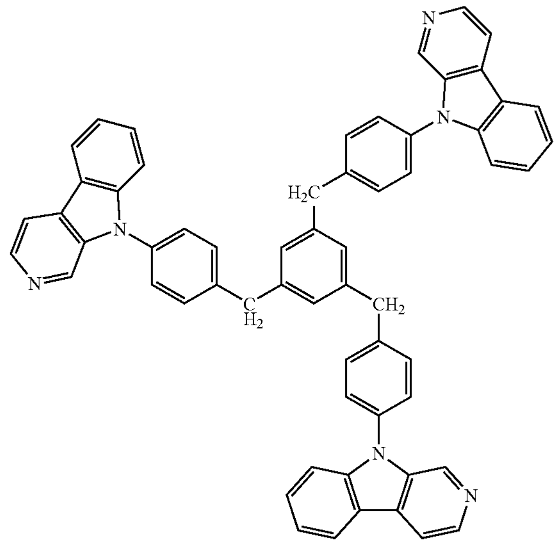
143
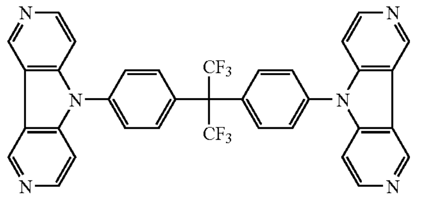
144
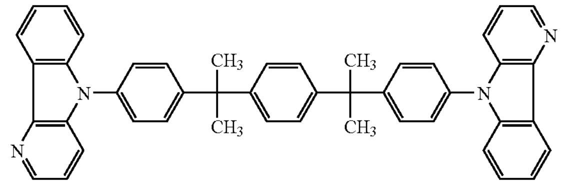
145
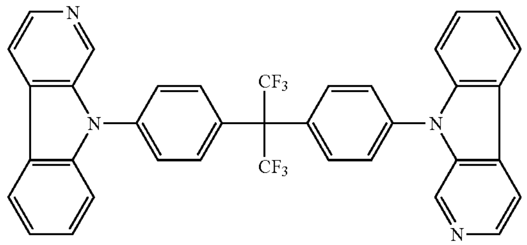
146
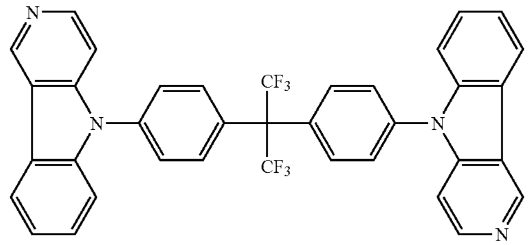
147
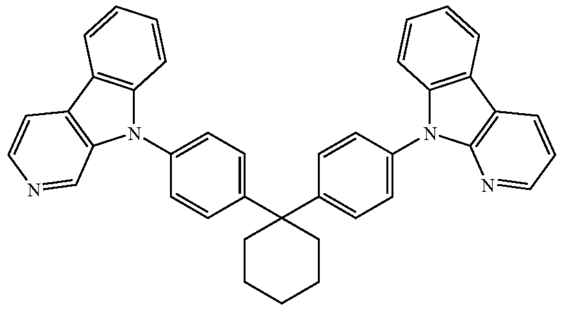
148
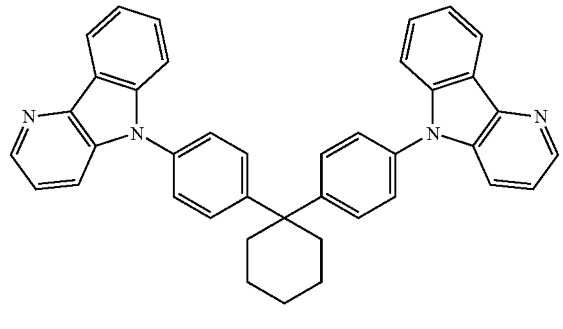

-continued
149
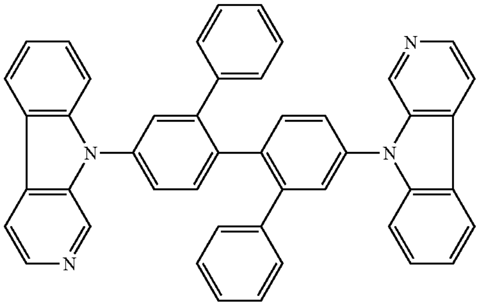
150
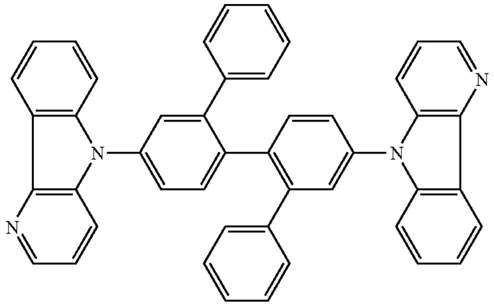
151
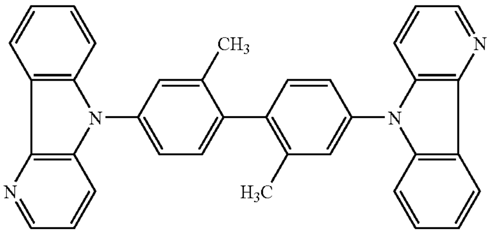
152
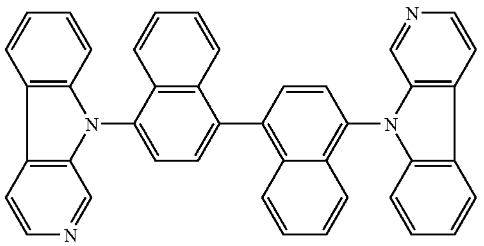
153
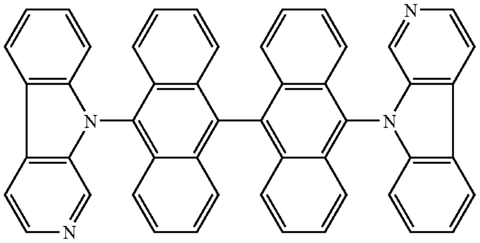
154
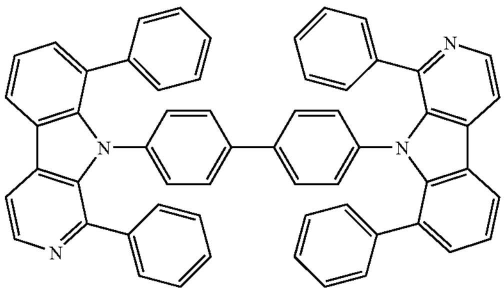
155
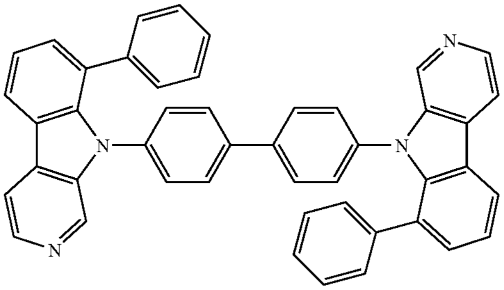
156
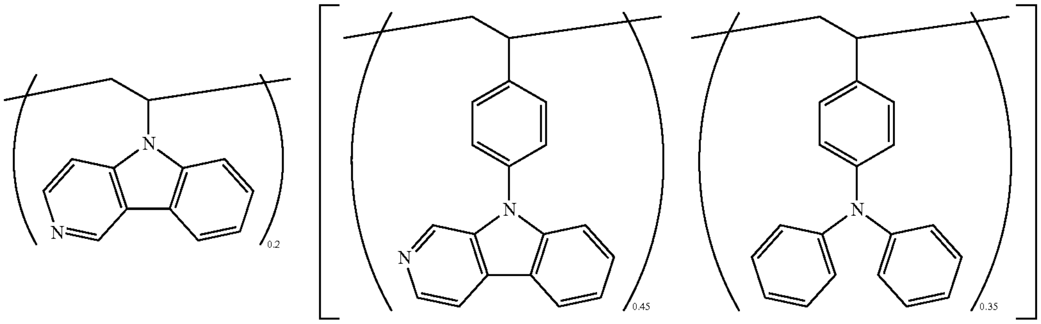

-continued
157
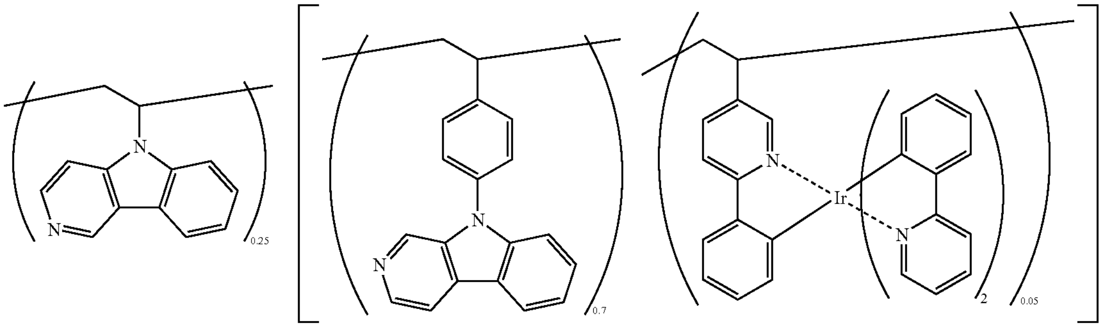
158
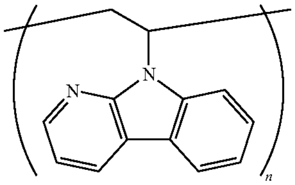
159
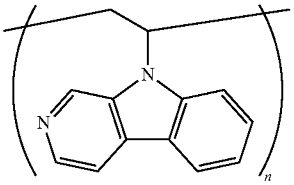
160
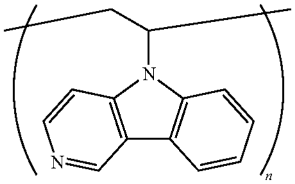
161
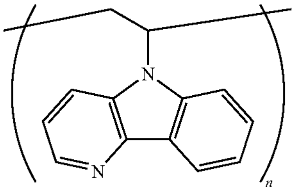
162
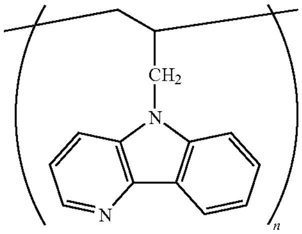
163
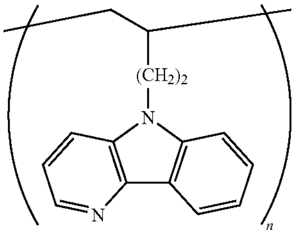
164
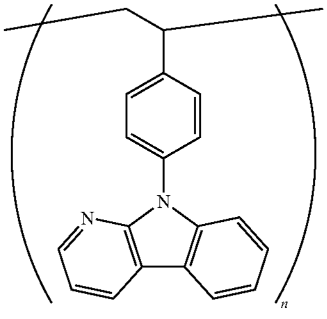
165
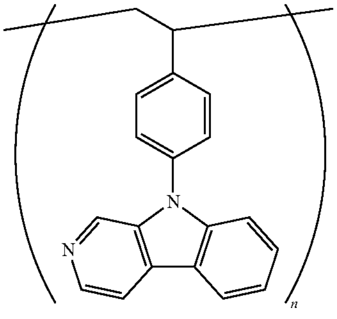
166
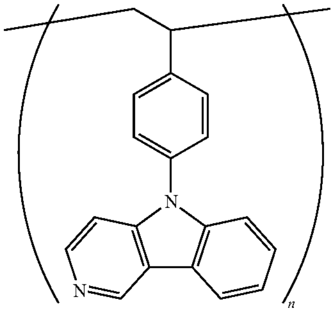
167
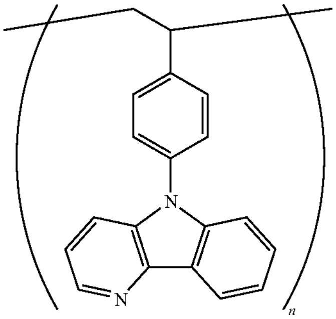

-continued
168
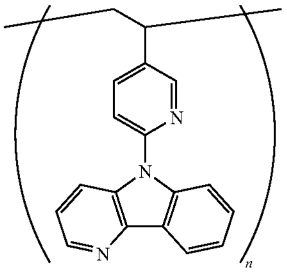
169
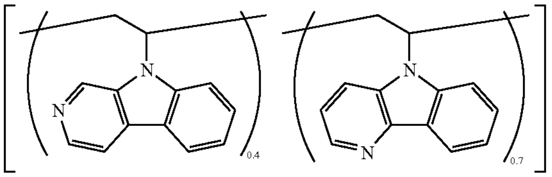
170
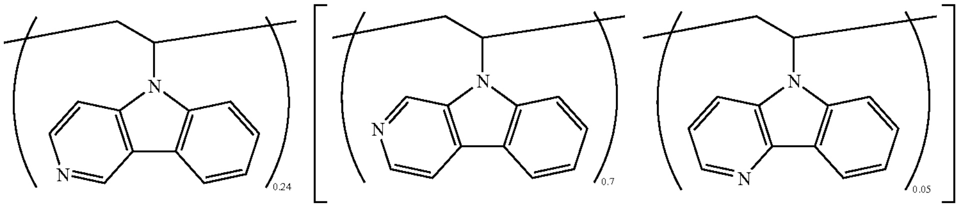
171
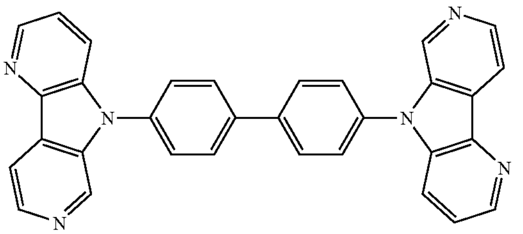
172
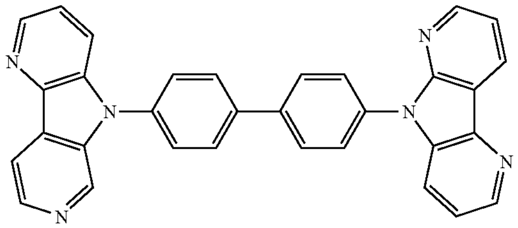
173
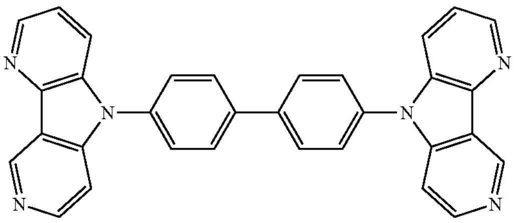
174
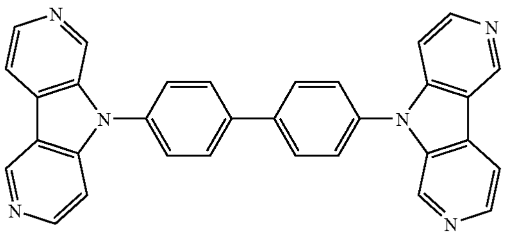
175
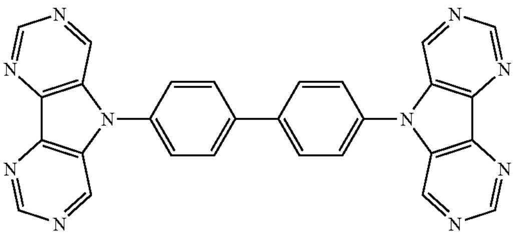
176
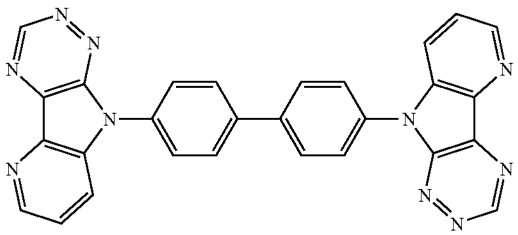
177
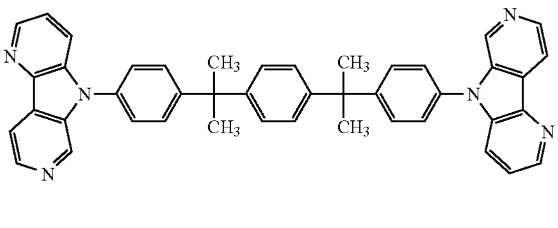
178
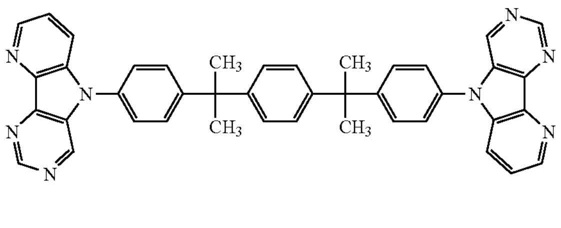

-continued
179
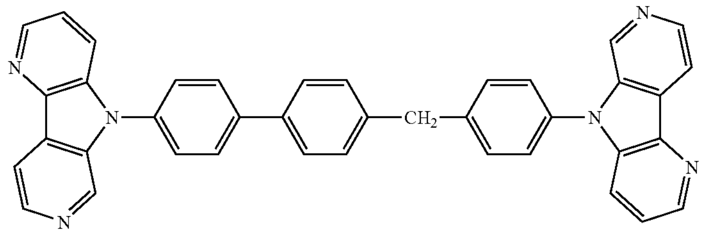
180
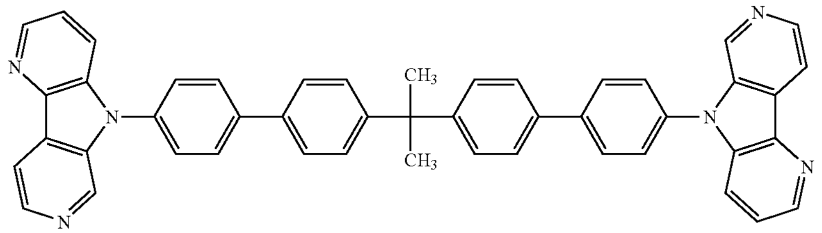
181
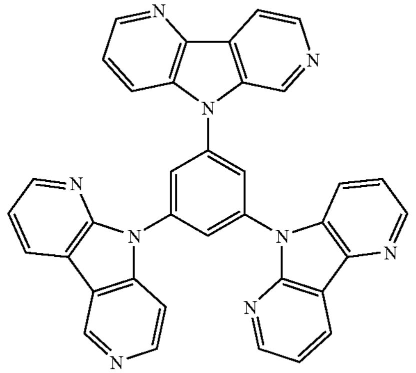
182
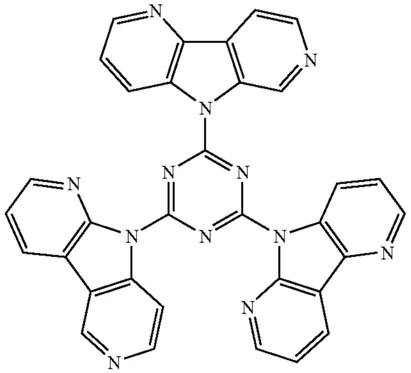
183
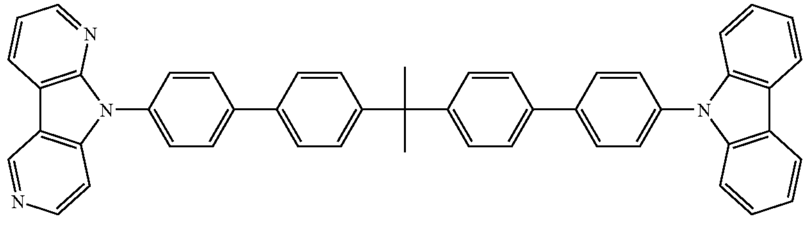
184
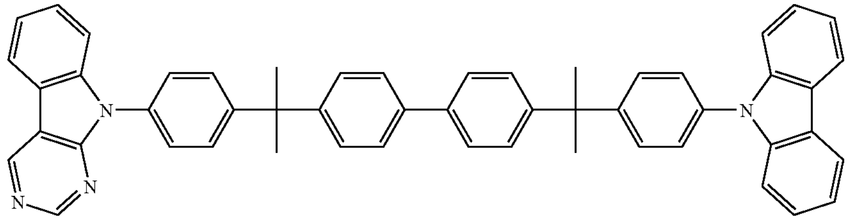

-continued
185
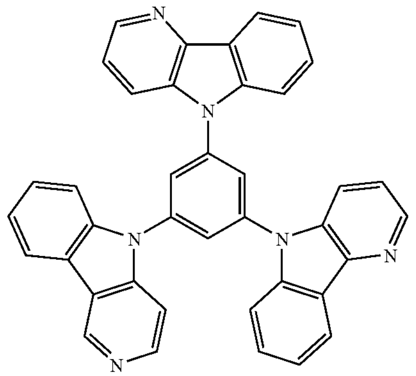
186
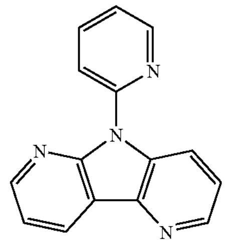
187
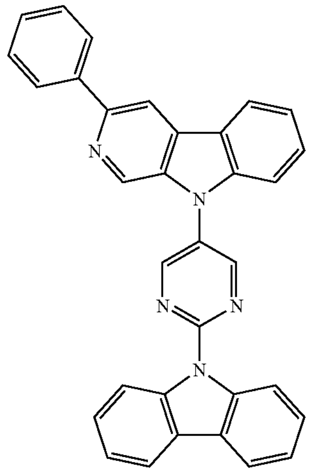
188
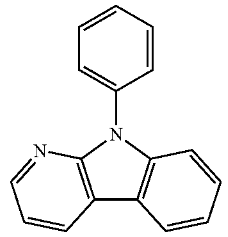
189
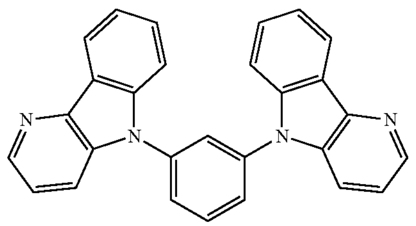
190
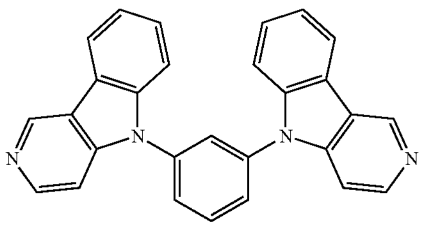
191
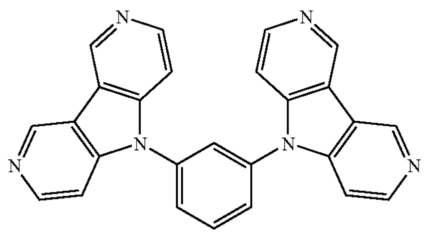
192
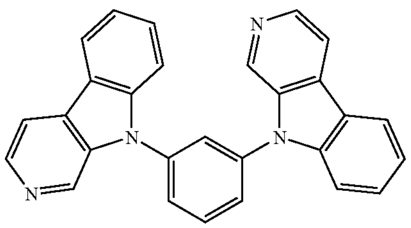

-continued

193

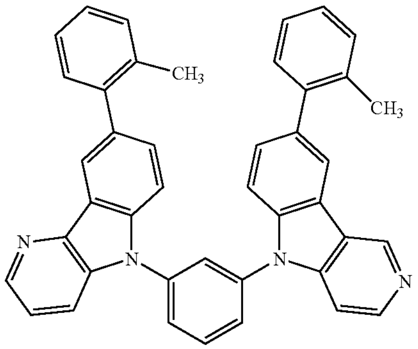

194

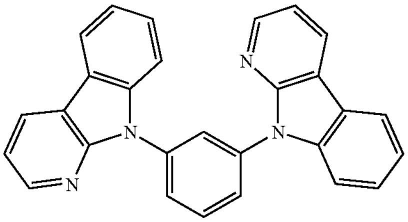

The emission host of the present invention may be a low molecular weight compound, a polymer compound having a repeat unit, or a low molecular weight compound having a polymerizable group like a vinyl group or an epoxy group (vapor-deposition-polymerizable emission host).

The emission host is preferably a compound having a hole transport ability, an electronic transport ability and a higher Tg (glass transition temperature), while preventing a shift of emission wavelength toward a long wavelength region.

As specific examples of an emission host, preferable is the compounds described in the following Patent Documents: for example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Emission Dopant))

The emission dopant contained in the light emission layer of the organic EL element of the present invention will now be described.

As an emission dopant used in the present, both of a fluorescent compound and a phosphorescence emitting material (also referred to as a phosphorescent compound or a phosphorescence emitting compound) are usable. However, in view of obtaining an organic EL element exhibiting a higher emission efficiency, the emission dopant (also referred to merely as a light emission material) used in the light emission layer or in a light emitting unit of the organic EL element of the present invention preferably contains a phosphorescence emitting material as well as the abovementioned host material.

(Phosphorescence Emitting Material)

The phosphorescence emitting material is a compound which emits light from the excited triplet, which is specifically a compound which emits phosphorescence at room temperature (25° C.), and exhibits a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield in a solution can be measured employing various kinds of solvents. The phosphorescence emitting material of the present invention is a compound, in which the phosphorescent quantum yield measured employing any one of the solvents falls within the above-described range (0.01 or more).

The light emission of the phosphorescence emitting material is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound. However, in each type, energy level of the phosphorescent compound in excited state is lower than that of the host in excited state.

The phosphorescence emitting material can be optionally selected from the known phosphorescence emitting materials used in the light emission layer of an organic EL element.

The phosphorescence emitting material is preferably a complex containing a metal of Group 8-10 of the periodic table, and more preferably an iridium compound, an osmium compound, a platinum compound (a platinum complex compound) or a rare-earth metal complex. Of these, most preferable is an iridium compound.

Specific examples of a compound used as a phosphorescence emitting material are shown below, however, the present invention is not limited thereto. These compounds can be synthesized, for example, according to a method described in Inorg. Chem., 40, 1704-1711.

Ir-1

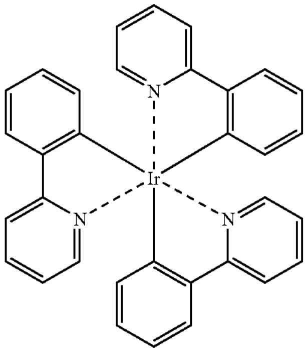

-continued
Ir-2
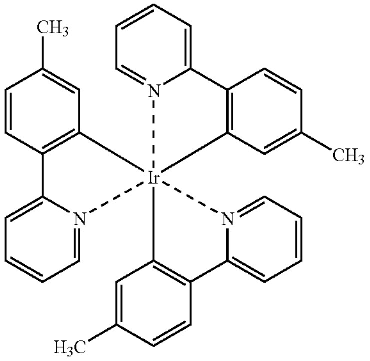
Ir-3
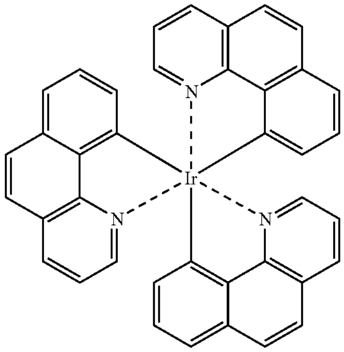
Ir-4
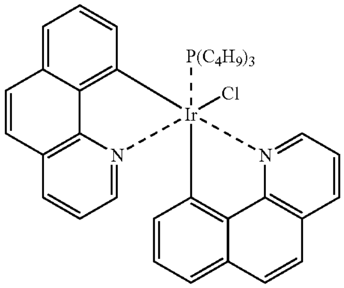
Ir-5
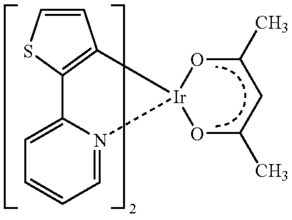
Ir-6
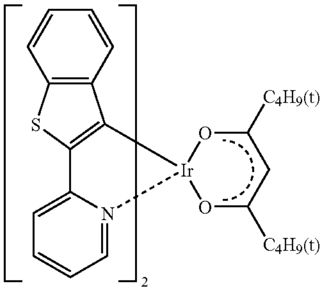
-continued
Ir-7
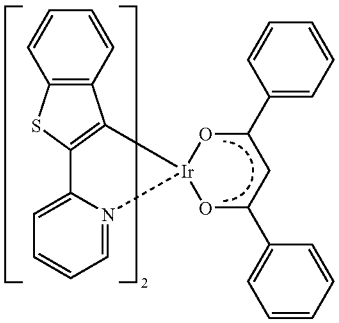
Ir-8
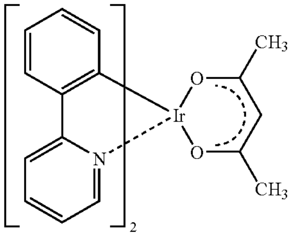
Ir-9
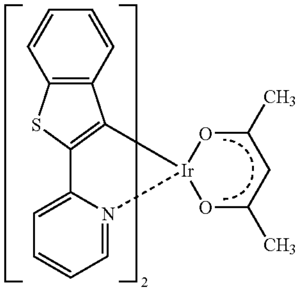
Ir-10
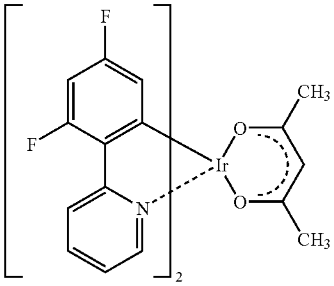
Ir-11
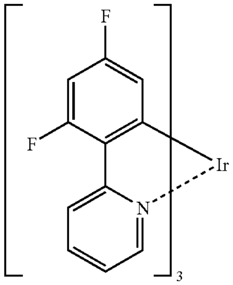

-continued
Ir-12
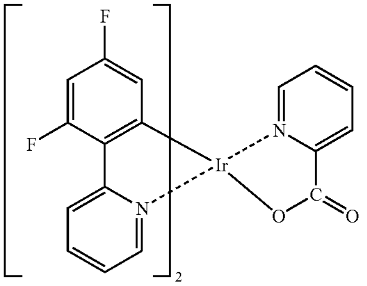
Ir-13
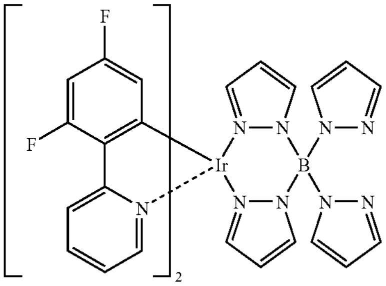
Ir-14
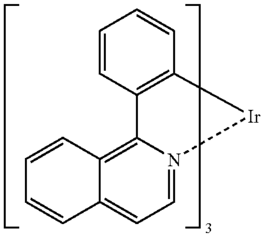
Pt-1
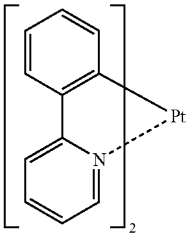
Pt-2
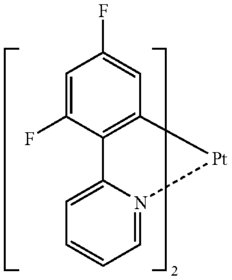
-continued
Pt-3
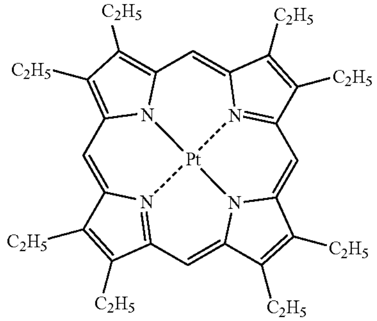
A-1
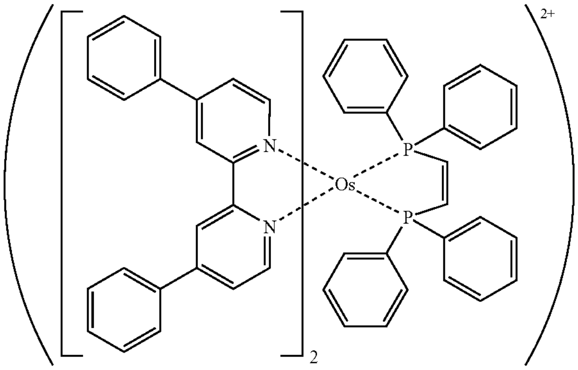
$(CF_3CF_2CF_2COO^-)_2$
Rh-1
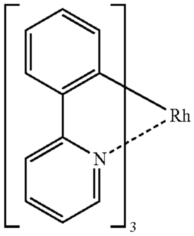
Rh-2
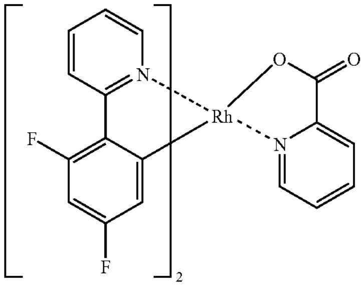
Rh-3
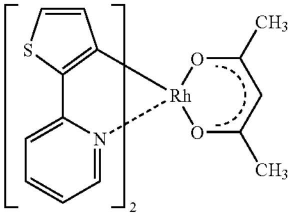

-continued

Pd-1

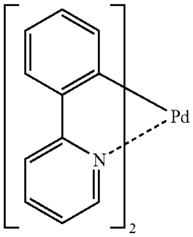

Pd-2

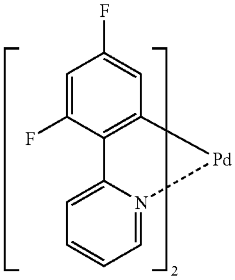

Pd-3

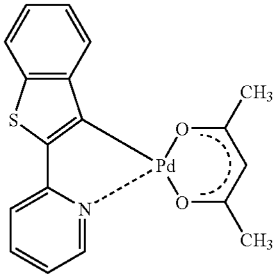

D-1

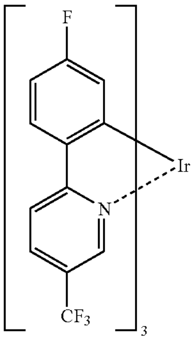

D-2

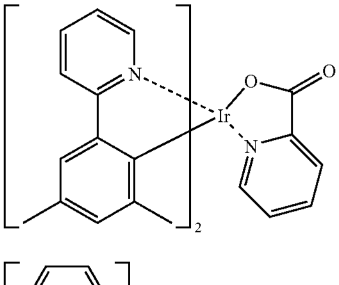

D-3

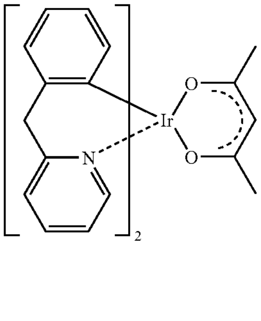

-continued

D-4

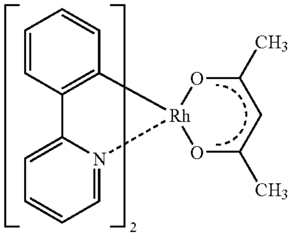

D-5

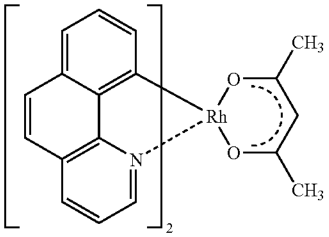

D-6

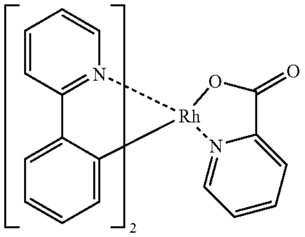

(Fluorescence Emitting Material (Also Referred to as Fluorescent Dopant))

Typical examples of a fluorescence emitting material (a fluorescent dopant) include a cumarin dye, a pyrane dye, a cyanine dye, a chloconium dye, a squalenium dye, an oxobenzanthracene dye, a fluorescene dye, a rhodamine dye, a pyrylium dye, a perylene dye, a stilbene dye, a polythiophene dye and a rare-earth complex fluorescent material.

Also, dopants known in the art are usable in the present invention, examples include: WO00/70665, JP-A Nos. 2002-280178, 2001-181616, 2002-280179, 2001-181617, 2002-280180, 2001-247859, 2002-299060, 2001-313178, 2002-302671, 2001-345183, 2002-324679, WO02/15645 No., JP-A Nos. 2002-332291, 2002-50484, 2002-332292, 2002-83684, Japanese Translation of PCT International Application Publication No. 2002-540572, JP-A Nos. 2002-117978, 2002-338588, 2002-170684, 2002-352960, WO01/93642 No., JP-A Nos. 2002-50483, 2002-100476, 2002-173674, 2002-359082, 2002-175884, 2002-363552, 2002-184582, 2003-7469, Japanese Translation of PCT International Application Publication No. 2002-525808, JP-A Nos. 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

<<Blocking Layer (Electron Blocking Layer, Electron Hole Blocking Layer)>>

The blocking layer of the present invention (for example, an electron blocking layer, an electron hole blocking layer) of the present invention will be described.

In the present invention, a known material of the organic EL element can be appropriately incorporated in each of the hole blocking layer and the electron blocking layer.

For example, a material used in the construction of the organic EL element described in any one of claims 1-8 may be incorporated in the hole blocking layer or in the electron blocking layer as a layer constitution component, or may be mixed with other organic compound.
The thickness of the blocking layer of the present invention is preferably 3 nm-100 nm and more preferably 5 nm-30 nm.

<<Hole Blocking Layer>>

The hole blocking layer has the function of the electron transport layer in a wide sense and is comprised of a material which has electron transport ability and very low hole transport ability. The probability of recombination of the electron with the hole can be raised by the ability of such the material of blocking the hole while transporting the electron.

The hole blocking layer described in, for example, JP-A Nos. 11-204258 and 11-204359, and page 237 of "Yuuki EL soshi to sono kougyouka saizennsenn (Organic EL element and its front of industrialization) Nov. 30, 1998, published by NTS Inc. can be applied as the hole blocking layer relating to the present invention. Moreover, the later-mentioned electron transport layer relating to the present invention can be used as the hole blocking layer relating to the present invention according to necessity.

<<Electron Blocking Layer>>

The electron blocking layer comprises a material having a function of hole transportation in a wide sense while having very low ability of electron transportation. The probability of recombination of the electron with the hole can be raised by blocking the electron while transporting the hole. The constitution of the later-mentioned hole transport layer can be used as the electron blocking layer according to necessity.

In the present invention, it is preferable that a compound represented by above Formula (33) is used in a layer adjacent to the light emission layer, namely, a hole blocking layer or an electron blocking layer, and it is more preferable that the compound is used in a hole blocking layer.

<<Hole Transport Layer>>

The hole transport layer contains a material having a hole transporting ability, and in a broad sense a hole injecting layer or an electron blocking layer are included in a hole transport layer. The hole transport layer may be provided as a single layer or as a plurality of layers.

The hole transport layer may be either an organic substance or an inorganic substance as long as it has a hole injecting ability, a hole transporting ability or an ability to form a barrier to electrons. Examples thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline based copolymer, and an electroconductive oligomer, specifically a thiophene oligomer.
As the hole transporting material, those described above are used, however, a porphyrin compound, an aromatic tertiary amine compound or a styrylamine compound is preferably used, and, specifically, an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-Si and p-SiC are usable.

A so-called p-type hole blocking layer as disclosed in JP-A No. 11-251067 or described in the literature of J. Huang et al. (Applied Physics Letters 80 (2002), p. 139) is also applicable. In the present invention, these materials are preferably utilized since an emitting element exhibiting a higher efficiency is obtained.

The hole transporting layer can be formed by preparing a thin layer of the hole transporting material using a known method such as a vacuum deposition method, a spin coat method, a casting method, an ink jet method, or an LB method. The thickness of the hole transporting layer is not specifically limited, however, is ordinarily 5 to 5000 nm and preferably 5 to 200 nm. The hole transporting layer may be composed of a single layer structure containing one or two or more of the materials mentioned above.

A hole transport layer having a high p-property which have been subjected to impurity doping, can be utilized. Examples thereof are described in such as JP-A Nos. 4-297076, 2000-196140 and 2001-102175; and J. Appl. Phys., 95, 5773 (2004).

In the present invention, it is preferable to use such a hole transport layer having a high p-property in view of preparing an element consuming a lower power.

<<Electron Transport Layer>>

The electron transport layer contains a material having an electron transporting ability, and in a broad sense an electron injecting layer or a hole blocking layer are included in an electron transport layer. The electron transport layer can be provided as a single layer or as plural layers.

An electron transporting material (which serves also as a hole blocking material) used in a single electron transport layer or in the electron transport layer closest to the cathode when plural electron transport layers are employed, may be a compound which has a function of transporting electrons injected from a cathode to a light emitting layer. The material used in the electron transport layer can be optionally selected from known compounds used as electron transporting materials. Examples of the material used in the electron transport layer include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are also usable as the electron transporting material. A polymer in which the material mentioned above is introduced in the polymer side chain or a polymer having the material as the polymer main chain can be also used.

A metal complex of an 8-quinolynol derivative such as aluminum tris(8-quinolynol) (Alq), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) (Znq), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emitting layer may preferably be employed as the electron transporting material. An inorganic semiconductor such as n-Si and n-SiC may also be used as the electron transporting material in a similar way as in the hole transport layer.

The electron transport layer can be formed employing the above described electron transporting materials and a known method such as a vacuum deposition method, a spin coat method, a casting method, a printing method including an ink jet method or an LB method. The thickness of electron transport layer is not specifically limited, however, is ordinarily 5 nm to 5 μm, and preferably 5 to 200 nm. The electron transport layer may be composed of a single layer containing one or two or more of the electron transporting material.

A electron transport layer having a high n-property, which have been subjected to impurity doping, can be utilized. Examples thereof are described in such as JP-A Nos. 4-297076, 10-270172, 2000-196140 and 2001-102175; and J. Appl. Phys., 95, 5773 (2004).

In the present invention, it is preferable to use such an electron transport layer having a high n-property in view of preparing an element consuming a lower power.

<<Diffusion Blocking Layer>>

The diffusion blocking layer of the present invention means, in a broad sense, a layer which prevents the diffusion of an organic material (for example, an electron transport material and an electron-donative compound) or an inorganic material (for example, a metal and a salt of the metal) itself, or impurity thereof contained in each constituting layer into the light emission layer (from an adjacent layer), or prevents the diffusion within the light emission layer. The abovementioned diffusion may cause degradation of emission efficiency or of emission life. As long as it has such a role, any of an anode buffer layer, a hole transport layer, a light emission layer, a hole blocking layer, an electron transport layer and a cathode buffer layer, for example, may also serve as a diffusion blocking layer.

In order to maximally obtain the effect of the present invention, it is preferable to prevent or suppress the diffusion of the metal or the ion of the metal contained in the electron transport material containing layer. The diffusion blocking layer (including the case when the diffusion blocking layer also has a function of another layer) is preferably provided between the light emission layer and the anode or the cathode, and more preferably provided between the hole transport layer and the light emission layer while being adjacent to the hole transport layer, or provided between the light emission layer and the cathode or the cathode buffer layer while being adjacent to the cathode or to the cathode buffer layer.

A known compound used for such as a metal ion trapping (for example, a crown ether compound) or a compound capable of clathrating a metal or a metal ion can be used for forming the diffusion blocking layer of the present invention. As the compound capable of clathrating a metal or a metal ion, usable is a compound described in "Cho-Bunnsikagaku" written by Naotoshi Nakajima; published by "Kagaku Dojin Shuppan" in March, 2004, or in the literature cited therein.

Next, the injecting layer used as a constituting layer of the organic EL element of the present invention will be described.

<<Injection Layer>>: Electron Injection Layer, Hole Injection Layer

The injection layer is classified into the electron injection layer and the hole injection layer, which are provided according to necessity. The injection layer may be provided between the anode and the light emission layer or hole transport layer, or between the cathode and the light emission layer or electron transport layer.

The injection layer is a layer provided between the electrode and the organic layer for lowering the driving voltage or raising the luminance of emitted light. The injection layer is described in detail in "Yuuki EL soshi to sono kougyouka saizennsenn (Organic EL element and its Front of Industrialization) Vol. 2, Sect. 2, "Electrode materials" pp. 123 to 166, Nov. 30, 1998, published by NTS Inc., and includes a hole injection layer (an anode buffer layer) and an electron injection layer (a cathode buffer layer).

The anode buffer layer (hole injection layer) is described in detail in JP-A Nos. 9-45479, 9-260062 and 8-288069, and concrete examples thereof include a phthalocyanine buffer layer typically copper phthalocyanine, an oxide buffer layer typically vanadium oxide, an amorphous carbon buffer layer and a polymer buffer layer using polyaniline (emeraldine) or polythiophene.

The cathode buffer layer (electron injection layer) is also described in detail in JP-A Nos. 6-325871, 9-17574 and 10-74586, and examples thereof include a metal buffer layer typically strontium and aluminum, an alkali metal compound buffer layer typically lithium fluoride, an alkali-earth metal compound buffer layer typically magnesium fluoride and an oxide buffer layer typically aluminum oxide.

The buffer layer (injection layer) is desirably an extremely thin layer and the thickness thereof is preferably 0.1 nm-100 nm, although the thickness depends of the material.

The injection layer can be formed by making the above material into a thin film by using a known method such as a vacuum evaporation method, a spin coating method, a casting method, an inkjet method or an LB method. The thickness of the injection layer is not specifically limited, however, usually it is 5 to 5,000 nm in accordance with the kind of the material. The injection layer may have a single layer structure comprising one or two or more kinds of the material.

<<Anode>>

The anode relating to the organic EL element of the present invention is preferably one comprising a metal, an alloy, an electroconductive compound or a mixture thereof each having high work function (not less than 4 eV) is preferable. Examples of such the electrode material include a metal such as Au and an electroconductive transparent material such as CuI, indium tin oxide (ITO), $SnO_2$, and ZnO. An amorphous material capable of forming a transparent electrode layer such as IDIXO ($In_2O_3$—Zn) is usable. The anode may be formed by making a thin layer of such the electrode material by a method such as a vapor deposition or a spattering method and pattering to the desired form by a photolithographic method. The vapor deposition or spattering of the electrode material may be performed through a mask of desired pattern to form the pattern of the electrode when the high precision is not necessary (around 100 μm or more). When the light is putout through the anode, the transparency of the anode is preferably not less than 10% and the sheet resistivity is preferably not more than several hundred Ω/□. The layer thickness is usually from 10 nm to 1,000 nm and preferably from 10 nm to 200 nm.

<<Cathode>>

On the other hand, as the cathode relating to the present invention, one comprising a metal (referred to as an electron injective metal), an ally, an electroconductive compound each having low working function (not more than 4 eV) or a mixture thereof is used. Concrete examples of such the electrode material include sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare-earth metal. Among them, a mixture of an electron injective metal and a second metal larger in the working function and stability than the electron injective metal such as the magnesium/silver mixture, magnesium/indium mixture, aluminum/aluminum oxide ($Al_2O_3$) mixture, lithium/aluminum mixture and aluminum are suitable from the viewpoint of the electron injecting ability and the stability against oxidation. The cathode can be formed by making such the electrode material into a thin layer by a method such as a vapor deposition method or a spattering method. The sheet resistivity of the cathode is preferably not more than several hundred Ω/□ and the thickness thereof is usually selected within the range of from 10 nm to 1,000 nm and preferably from 50 nm to 200 nm. It is suitable that at least one of the anode and cathode is transparent or semitransparent for raising the luminance of the emitted light.

<<Substrate (Also Referred to as Base Plate, Base Material or Support)>>

There is no limitation on the kind of substrate such as glass and plastics relating to the organic EL element of the present invention as long as that is transparent, and glass, quartz and light permeable resin film can be cited as the preferably usable material. Particularly preferable substrate is the resin film which can give flexibility to the organic EL element.

As the resin film, for example, a film comprising polyethylene terephthalate (PET), polyethylene naphthalate PEN), polyether sulfone (PES), polyetherimide, poly(ether ether ketone), poly(phenylene sulfide), polyallylate, polyimide, polycarbonate (PC), cellulose triacetate (TAC) or cellulose acetate propionate (CAP) can be cited.

A layer of inorganic substance or an organic substance or a hybrid layer of them may be formed on the surface of the resin film, and the film is preferably one having high barrier ability of a steam permeability of not more than 0.01 $g/m^2 \cdot day \cdot atm$.

The output efficiency at room temperature of emitted light of the organic EL is preferably not less than 1% and more preferably not less than 2%, wherein the output efficiency is expressed by the following expression: External Quantum Efficiency (%)=Number of photon emitted from organic EL element to exterior/Number of electron applied to organic EL element×100.

Further, a filter to improve hue such as a color filter may be used in combination.

A film having roughened surface (such as an anti-glare film) also can be used for reducing the unevenness of light emission when the element is used as an illuminator.

When the element is used for a multi-color display, the apparatus has at least two kinds of organic EL elements having different emission peak wavelengths from each other. A suitable example of production of the organic EL will be described below.

<<Production Method of Organic EL Element>>

As an example of production method of the organic EL element of the present invention, the method to produce an organic EL element having the constitution of Anode/Hole transport layer/Light emission layer/Hole blocking layer/Electron transport layer/Cathode is described below.

On a suitable substrate, a thin layer of a desired electrode material such as the anode material is formed by a method such as vapor deposition or sputtering so that the layer thickness is preferably 1 μm or less, preferably in the range of 10 nm-200 nm to form an anode. Next, on the anode, thin layers containing organic compounds such as the hole transport layer, the light emission layer, the hole blocking layer, the electron transport layer and the electron transport material containing layer are formed.

As the method for forming the thin layer containing the organic compound, the spin coating method, casting method, inkjet method, vacuum evaporation method and printing method are applicable, and the vacuum vapor evaporation method and spin coating method are particularly preferable from the viewpoint that uniform layer can be easily formed and pin-hole tends not to form. Further, different layer forming methods may be applied for each of the layers. When the thin layers are formed by the vacuum evaporation method, it is desirable that the deposition conditions are suitably selected from the range of boat heating temperature of from 50° C. to 450° C., vacuum degree of $10^{-6}$ Pa to $10^{-2}$ Pa, a deposition rate of from 0.01 nm to 50 nm/second, a substrate temperature of from −50° C. to 300° C. and a layer thickness of from 0.1 nm to 5 μm.

After formation of these layers, the cathode is provided on the layer by a method such as the vacuum evaporation and spattering so that the thickness becomes not more than 1 μm and preferably from 50 nm to 200 nm to obtain the desired organic EL element. It is preferable that the formation of the hole transport layer to the cathodes is consistently performed by once evacuation but it is also possible that the element is take out on half way for subjecting to a different layer formation procedure. In such the case, it is preferable that the operation is carried out under an inert gas atmosphere.

<<About Bottom Emission and Top Emission>>

The direction of the taking out of the light emitted from the organic EL element of the present invention may be from the substrate side surface, which is so-called a bottom emission type, or from the cathode side surface, which is so-called a top emission type, however, in the case when such as TFT (thin-film transistor) is provided on the substrate side of the element (complex) of an active matrix type element, a top emission type is preferable, in which light is taken out from the side where TFT is not provided, namely from the cathode side surface, in order to increase the ratio of emission area (also referred to as the emission area ratio) as much as possible.

Figure 7:
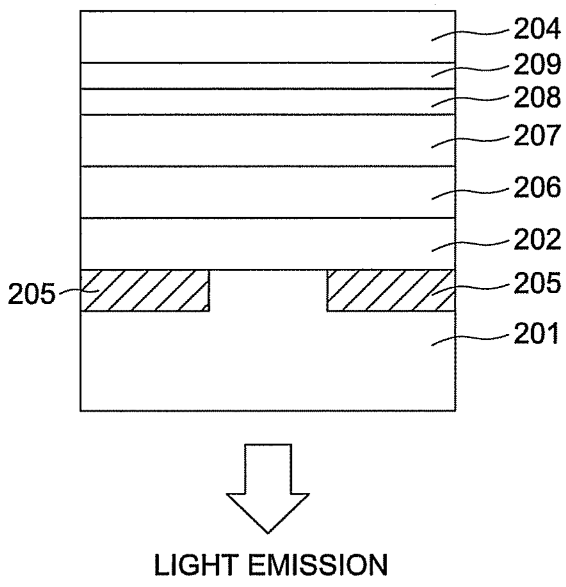
FIG. 7 is a schematic illustration showing an example of a layer construction of a bottom emission organic EL element.
Figure 8:
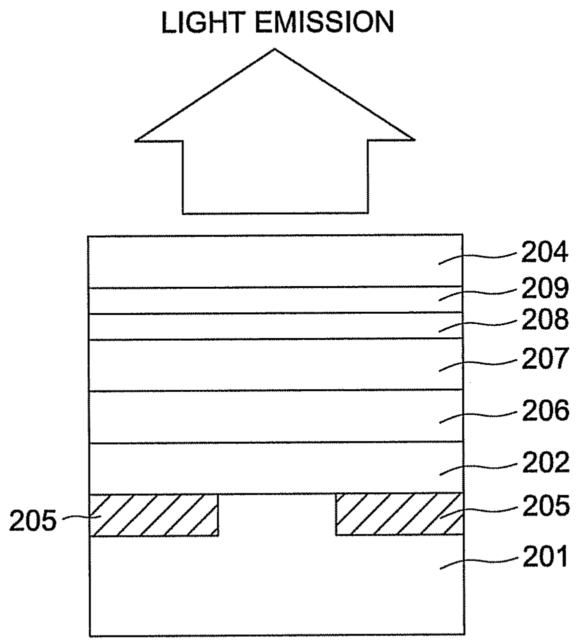
FIG. 8 is a schematic illustration showing an example of a layer construction of a top emission organic EL element.

In order to avoid the deterioration of emission efficiency due to the interruption of light by driving element 205 as shown in FIG. 7, in FIG. 8 (the layer constitution in FIG. 8 is the same as that in FIG. 7). In the figure, 201 represents a substrate, 202 represents an anode, 204 represents a cathode, 205 represents a driving element, 206 represents a hole transport layer, 207 represents a light emission layer, 208 represents an electron transport layer and 209 represents an electron transport material containing layer.

<<Method of Taking Out Light>>

Generally it is said that, in the organic EL element of the present invention, light is emitted in a layer of which refractive index is higher (the refractive index is about 1.6 to 2.1) than that of air, and only 15 to 20% of the light emitted in the light emission layer can be taken out. This is because the light which enters into the interface (interface of a transparent substrate and air) with the angle θ larger than a critical angle cannot be taken out of the element due to the total internal reflection, or because the light is totally reflected between the transparent substrate and the transparent electrode or between the transparent substrate and the light emission layer, resulting in being wave-guided in the transparent electrode or in the light emission layer to get away to the side of the element.

Examples of a method to improve the efficiency of taking out of the light include: a method to form concavity and convexity on the surface of the transparent substrate to prevent total internal reflection at the interface between the transparent substrate and air (for example, refer to U.S. Pat. No. 4,774,435); a method to provide a light converging function to the substrate (for example, refer to JP-A No. 63-314795); a method to provide a reflecting surface on the side of the element (for example, refer to JP-A No. 1-220394); a method to provide a flat layer between the substrate and the light emission layer, the flat layer having an intermediate refractive index to form an anti-reflection layer (for example, refer to JP-A No. 62-172691); a method to provide a flat layer having a low refractive index between the substrate and the light emission layer (for example, JP-A No. 2001-202827); and a method to provide a diffraction grating between any of the substrate, transparent electrode and light emission layer (including the interlaminar between the substrate and out side air) (for example refer to JP-A No. 11-283751).

In the present invention, these methods can be used in combination with the organic electroluminescence element of the present invention. Also, a method of forming a flat layer having a lower refractive index than that of the substrate between the substrate and the light emission layer, or a method of forming a diffraction grating between any of the substrate, transparent electrode and light emission layer including the interlaminar between the substrate and out side air) can be preferably used.

In the present invention, by combining these methods, an element exhibiting further higher luminance and durability can be obtained.

When a low refractive index medium having a thickness larger than the wavelength of the light is formed between the transparent electrode and the transparent substrate, the light-extracting efficiency of light which comes out of the transparent electrode increases with decreasing refractive index.

As a low refractive index layer, aerogel, porous silica, magnesium fluoride, fluorine-containing polymer, are cited, for example. Since the refractive index of the transparent substrate is generally 1.5 to 1.7, the refractive index of the low refractive index layer is preferably 1.5 or less and more preferably 1.35 or less.

The thickness of a low refractive index medium is preferably more than twice of the wavelength of the light in the medium, because when the thickness of the low refractive index medium, where the electromagnetic wave exuded as an evanescent wave enters into the transparent substrate, the effect of the low refractive index layer is reduced.

The method to provide a diffraction grating at the interface where the total internal reflection occurs or in some of the medium has a feature that the effect of enhancing the light-extracting efficiency is high. The intension of this method is to take out the light which cannot come out due to such as total internal reflection between the layers among the light emitted in the light emission layer, by providing a diffraction grating between any of the layers or in any of the mediums (in the transparent substrate or in the transparent electrode), using the property of the diffraction grating that it can change the direction of light to a specified direction different from the direction of reflection due to so-called Bragg diffraction such as primary diffraction or secondary diffraction.

The diffraction grating to be provided preferably has a two-dimensional periodic refractive index. This is because, since the light is emitted randomly to any direction, only the light proceeds to a specific direction can be diffracted when a generally used one-dimensional diffraction grating having a periodic refractive index only in a specific direction is used, whereby the light-extracting efficiency is not largely increases.

However, by using diffraction grating having a two-dimensionally periodic refractive index, the light proceeds any direction can be diffracted, whereby the light-extracting efficiency is increased.

The diffraction grating may be provided between any of the layers on in any of the mediums (in the transparent substrate or in the transparent electrode), however, it is preferably provided in the vicinity of the organic light emission layer where the light is emitted.

The period of the diffraction grating is preferably ½ to 3 times of the wavelength of the light in the medium. The array of the diffraction grating is preferably two-dimensionally repeated, for example, as in the shape of a square lattice, a triangular lattice, or a honeycomb lattice.

<<Light Condensing Sheet>>

In the organic electroluminescence element of the present invention, the luminance in the specified direction, for example, the front direction against the emitting plane of the element can be increased, for example, by processing to form a structure of a micro-lens array or in combination with a so-called light-condensing sheet on the light-extracting side surface of the substrate.

As an example of a microlens array, quadrangular pyramids 30 μm on a side and having a vertex angle of 90° are two-dimensionally arranged on the light exaracting side surface of the substrate. The side of the quadrangular pyramids is preferably 10 μm to 100 μm. When the length of the side is shorter than the above range, the light is colored due to the effect of diffraction, and when it is longer than the above range, it becomes unfavorably thick.

As a light-condensing sheet, the one practically applied for an LED backlight of a liquid crystal display is applicable. Examples of such a sheet include a brightness enhancing film (BEF) produced by SUMITOM 3M Inc. As the shape of the prism, Δ-shaped strip having a vertex angle of 90° and a pitch of 50 μm, the one having round apexes, or the one having a randomly changed pitch may be included.

In order to control the luminous radiation angle of the light emitting element, a light diffusion plate and a film may be used in combination with the light-condensing sheet. For example, a diffusion film (light-up) produced by KIMOTO Co., Ltd. can be used.

<<Display>>

The display of the present invention will be described.

The display of the present invention may be a monochromatic color display or a multi-color display, however, a multicolor display will now be described. In the multicolor display of the present invention, the light emitting layer only is formed using a shadow mask, and the other layers are formed all over employing a vacuum evaporation method, a casting method, a spin coat method, an inkjet method or a printing method.

When the light emitting layer only is formed by patterning, the layer formation, although not specifically limited, is carried out preferably according to a vacuum evaporation method, an ink jet method or a printing method. When a vacuum evaporation method is used as the layer formation method, patterning of the layer is preferably carried out employing a shadow mask.

Further, the organic EL element can be prepared in the reverse order, in which the cathode, the electron transport layer, the hole blocking layer, the light emission layer, the hole transport layer, and the anode are formed in that order.

When a direct current voltage of 2 to 40 V is applied to thus obtained multicolor display, setting the anode as a + polarity and the cathode as a − polarity, light emission occurs. When a voltage is applied in the reverse polarity, no current is passed and no emission occurs. An alternating current may also be applied to cause light emission, however the light emission occurs only when the anode is + and the cathode is −. Arbitrary wave shape of alternating current may be used.

The multi-color display can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an light emission source include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

<<Illuminator>>

The illuminator of the present invention will now be explained.

The organic EL element of the present invention may be an organic EL element having a resonator structure. The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

The organic EL element of the present invention can be used as a lamp such as an illuminating lamp or a light source for exposure, as a projection device for projecting an image, or as a display device (display) for directly viewing a still image or a moving image. When the element is used in a display for reproducing a moving image, the driving method may be either a simple matrix (passive matrix) method or an active matrix method. The display can present a full color image by employing two or more kinds of organic EL elements emitting light of different colors.

One example of the display containing the organic EL element of the present invention will be explained below employing Figures.

FIG. 1 is a schematic drawing of one example of a display containing an organic EL element. FIG. 1 is a display such as that of a cellular phone, displaying image information due to light emission from the organic EL.

Display 1 contains a display section A having plural pixels and a control section B carrying out image scanning based on image information to display an image in the display section A.

The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
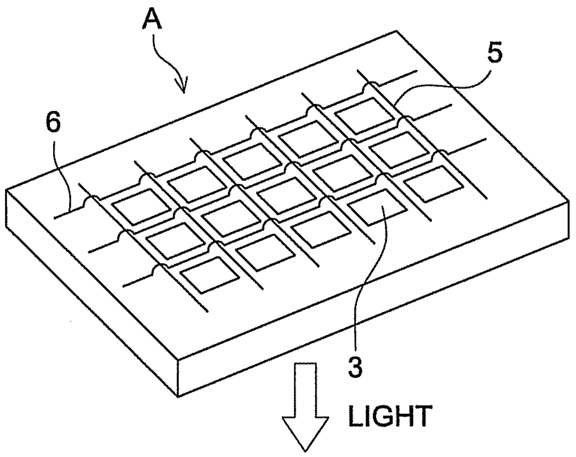
FIG. 2 is a schematic view showing display section A.

FIG. 2 is a schematic drawing of a display section A.

The display section A contains a substrate, plural pixels 3, and a wiring section containing plural scanning lines 5 and plural data lines 6. The main members of the display section A will be explained below.

In the figure, light from pixels 3 is emitted in the direction of the white arrow (downward).

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emitting pixels, green light emitting pixels, and blue light emitting pixels side by side on the same substrate can display a full color image.

Next, an emission process of pixels will be explained.

Figure 3:
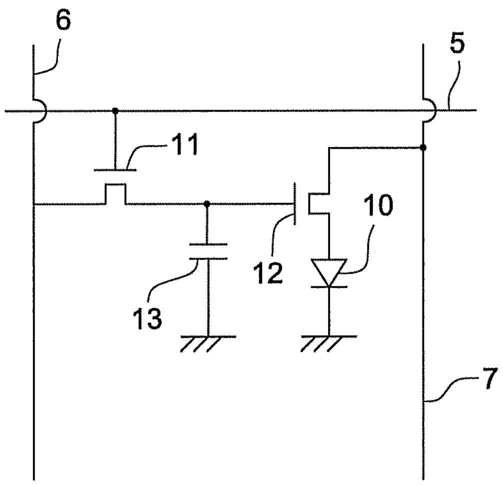
FIG. 3 is a schematic view showing a pixel.

FIG. 3 is a schematic drawing of a pixel.

The pixel contains an organic EL element 10, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals.

The electric potential of the capacitor 13 may be maintained till the next scanning signal is applied, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

Figure 4:
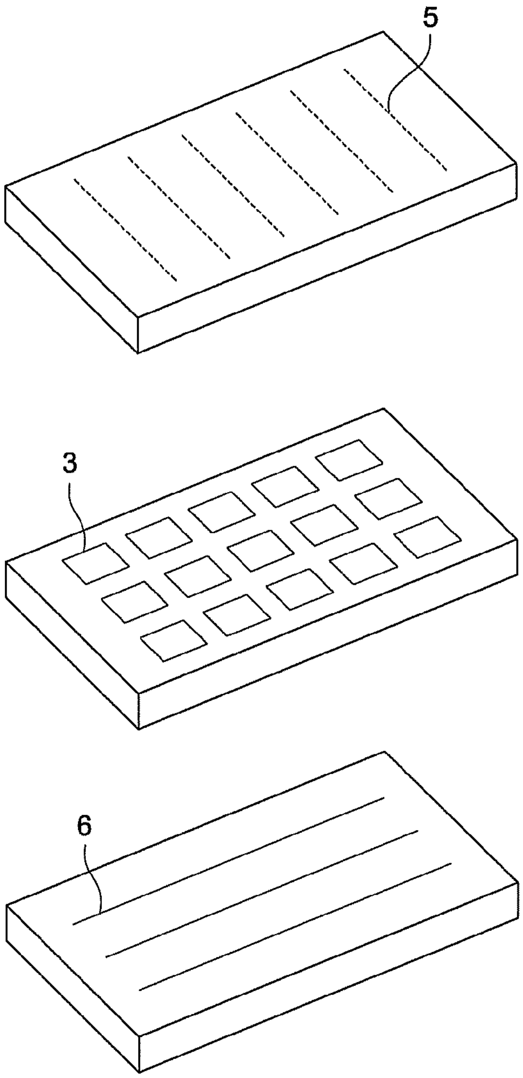
FIG. 4 is a schematic view showing a full color passive matrix display.

FIG. 4 is a schematic drawing of a display employing a passive matrix method. In FIG. 4, a plurality of scanning lines 5 and a plurality of data lines 6 are provided so as to face each other sandwiching pixels 3 to form a lattice.

When scanning signal is applied to scanning line 5 according to successive scanning, pixel 3 being connected to scanning line 5 emits light according to the image data signal. The passive matrix method has no active element in the pixel 3, thus manufacturing cost of a display can be reduced.

The materials of the present invention are also applicable to an organic EL element substantially emitting white light. White light is obtained by mixing plural colors by simultaneously emitting plural colors from plural light emitting materials. Examples of a combination of colors to obtain white light include: a combination containing three maximum emission wavelengths of three primary colors, namely, blue, green and red; and a combination containing a pair of maximum emission wavelengths of two complementary colors, for example, blue-yellow and blue green-orange.

A combination for obtaining plural color lights may be a combination of materials emitting fluorescence or phosphorescence (emitting dopants), or a combination of light emitting materials emitting fluorescence or phosphorescence, and colorants which emit light by absorbing light emitted from those light emitting-materials as excitation light. For an organic EL element emitting white light of the present invention, preferable is a combination of plural light emitting dopants.

Examples of a layer constitution to obtain plural color lights include: a method to incorporate plural emitting dopants in an emitting layer; a method to provide plural emitting layers and emitting dopants having different emission wavelengths are incorporated one by one in each emitting layer; and a method to provide matrix-arrayed minute pixels each having different emission wavelength.

In the preparation process of the white light emitting organic EL element of the present invention, patterning may be carried out while forming each layer, if necessary, for example, by using a metal mask or by inkjet printing. Patterning may be carried out: only for electrodes, for electrodes and a light emitting layer, or for all the constituting layers.

Materials used for the light emitting layer are not specifically limited, and, for example, in the case of preparing a backlight of a liquid crystal display, arbitrary materials may be selected and combined from known light emitting materials including the iridium complexes or platinum complexes of the present invention to generate white light emission adjust the wavelength range corresponding to the CF (color filter) property.

The organic EL element of the present invention may be utilized as various light sources or an illuminator, for example, as a kind of lamp such as a home lamp, a room lamp in a car, or a developing lamp, or for a display such as a backlight for a liquid crystal display.

It is also usable for a wide range of application, for example, as a backlight for a watch, a light source for boarding advertisement, a signal device, a light source for a photo memory medium, a light source for an electrophotographic copier, a light source for an optical communication instrument or a light source for an optical sensor, or in electric home appliances using a display.

EXAMPLES

The present invention will now be explained using examples, however, the present invention is not limited thereto.

Here, the compounds used in the examples are listed (including the compounds cited in the table and the compounds not cited in the table, but the evaluations of which are mentioned).

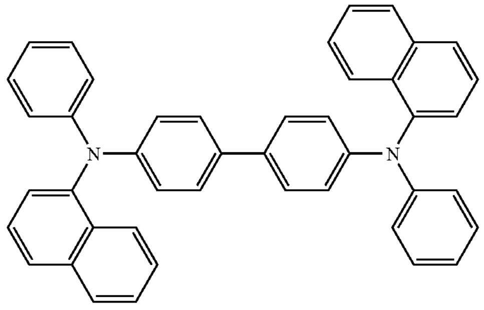

α-NPD

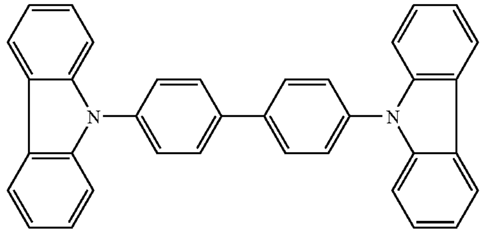

CBP

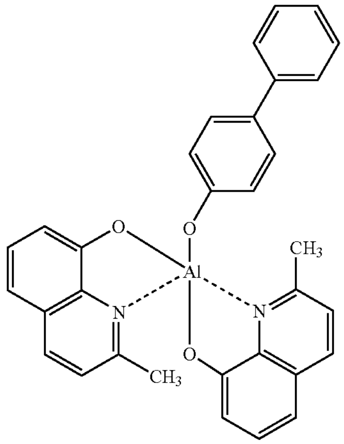

Balq

-continued

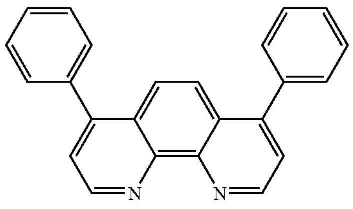

BPhen

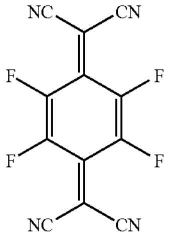

F4-TCNQ

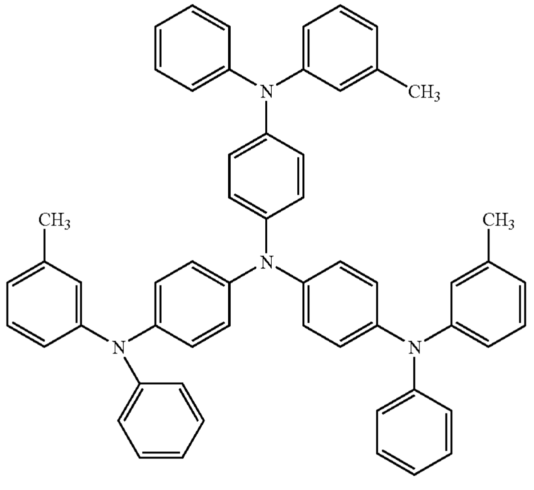

m-MTDATA

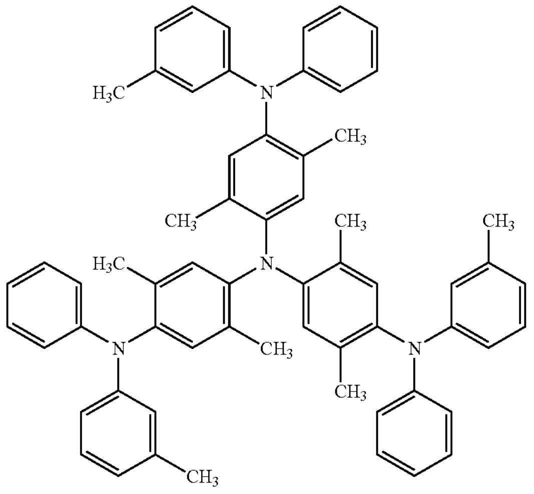

m-MTDATXA

-continued

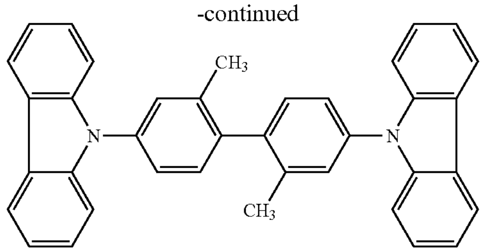

CDBP

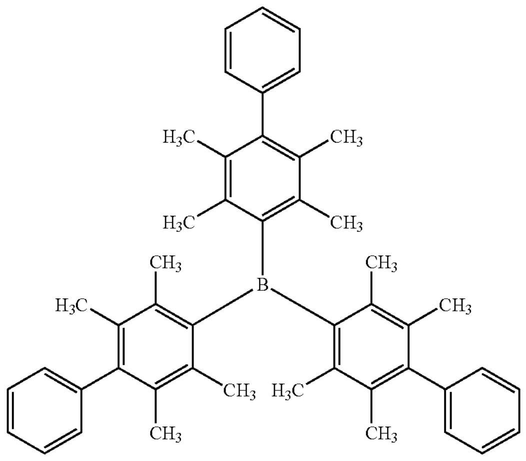

HB-1

Example 1

Preparation of Organic EL Element 1-1

A pattern was formed on a substrate (100 mm×100 mm×1.1 mm) composed of a glass plate and a 100 nm thick ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol, dried with a dry nitrogen gas and subjected to UV-ozone cleaning for 5 minutes. Thus obtained transparent substrate was fixed on a substrate holder of a vacuum evaporation apparatus available on the market.

The pressure in the vacuum tank was reduced to $4\times10^{-4}$ Pa. Then, CuPc (copper phthalocyanine) was deposited onto the transparent substrate at a depositing rate of 0.1 nm/sec to form a hole injection layer of a thickness of 20 nm. Next, α-NPD was deposited at a depositing rate of 0.1 nm/sec to form a hole transport layer of a thickness of 20 nm.

After that, the abovementioned boats carrying CBP and Ir-1 were heated by supplying electric current, and CBP and Ir-1 were co-deposited at depositing rates of 0.2 nm/sec and 0.012 nm/sec, respectively, on the abovementioned hole transport layer to form a light emission layer of a thickness of 30 nm. The temperature of the substrate at the time of the deposition was room temperature. Subsequently, B-Alq was deposited on the abovementioned light emitting layer at a depositing rate of 0.1 nm/sec to form a hole blocking layer of a thickness of 10 nm. Further, electron transport material N-9 and Cs (metallic cesium) from a cesium dispenser produced by SAES Getter Ltd. were deposited at depositing rates of 0.1 nm/sec and 0.025 nm/sec, respectively to form an electron transport material containing layer while controlling the thickness so as to be 50 nm.

Subsequently, a 110 nm thick aluminum layer was deposited to form a cathode. Thus, Organic EL Element 1-1 was prepared.

<<Preparation of Organic EL Elements 1-2 to 1-11>>

Organic EL Elements 1-2 to 1-11 were prepared in the same manner as Organic EL Element 1-1, except that the electron transport materials listed in Table 1 were used instead of electron transport material N-9 in the electron transport material containing layer.

The following evaluations were carried out on the obtained Organic EL Elements 1-1 to 1-11.

<<Driving Life (Also Referred to as Merely Life)>>

A period in which a luminance of an organic EL element just after start emitting (an initial luminance) was decreased to half of it was defined as a half-life period (T 0.5) and used to evaluate the driving life of the organic EL element, the emission intensity being measured by supplying a constant electric current of 2.5 $mA/cm^2$. A spectral radiance meter CS-1000 produced by Minolta Inc. was used for the measurement of the driving life of an organic EL element. The results of driving life measurements were given as relative values when the value of driving life of Organic EL Element 1-11 (Comparative example) was set to 100.

<<Driving Voltage>>

The voltage of each element when driven at a constant current of 2.5 mA/cm2 was measured and the results were given as relative values when the value of driving voltage of Organic EL Element 1-11 (Comparative example) was set to 100.

Voltage=(Driving voltage of each element/Driving voltage of Organic EL Element 1-11)×100

The smaller the value is, the lower the driving voltage is compared to that of the comparative example.

Obtained results were summarized in Table 1.

TABLE 1

| Organic EL Element | Electron transport material | Driving life | Driving voltage | Remarks |
|---|---|---|---|---|
| 1-1 | N-9 | 2900 | 95 | Inventive |
| 1-2 | N-3 | 1900 | 102 | Inventive |
| 1-3 | N-5 | 1900 | 95 | Inventive |
| 1-4 | N-8 | 2800 | 96 | Inventive |
| 1-5 | N-10 | 2700 | 97 | Inventive |
| 1-6 | N-11 | 3000 | 94 | Inventive |
| 1-7 | N-24 | 3000 | 97 | Inventive |
| 1-8 | N-25 | 3300 | 95 | Inventive |
| 1-9 | N-29 | 3100 | 98 | Inventive |
| 1-10 | N-33 | 2500 | 98 | Inventive |
| 1-11 | BPhen | 100 | 100 | Comparative |

From Table 1, it is clear that the organic EL element of the present invention exhibits a lower driving voltage and a longer driving life compared to the comparative example.

Example 2

Preparation of Organic EL Elements 2-1 to 2-12

Organic EL Elements 2-1 to 2-12 were prepared in the same manner as Organic EL Elements 1-1 to 1-12 except that Cs (metallic cesium) used in the electron transport material containing layer was changed to CsF (cesium fluoride) in each element.

As the results of the evaluation of obtained Organic EL Elements 2-1 to 2-12, it was found that the organic EL element of the present invention exhibited a lower driving voltage and a longer driving life compared to the comparative example.

Example 3

Preparation of Organic EL Elements 3-1 to 3-3

A pattern was formed on a substrate (100 mm×100 mm×1.1 mm) composed of a glass plate and a 100 nm thick ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol, dried with a dry nitrogen gas and subjected to UV-ozone cleaning for 5 minutes. Thus obtained transparent substrate was fixed on a substrate holder of a vacuum evaporation apparatus available on the market.

The pressure in the vacuum tank was reduced to $4\times10^{-4}$ Pa. Then, m-MTDATA and F4-TCNQ were co-deposited onto the transparent substrate at depositing rates of 0.2 nm/sec and 0.003 nm/sec, respectively to form a hole injection layer of a thickness of 100 nm. Next, m-MTDATXA was deposited at a deposition rate of 0.1 nm/sec to form a hole transport layer. After that, the abovementioned boats carrying CDBP and Ir-12 were heated by supplying electric current, and CDBP and Ir-12 were co-deposited at depositing rates of 0.1 nm/sec and 0.003 nm/sec, respectively, on the abovementioned hole transport layer to form a light emission layer of a thickness of 30 nm. The temperature of the substrate at the time of the deposition was room temperature. Subsequently, HB-1 was deposited on the abovementioned light emitting layer at a depositing rate of 0.1 nm/sec to form a hole blocking layer of a thickness of 10 nm. Further, electron transport material N-9 was deposited at a depositing rate of 0.1 nm/sec to form a diffusion blocking layer of a thickness of 10 nm. Then, on the diffusion blocking layer, electron transport material N-9 and cesium fluoride were co-deposited at depositing rates of 0.1 nm/sec and 0.025 nm/sec, respectively to form an electron transport material containing of a thickness of 50 nm. Subsequently, a 110 nm thick aluminum layer was deposited to form a cathode. Thus, Organic EL Element 3-1 was prepared.

<<Preparation of Organic EL Elements 3-2 and 3-3>>

Organic EL Elements 3-2 was prepared in the same manner as Organic EL Element 3-1, except that the diffusion blocking layer was not provided, and Organic EL Elements 3-3 was prepared in the same manner as Organic EL Element 3-2, except that N-9 used in the electron transport material containing layer was changed to BPhen.

The storage stability of each of Organic EL Elements 3-1 to 3-3 was evaluated. The condition the for evaluation of storage stability was as follows.

<Evaluation of Storage Stability>

The storage stability was evaluated by the variation of luminance before and after keeping the element at 85° C. for 100 hours.

Storage stability=(Luminance after keeping for 100 hours/luminance before keeping for 100 hours)×100

Obtained results were shown below.

| Organic EL Element No. | Storage stability | Remarks |
|---|---|---|
| 3-1 | 94 | Inventive |
| 3-2 | 82 | Inventive |
| 3-3 | 32 | Comparative |

The above results shows that the organic EL elements of the present invention exhibits notably improved storage stability. Organic EL Element 3-1 of the present invention having a diffusion blocking layer exhibits further improved storage stability. This is deduced to be because the diffusion of cesium from the electron transport layer to the light emission layer id prevented.

Example 4

The same effect of the improved storage stability of the organic EL element shown in Example 3 was also observed for each of the electron transport materials of the present invention: N-3, N-5, N-8, N-10, N-11, N-24, N-25, N-29 and N-33.

Example 5

Preparation of Illuminator

Figure 5:
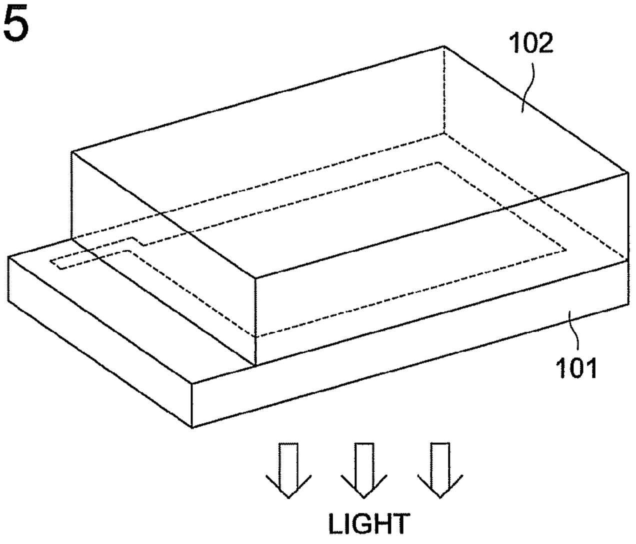
FIG. 5 is a schematic illustration of an illuminator.
Figure 6:
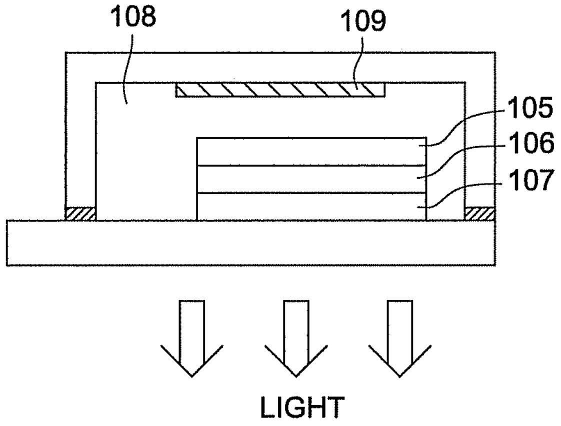
FIG. 6 is a cross-section view showing an illuminator.

The non-light emitting surface of the organic EL element of the present invention obtained in Example 1 was covered with a glass case to obtain an illuminator as shown in FIGS. 5 and 6. The illuminator could be used as a thin white light emitting illuminator exhibition a high luminance and a long driving life. FIG. 5 shows a schematic illustration of an illuminator, in which organic EL element 101 is covered with glass cover 102 (the sealing process with the glass cover was carried out in a glove box (atmosphere of high purity nitrogen gas with the purity of 99.999% or more) without exposing organic EL element 101 to air). FIG. 6 shows a cross-section view of an illuminator, and, in FIG. 6, 105 is a cathode, 106 represents organic EL layers, 107 represents a transparent substrate having a transparent electrode. Inside of glass cover 102 was filled with nitrogen gas 108, and dehydration agent 109 is provided.

Electric current was passed through the obtained illuminator, and it was found to be usable as an illuminator.

What is claimed is:

1. An organic electroluminescent element comprising a substrate having thereon at least an anode, a cathode and a plurality of organic compound layers comprising at least one light emission layer, the organic compound layers being provided between the anode and the cathode, wherein the organic compound layers comprise an electron transport material containing layer comprising an electron transport material represented by following Formula (a) and at least one selected from the group consisting of a metal, a salt of the metal and an electron-donating compound:

$$Ar1\text{-}(Ar2)n \qquad \text{Formula (a)}$$

wherein Ar1 represents a group derived from an aromatic hydrocarbon ring or a group derived from an aromatic heterocycle; Ar2 represents a group derived from an aromatic heterocycle selected from the group consisting of a pyridine ring, a pyrazine ring, a pyrimidine ring, a pyridazine ring, a triazine ring, a quinazoline ring, a quinoline ring, an isoquinoline ring, a naphthyridine ring, and a cinnoline ring; and n represents an integer of 4 or more, wherein none of the pyridine ring, the pyrazine ring, the pyrimidine ring, the pyridazine ring, the triazine ring, the quinazoline ring, the quinoline ring, the isoquinoline ring, the naphthyridine ring, and the cinnoline ring further has a condensed ring, except for a pyrimidine ring attached with a condensed benzene ring to obtain the quinazoline ring, a pyridine ring attached with a condensed benzene ring to obtain the quinoline ring, a pyridine ring attached with a condensed benzene ring to obtain the isoquinoline ring, a pyridine ring attached with a condensed benzene ring to obtain the napthyridine ring, a pyridazine ring attached with a condensed benzene ring to obtain the cinnoline ring; wherein each of Ar2 is directly bonded to Ar1.

2. The organic electroluminescent element of claim 1, wherein the plurality of organic compound layers comprise a diffusion barrier layer as a constituting layer, the diffusion barrier layer preventing or suppressing diffusion of the metal or the salt of the metal.

3. The organic electroluminescent element of claim 2, wherein the diffusion barrier layer comprises the electron transport material represented by Formula (a).

4. The organic electroluminescent element of claim 1, wherein a light emitted from the light emission layer contains a phosphorescent light.

5. The organic electroluminescent element of claim 1, wherein a light emitted from the light emission layer contains at least a blue light component.

6. The organic electroluminescent element of claim 1, wherein a light emitted from the light emission layer is taken out from a surface of the organic electroluminescent element opposite to a substrate side surface of the element, not from the substrate side surface of the element.

7. The organic electroluminescent element of claim 1, wherein at least one selected from the group consisting of the anode, the plurality of organic compound layers, and the cathode is formed by a process comprising a vacuum evaporation method.

8. The organic electro luminescent element of claim 1, wherein a light emitted from the organic electroluminescent element is a white light.

9. A display device comprising the organic electroluminescent element of claim 1.

10. An illuminator comprising the organic electro luminescent element of claim 1.

11. An illuminator comprising the display of claim 9.

* * * * *